United States Patent
Nakamura

(10) Patent No.: US 7,919,385 B2
(45) Date of Patent: Apr. 5, 2011

(54) SEMICONDUCTOR DEVICE AND METHOD OF FORMING THE SAME

(75) Inventor: Yoshitaka Nakamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 50 days.

(21) Appl. No.: 12/400,410

(22) Filed: Mar. 9, 2009

(65) Prior Publication Data

US 2009/0170272 A1 Jul. 2, 2009

Related U.S. Application Data

(62) Division of application No. 11/776,814, filed on Jul. 12, 2007, now abandoned.

(30) Foreign Application Priority Data

Aug. 2, 2006 (JP) .................................. 2006-211168

(51) Int. Cl.
*H01L 21/20* (2006.01)

(52) U.S. Cl. ........ 438/389; 438/386; 438/387; 438/388; 438/391

(58) Field of Classification Search .................. 438/386, 438/387, 388, 389, 391
See application file for complete search history.

(56) References Cited

U.S. PATENT DOCUMENTS

| | | | |
|---|---|---|---|
| 6,407,422 B1 | 6/2002 | Asano et al. | |
| 6,417,537 B1 * | 7/2002 | Yang et al. | 257/310 |
| 2001/0038114 A1 | 11/2001 | Iijima et al. | |
| 2001/0041402 A1 | 11/2001 | Yamamoto | |
| 2002/0113237 A1 | 8/2002 | Kitamura | |
| 2002/0195632 A1 | 12/2002 | Inoue et al. | |
| 2006/0076600 A1 | 4/2006 | Nakabayashi et al. | |
| 2006/0099760 A1 | 5/2006 | Kim et al. | |

FOREIGN PATENT DOCUMENTS

| | | |
|---|---|---|
| JP | 11-220101 A | 8/1999 |
| JP | 2000-307071 A | 11/2000 |
| JP | 2001-217403 A | 8/2001 |
| JP | 2001-313379 A | 11/2001 |
| JP | 2002-319636 A | 10/2002 |
| JP | 2003-7854 A | 1/2003 |
| JP | 2004-221467 A | 8/2004 |
| JP | 2005-093587 A | 4/2005 |
| JP | 2006-114545 A | 4/2006 |
| JP | 2006-140488 A | 6/2006 |

* cited by examiner

*Primary Examiner* — Matthew S Smith
*Assistant Examiner* — John M Parker
(74) *Attorney, Agent, or Firm* — Sughrue Mion, PLLC

(57) ABSTRACT

A semiconductor device includes a first insulating layer, a capacitor, an adhesive layer, and an intermediate layer. The first insulating layer may include a first insulating film. The first insulating layered structure has a first hole. The capacitor is disposed in the first hole. The capacitor may include bottom and top electrodes and a capacitive insulating film. The capacitive insulating film is sandwiched between the bottom and top electrodes. The adhesive layer contacts with the bottom electrode. The adhesive layer has adhesiveness to the bottom electrode. The intermediate layer is interposed between the adhesive layer and the first insulating film. The intermediate layer contacts with the adhesive layer and with the first insulating film. The intermediate layer has adhesiveness to the adhesive layer and to the first insulating film.

12 Claims, 28 Drawing Sheets

TITANIUM NITRIDE FILM (BOTTOM ELECTRODE)

SILICON OXYNITRIDE FILM AND TITANIUM OXIDE FILM

SILICON NITRIDE FILM (INTERLAYER INSULATOR)

VOID

TITANIUM NITRIDE FILM (BOTTOM ELECTRODE)

VOID

SILICON NITRIDE FILM (INTERLAYER INSULATOR)

SEMICONDUCTOR DEVICE AND METHOD OF FORMING THE SAME

This is a Divisional Application of pending prior application Ser. No. 11/776,814 which claims priority from Japanese Patent Application No. 2006-211168, filed Aug. 2, 2006, the content of both applications is incorporated herein by reference.

BACKGROUND OF THE INVENTION

1. Field of the Invention

The present invention generally relates to a semiconductor device and a method of forming the same. More specifically, the present invention relates to a semiconductor device including a DRAM capacitor with a bottom electrode having an improved adhesiveness with an adjacent insulating film.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

A memory cell such as a DRAM (Dynamic Random Access Memory) includes a switching transistor and a capacitor. The advanced microprocessing technique has realized shrinkage of the memory cell, which decreases the charge storage capacity of a memory cell. In order to solve the disadvantages of the decrease of the charge storage capacity, a COB (capacitor over bit-line) structure and an STC (stacked trench capacitor) structure have been used in constituting the memory cell. In the memory cell, a capacitor is disposed over a bit-line so as to allow the increases in the projected area and the height of the capacitor, thereby allowing the increase in the area of a capacitor electrode or electrodes.

Japanese Unexamined Patent Application, First Publication, No. 2004-221467 discloses a conventional memory cell structure that is constituted by the COB and the STC. The capacitor of the memory cell has a cylindrically shaped bottom electrode which is realized by a ruthenium film. The ruthenium film is adjacent to an inter-layer insulator of silicon oxide. It is necessary to ensure the adhesiveness between the ruthenium film and the silicon oxide film as the inter-layer insulator. In order to ensure the adhesiveness between the ruthenium film and the silicon oxide film, an adhesive layer is interposed between them. The adhesive layer can be formed by oxidizing a titanium nitride film. The adhesive layer is effective to present that during the process for forming a capacitor the ruthenium film as the bottom electrode from is peeled or removed from the silicon oxide film as the inter-layer insulator. The adhesive layer provides the adhesiveness between the bottom electrode and the inter-layer insulator, thereby preventing the above-described problems during the process for forming a capacitor.

In recent years, further shrinkage and high density integration of a memory device such as a DRAM has caused further structural complication of a capacitor and further increase in the aspect ratio thereof. The process for forming the bottom electrode includes the process for forming an extremely small contact hole with high aspect ratio in a silicon oxide film. In the process, a silicon nitride film is often used as an etching stopper. The present inventors investigated the problem about the adhesiveness between the silicon nitride film as the etching stopper and the bottom electrode film. The adhesive layer of titanium nitride provides the adhesiveness between the silicon oxide film and the bottom electrode. However, the adhesive layer of titanium nitride does not ensure the adhesiveness between the silicon nitride film and the bottom electrode. The process for forming the capacitor includes a heat treatment which may cause the peeling between the silicon nitride film and the bottom electrode, thereby deforming the bottom electrode. The deformed bottom electrode may cause increased leakage of current of the capacitor. The process for forming the capacitor also includes a wet etching process using an etchant. The peeling between the silicon nitride film and the bottom electrode by the heat treatment may cause the etchant to be drawn into the interface between the silicon nitride film and the bottom electrode, thereby causing the bottom electrode to be inclined or removed.

In view of the above, it will be apparent to those skilled in the art from this disclosure that there exists a need for an improved semiconductor device and a method of forming the same. This invention addresses this need in the art as well as other needs, which will become apparent to those skilled in the art from this disclosure.

SUMMARY OF THE INVENTION

Accordingly, it is a primary object of the present invention to provide a semiconductor device including a capacitor.

It is another object of the present invention to provide a semiconductor device including a capacitor with a bottom electrode with an increased adhesiveness to an adjacent insulating film.

It is a further object of the present invention to provide a semiconductor device including a capacitor with a reduced leakage of current.

It is a still further object of the present invention to provide a semiconductor device including a capacitor with a bottom electrode which is free from being inclined or removed in the process of wet etching.

It is yet a further object of the present invention to provide a semiconductor device including a capacitor with improved reliability.

It is an additional object of the present invention to provide a method of forming a semiconductor device including a capacitor.

It is another object of the present invention to provide a method of forming a semiconductor device including a capacitor with a bottom electrode with an increased adhesiveness to an adjacent insulating film.

It is still another object of the present invention to provide a method of forming a semiconductor device including a capacitor with a reduced leakage of current.

It is yet another object of the present invention to provide a method of forming a semiconductor device including a capacitor with a bottom electrode which is free from being inclined or removed in the process of wet etching.

It is an additional object of the present invention to provide a method of forming a semiconductor device including a capacitor with improved reliability.

It is a further additional object of the present invention to provide a method of forming a semiconductor device including a capacitor at high yield.

In accordance with a first aspect of the present invention, a semiconductor device may include, but is not limited to, a first insulating layer, a capacitor, an adhesive layer, and an intermediate layer. The first insulating layer may include a first insulating film. The first insulating layered structure has a first hole. The capacitor is disposed in the first hole. The capacitor may include bottom and top electrodes and a capacitive insulating film. The capacitive insulating film is sandwiched between the bottom and top electrodes. The adhesive layer contacts with the bottom electrode. The adhesive layer has adhesiveness to the bottom electrode. The intermediate layer is interposed between the adhesive layer and the first insulating film. The intermediate layer contacts with the adhesive layer and with the first insulating film. The intermediate layer has adhesiveness to the adhesive layer and to the first insulating film.

In accordance with a second aspect of the present invention, a semiconductor device may include, but is not limited to, a first insulating layer, a capacitor, and an adhesive layer. The first insulating layer may include a first insulating film, the first insulating layered structure having a first hole. The capacitor may be disposed in the first hole. The capacitor may include, but is not limited to, bottom and top electrodes and a capacitive insulating film that is sandwiched between the bottom and top electrodes. The adhesive layer may be interposed between the bottom electrode and the first insulating film. The adhesive layer may contact with the bottom electrode and with the first insulating film. The adhesive layer may have adhesiveness to the bottom electrode and to the first insulating film.

In accordance with a third aspect of the present invention, a method of forming a semiconductor device with a capacitor may include, but is not limited to the following processes. A first hole is formed in a first insulating layer that includes a first insulating film. The first insulating film has a first portion that is exposed to the first hole. The first portion is modified to form an intermediate layer that adjacent to the first insulating film. The intermediate layer is exposed to the first hole. The intermediate layer has adhesiveness to the first insulating film. An adhesive layer is formed which contacts with the intermediate layer and with bottom and side walls of the first hole. The adhesive layer has adhesiveness to the intermediate layer. A bottom electrode is formed which contacts with the adhesive layer. The adhesive layer has adhesiveness to the bottom electrode. A capacitive insulating film is formed which contacts with the bottom electrode. A top electrode is formed which contacts with the contacts with the capacitive insulating film.

In accordance with a fourth aspect of the present invention, a method of forming a semiconductor device with a capacitor may include, but is not limited to, the following processes. A first hole is formed in a first insulating layer that includes a first insulating film. The first insulating film has a first portion that is exposed to the first hole. An adhesive layer is formed which contacts with the first portion and with bottom and side walls of the first hole. The adhesive layer has adhesiveness to the first portion. A bottom electrode is formed which contacts with the adhesive layer. The adhesive layer has adhesiveness to the bottom electrode. A capacitive insulating film is formed which contacts with the bottom electrode. A top electrode is formed which contacts with the contacts with the capacitive insulating film.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Figure 1:
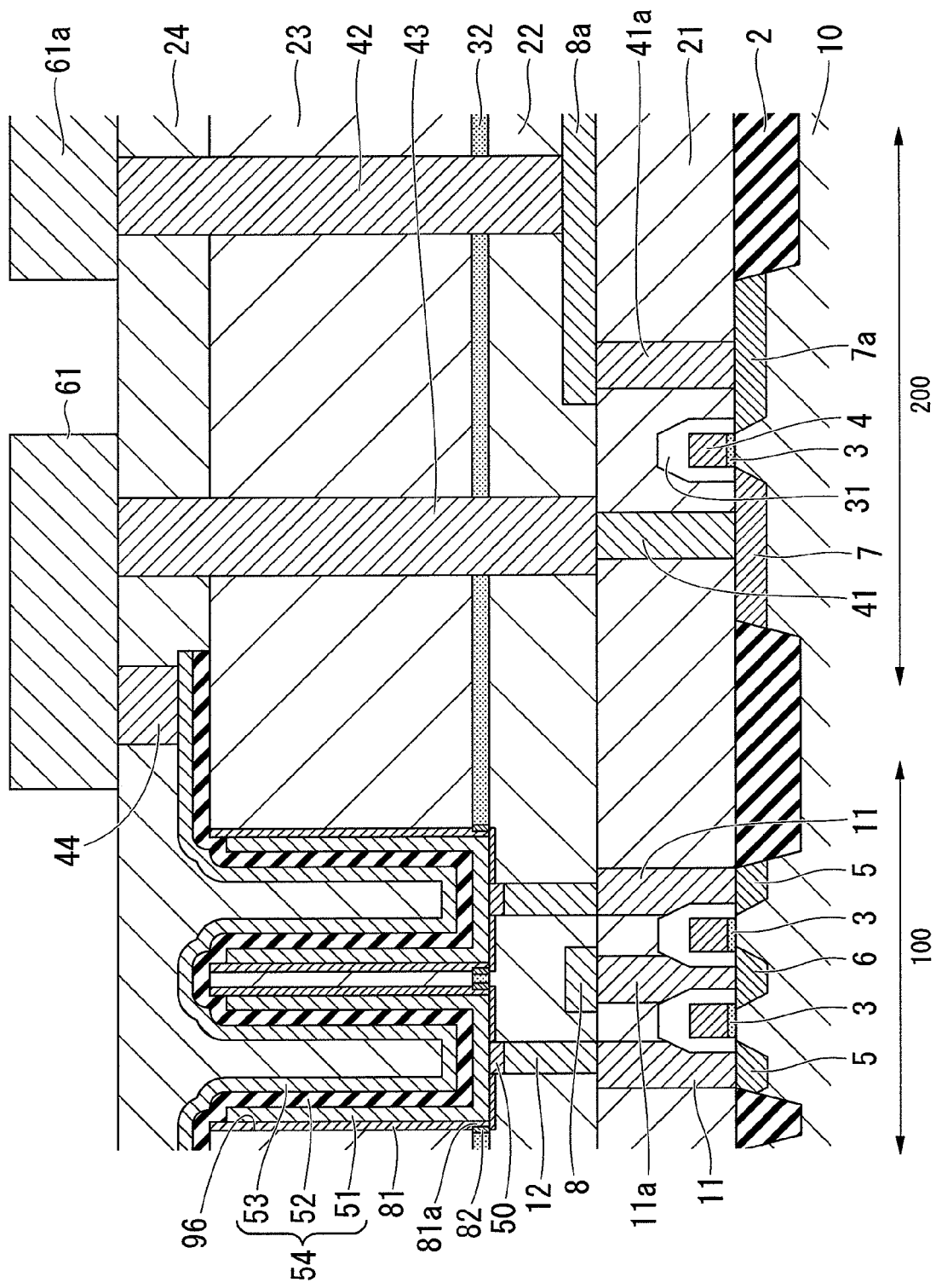
FIG. 1 is a fragmentary cross sectional elevation view illustrating a semiconductor memory device in accordance with a first preferred embodiment of the present invention.

In accordance with a first aspect of the present invention, a semiconductor device may include, but is not limited to, a first insulating layer, a capacitor, an adhesive layer, and an intermediate layer. The first insulating layer may include a first insulating film. The first insulating layered structure has a first hole. The capacitor is disposed in the first hole. The capacitor may include bottom and top electrodes and a capacitive insulating film. The capacitive insulating film is sandwiched between the bottom and top electrodes. The adhesive layer contacts with the bottom electrode. The adhesive layer has adhesiveness to the bottom electrode. The intermediate layer is interposed between the adhesive layer and the first insulating film. The intermediate layer contacts with the adhesive layer and with the first insulating film. The intermediate layer has adhesiveness to the adhesive layer and to the first insulating film.

The adhesive layer has adhesiveness to the bottom electrode. The intermediate layer has adhesiveness to the adhesive layer. The intermediate layer also has adhesiveness to the first insulating film. The combination of the adhesive layer and the intermediate layer provides adhesiveness between the bottom electrode and the first insulating film. This can prevent the bottom electrode from being falling down or being peeled or deformed by the process for forming the capacitor. Typically, the process for forming the capacitor may include, but is not limited to, a thermal process or a chemical process. This can ensure high reliability to the semiconductor device.

In some cases, the bottom electrode may be made of nitride containing a first metal. The adhesive layer may be made of one of the first metal and oxide containing the first metal. The intermediate layer may be made of oxynitride containing a first semiconductor. The first insulating film may be made of nitride containing the first semiconductor. In some cases, the bottom electrode may cover bottom and side walls of the first hole.

In some cases, the intermediate layer may be a modified portion of the first insulating film. The modified portion is adjacent to the adhesive layer. The intermediate layer can be formed by modifying a portion of the first insulating film to provide adhesiveness, after the first insulating film has been used as an etching stopper.

In some cases, the first semiconductor may be silicon, and the first insulating film may be made of silicon nitride. The modified portion of the first insulating film may be made of silicon oxynitride.

In some cases, the first insulating layer may include, but is not limited to, a stack of a silicon oxide film and the first insulating film. The silicon oxide film extends over the first insulating film. The first hole penetrates the stack. This structure may allow increasing the depth of the first hole. The increase in the depth of the first hole increases the capacity of the capacitor. If no etching stopper is used, increasing the depth of the first hole makes it difficult to realize a precise control of the depth of the first hole. As described above, the intermediate layer can be formed by modifying a portion of the first insulating film to provide adhesiveness, after the first insulating film has been used as an etching stopper. This makes it easy to realize a precise control of the depth of the first hole.

In some cases, the first metal may be titanium, the adhesive layer may include one of titanium and titanium oxide, and the bottom electrode may include titanium nitride. Silicon oxynitride (SiON) has adhesiveness to both titanium oxide (TiO) and silicon nitride (SiN). Titanium oxide (TiO) has adhesiveness to titanium nitride. The adhesive layer has adhesiveness to the bottom electrode. The intermediate layer has adhesiveness to the adhesive layer. The intermediate layer also has adhesiveness to the first insulating film. The combination of the adhesive layer and the intermediate layer provides adhesiveness between the bottom electrode and the first insulating film. This can prevent the bottom electrode from being falling down or being peeled or deformed by the process for forming the capacitor. Typically, the process for forming the capacitor may include, but is not limited to, a thermal process or a chemical process. This can ensure high reliability to the semiconductor device.

The semiconductor device may further include, but is not limited to, at least one polysilicon plug, at least one titanium silicide layer, and at least one memory cell switching transistor. The at least one titanium silicide layer is present between the at least one polysilicon plug and the bottom electrode. The titanium silicide layer contacts with the at least one polysilicon plug and with the bottom electrode. The at least one memory cell switching transistor is electrically connected through the at least one polysilicon plug and the titanium silicide layer to the bottom electrode. This structure reduces the resistance between the capacitor and the at least one memory cell switching transistor. This may improve the performance of the semiconductor device.

In some cases, the bottom electrode may have one of a cylinder shape and a modified cylinder shape. The modified cylinder shape is a three-dimensional shape that has coaxial inside and outside cylinder walls and a torus bottom wall that communicates between the coaxial inside and outside cylinder walls. The stack of the capacitive insulating film and the top electrode covers at least one of opposing surfaces of the bottom electrode. This structure provides increased capacity to the capacitor.

In some cases, the bottom electrode may have a pedestal shape and may fill the first hole. The stack of the capacitive insulating film and the top electrode covers an outside surface of the bottom electrode. This structure provides increased capacity to the capacitor.

In accordance with a second aspect of the present invention, a semiconductor device may include, but is not limited to, a first insulating layer, a capacitor, and an adhesive layer. The first insulating layer may include a first insulating film, the first insulating layered structure having a first hole. The capacitor may be disposed in the first hole. The capacitor may include, but is not limited to, bottom and top electrodes and a capacitive insulating film that is sandwiched between the bottom and top electrodes. The adhesive layer may be interposed between the bottom electrode and the first insulating film. The adhesive layer may contact with the bottom electrode and with the first insulating film. The adhesive layer may have adhesiveness to the bottom electrode and to the first insulating film.

The adhesive layer has adhesiveness to the bottom electrode and to the first insulating film. The adhesive layer provides adhesiveness between the bottom electrode and the first insulating film. This can prevent the bottom electrode from being falling down or being peeled or deformed by the process for forming the capacitor. Typically, the process for forming the capacitor may include, but is not limited to, a thermal process or a chemical process. This can ensure high reliability to the semiconductor device.

In some cases, the bottom electrode may be made of nitride containing a first metal. The adhesive layer may be made of one of the first metal and oxide containing the first metal. The first insulating film may be made of oxynitride containing a first semiconductor. In some cases, the bottom electrode covers bottom and side walls of the first hole.

In some cases, the first semiconductor is silicon, and the first insulating film comprises silicon oxynitride. The adhesive layer provides adhesiveness between the bottom electrode and the first insulating film.

In some cases, the first insulating layer may include a stack of a silicon oxide film and the first insulating film. The silicon oxide film may extend over the first insulating film.

In some cases, the first metal may be titanium, and the adhesive layer may be made of one of titanium and titanium oxide, and the bottom electrode comprises titanium nitride. Silicon oxynitride (SiON) has adhesiveness to titanium oxide (TiO). Titanium oxide (TiO) has adhesiveness to titanium nitride. The adhesive layer has adhesiveness to the bottom electrode. The adhesive layer has adhesiveness to the bottom electrode and to the first insulating film. The adhesive layer provides adhesiveness between the bottom electrode and the first insulating film. This can prevent the bottom electrode from being falling down or being peeled or deformed by the process for forming the capacitor. Typically, the process for forming the capacitor may include, but is not limited to, a thermal process or a chemical process. This can ensure high reliability to the semiconductor device.

The semiconductor device may further include, but is not limited to, at least one polysilicon plug, at least one titanium silicide layer, and at least one memory cell switching transistor. The at least one titanium silicide layer is present between the at least one polysilicon plug and the bottom electrode. The titanium silicide layer contacts with the at least one polysilicon plug and with the bottom electrode. The at least one memory cell switching transistor is electrically connected through the at least one polysilicon plug and the titanium silicide layer to the bottom electrode. This structure reduces the resistance between the capacitor and the at least one memory cell switching transistor. This may improve the performance of the semiconductor device.

In some cases, the bottom electrode may have one of a cylinder shape and a modified cylinder shape. The modified cylinder shape is a three-dimensional shape that has coaxial inside and outside cylinder walls and a torus bottom wall that communicates between the coaxial inside and outside cylinder walls. The stack of the capacitive insulating film and the top electrode covers at least one of opposing surfaces of the bottom electrode. This structure provides increased capacity to the capacitor.

In some cases, the bottom electrode may have a pedestal shape and may fill the first hole. The stack of the capacitive insulating film and the top electrode covers an outside surface of the bottom electrode. This structure provides increased capacity to the capacitor.

In accordance with a third aspect of the present invention, a method of forming a semiconductor device with a capacitor may include, but is not limited to the following processes. A first hole is formed in a first insulating layer that includes a first insulating film. The first insulating film has a first portion that is exposed to the first hole. The first portion is modified to form an intermediate layer that adjacent to the first insulating film. The intermediate layer is exposed to the first hole. The intermediate layer has adhesiveness to the first insulating film. An adhesive layer is formed which contacts with the intermediate layer and with bottom and side walls of the first hole. The adhesive layer has adhesiveness to the intermediate layer. A bottom electrode is formed which contacts with the adhesive layer. The adhesive layer has adhesiveness to the bottom electrode. A capacitive insulating film is formed which contacts with the bottom electrode. A top electrode is formed which contacts with the contacts with the capacitive insulating film.

The adhesive layer has adhesiveness to the bottom electrode. The intermediate layer has adhesiveness to the adhesive layer. The intermediate layer also has adhesiveness to the first insulating film. The combination of the adhesive layer and the intermediate layer provides adhesiveness between the bottom electrode and the first insulating film. This can prevent the bottom electrode from being falling down or being peeled or deformed by the process for forming the capacitor. Typically, the process for forming the capacitor may include, but is not limited to, a thermal process or a chemical process. This can ensure high reliability to the semiconductor device.

In some cases, the bottom electrode may be made of nitride containing a first metal. The adhesive layer may be made of one of the first metal and oxide containing the first metal. The intermediate layer may be made of oxynitride containing a first semiconductor. The first insulating film may be made of nitride containing the first semiconductor.

In some cases, the first semiconductor may be silicon, and the first insulating film may be made of silicon nitride. The process for modifying the first portion may be the process for modifying silicon nitride of the first portion into silicon oxynitride. The intermediate layer can be formed by modifying a portion of the first insulating film to provide adhesiveness, after the first insulating film has been used as an etching stopper.

In some cases, the process for forming the first hole may be the process for forming the first hole that penetrate a stack of a silicon oxide film and the first insulating film of silicon nitride. The silicon oxide film extends over the first insulating film. This structure may allow increasing the depth of the first hole. The increase in the depth of the first hole increases the capacity of the capacitor. If no etching stopper is used, increasing the depth of the first hole makes it difficult to realize a precise control of the depth of the first hole. As described above, the intermediate layer can be formed by modifying a portion of the first insulating film to provide adhesiveness, after the first insulating film has been used as an etching stopper. This makes it easy to realize a precise control of the depth of the first hole.

In some cases, the process for forming the first hole may include, but is not limited to, the following processes. A first etching process is carried out for selectively etching the silicon oxide film under a first condition that a first etching rate of the first insulating film of silicon nitride is higher than a second etching rate of the silicon oxide film. A second etching process is carried out for selectively etching the first insulating film of silicon nitride under a second condition that a third etching rate of the silicon oxide film is higher than a fourth etching rate of the first insulating film of silicon nitride. This makes it easy to realize a precise control of the depth of the first hole.

In some cases, the method may further include the following process. At least one polysilicon plug is formed in a second insulating layer that underlies the first insulating layer. The process for forming the first hole may be the process for forming the first hole so that a second portion of the at least one polysilicon plug is exposed to the first hole. The process for modifying the first portion may be the process for modifying the first and second portion to respectively form the intermediate layer and a silicon oxide portion of the at least one polysilicon plug. The silicon oxide portion is adjacent to the first hole and also adjacent to the at least one polysilicon plug. The method may further include the following process. The silicon oxide portion is removed before forming an adhesive layer. This can ensure electrical conductivity between the capacitor and the memory cell switching transistor.

In some cases, the process for forming the adhesive layer may be the process for carrying out a chemical vapor deposition using a titanium tetrachloride gas to form the adhesive layer and a titanium silicide layer on the at least one polysilicon plug. This reduces the resistance between the capacitor and the at least one memory cell switching transistor. This may improve the performance of the semiconductor device.

In some cases, the method may further include the following process. A peripheral portion of the first insulating layer is removed after forming the bottom electrode, thereby forming a gap between the first insulating layer and the adhesive layer that covers a surface of the bottom electrode. The peripheral portion surrounds and is adjacent to the adhesive layer and the bottom electrode. A nitration process may be carried out for nitrating the adhesive layer to form a titanium nitride film that covers the surface of the bottom electrode. The adhesive layer is modified into the conductive layer. This increases the capacity of the capacitor. This also improves the reliability of the capacitor. This further prevents any leakage of current from the bottom electrode.

In some cases, the process for removing the peripheral portion may be carried out using the first insulating film of silicon nitride as an etching stopper, thereby increasing the controllability of the etching depth.

In accordance with a fourth aspect of the present invention, a method of forming a semiconductor device with a capacitor may include, but is not limited to, the following processes. A first hole is formed in a first insulating layer that includes a first insulating film. The first insulating film has a first portion that is exposed to the first hole. An adhesive layer is formed which contacts with the first portion and with bottom and side walls of the first hole. The adhesive layer has adhesiveness to the first portion. A bottom electrode is formed which contacts with the adhesive layer. The adhesive layer has adhesiveness to the bottom electrode. A capacitive insulating film is formed which contacts with the bottom electrode. A top electrode is formed which contacts with the contacts with the capacitive insulating film.

The adhesive layer has adhesiveness to the bottom electrode and to the first insulating film. The adhesive layer provides adhesiveness between the bottom electrode and the first insulating film. This can prevent the bottom electrode from being falling down or being peeled or deformed by the process for forming the capacitor. Typically, the process for forming the capacitor may include, but is not limited to, a thermal process or a chemical process. This can ensure high reliability to the semiconductor device.

In some cases, the bottom electrode may be made of nitride containing a first metal. The adhesive layer may be made of one of the first metal and oxide containing the first metal. The first insulating film may be made of oxynitride containing a first semiconductor.

In some cases, the method may further include, but is not limited to, the following processes. At least one polysilicon plug is formed in a second insulating layer that underlies the first insulating layer. The process for forming the first hole may be the process for forming the first hole so that a second portion of the at least one polysilicon plug is exposed to the first hole. The process for forming the adhesive layer may be the process for carrying out a chemical vapor deposition using a titanium tetrachloride gas to form the adhesive layer and a titanium silicide layer on the at least one polysilicon plug. This reduces the resistance between the capacitor and the at least one memory cell switching transistor. This may improve the performance of the semiconductor device.

In some cases, the method may further include the following process. A peripheral portion of the first insulating layer is removed after forming the bottom electrode, thereby forming a gap between the first insulating layer and the adhesive layer that covers a surface of the bottom electrode. The peripheral portion surrounds and is adjacent to the adhesive layer and the bottom electrode. A nitration process may be carried out for nitrating the adhesive layer to form a titanium nitride film that covers the surface of the bottom electrode. The adhesive layer is modified into the conductive layer. This increases the capacity of the capacitor. This also improves the reliability of the capacitor. This further prevents any leakage of current from the bottom electrode.

In some cases, the process for removing the peripheral portion may be carried out using the first insulating film of silicon nitride as an etching stopper, thereby increasing the controllability of the etching depth.

The adhesive layer alone or in combination with the intermediate layer may provide adhesiveness between the first insulating film the bottom electrode of the capacitor. This can improve the reliability of the capacitor, and further improve the semiconductor device such as a semiconductor memory device, for example, DRAMs.

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

The first embodiment provides a semiconductor memory device including a metal-insulator-metal capacitor and a method of forming the same. The descriptions of the first embodiment will be made with reference to FIGS. 1-16.

(1) Semiconductor Memory Device and Capacitor Structure:

FIG. 1 is a fragmentary cross sectional elevation view illustrating a semiconductor memory device in accordance with a first preferred embodiment of the present invention. The semiconductor memory device includes a memory cell area 100 and a peripheral circuit area 200, which are adjacent to each other. The memory cell area 100 has a memory cell. The peripheral circuit area 200 has a peripheral circuit. The semiconductor memory device has a silicon substrate 10 that has a main face. An isolating film 2 such as a local oxidation of silicon film is disposed on the main face of the silicon substrate 10.

In the memory cell area 100, the isolation film 2 defines a first active region of the silicon substrate 10, wherein the first active region is surrounded by the isolation film 2. In the memory cell area 100, a pair of switching transistors is disposed on the first active region of the silicon substrate 10. The switching transistors will be hereinafter referred to as memory cell transistors. Each of the memory cell transistors includes a gate insulating film 3, a gate electrode 4, and diffusion layers 5 and 6 that perform as source and drain regions. The gate insulating film 3 is disposed on the main face of the first active region of the silicon substrate 10 in the memory cell area 100. The gate electrode 4 is provided on the gate insulating film 3. The diffusion layers 5 and 6 performing as the source and drain regions are selectively provided in the first active region of the silicon substrate 10 in the memory cell area 100. The diffusion layer 6 is the layer common to the paired switching transistors. Each of the gate electrodes 4 is covered by an insulating film 31.

In the peripheral circuit area 200, the isolation film 2 defines a second active region of the silicon substrate 10, wherein the second active region is surrounded by the isolation film 2. In the peripheral circuit area 200, a transistor for peripheral circuit, which will be hereinafter referred to as "peripheral circuit transistor", is disposed on the second active region of the silicon substrate 10. The peripheral circuit transistor includes a gate insulating film 3, a gate electrode, and a pair of diffusion layers 7 and 7a that perform as source and drain regions. The gate insulating film 3 is disposed on the main face of the first active region of the silicon substrate 10 in the memory cell area 100. The gate electrode 4 is provided on the gate insulating film 3. The diffusion layers 7 and 7a performing as the source and drain regions are selectively provided in the second active region of the silicon substrate 10 in the peripheral circuit area 200. The gate electrode 4 is covered by an insulating film 31.

Over the memory cell area 100 and the peripheral circuit area 200, a first inter-layer insulator 21 is disposed. The first inter-layer insulator 21 extends over the first and second active regions and the isolation film 2. The first inter-layer insulator 21 embeds the memory cell transistors and the peripheral circuit transistor.

In the memory cell area 100, the first inter-layer insulator 21 has first to third contact holes. The first contact hole communicates with the diffusion layer 6. The second and third contact holes communicate with the diffusion layers 5. The first contact hole is filled with a polysilicon plug 11a. The second and third contact holes are filled with polysilicon plugs 11. The polysilicon plug 11a contacts with the diffusion layer 6. The polysilicon plugs 11 contact with the diffusion layers 5. A bit-line 8 is provided on the first inter-layer insulator 21. The bit-line 8 may be realized by a tungsten film. The bit-line 8 contacts with the top of the polysilicon plug 11a. The bit-line 8 is electrically connected through the polysilicon plug 11a to the diffusion layer 6.

In the peripheral circuit area 200, the first inter-layer insulator 21 further has fourth and fifth contact holes. The fourth and fifth contact holes communicate with the diffusion layers 7 and 7a. The fourth and fifth contact holes are filled with metal plugs 41 and 41a. The metal plugs 41 and 41a contact with the diffusion layers 7 and 7a. A first-level interconnection 8a is provided on the first inter-layer insulator 21. The first-level interconnection 8a may be realized by a tungsten film. The first-level interconnection 8a is electrically connected through the metal plug 41a to the diffusion layer 7a.

Over the memory cell area 100 and the peripheral circuit area 200, a second inter-layer insulator 22 is disposed. The second inter-layer insulator 22 extends over the first inter-layer insulator 21, the polysilicon plugs 11 and 11a, and the metal plugs 41 and 41a, as well as over the bit line 8 and the first-level interconnection 8a. The second inter-layer insulator 22 embeds the bit line 8 and the first-level interconnection 8a.

In the memory cell area 100, the second inter-layer insulator 22 has first and second through holes which communicate with the polysilicon plugs 11. The first and second through holes except for these upper portions are filled with polysilicon plugs 12. The upper portions of the first and second through holes are filled with titanium silicide films 50. The titanium silicide films 50 contact with the polysilicon plugs 12. The polysilicon plugs 12 contact with the polysilicon plugs 11 which further contact with the diffusion layers 5. Thus, the titanium silicide films 50 are eclectically connected through the polysilicon plugs 12 and 11 to the diffusion layers 5 of the memory cell transistors.

Over the memory cell area 100 and the peripheral circuit area 200, a third inter-layer insulator 32 is disposed on the second inter-layer insulator 22 and on the titanium silicide films 50. The third inter-layer insulator 32 can be realized by a silicon nitride film. A fourth inter-layer insulator 23 is disposed on the third inter-layer insulator 32. Each of the first, second and fourth inter-layer insulators 21, 22 and 23 can be realized by a silicon oxide film.

In the memory cell area 100, a hole 96 is formed in the stack of the third and fourth inter-layer insulators 32 and 23. The hole 96 will be hereinafter referred to as a capacitor hole 96. The capacitor hole 96 may be modified-cylinder-shaped. The modified-cylinder-shape may typically be a three-dimensional shape that has coaxial inside and outside cylinder walls and a torus bottom that communicates between the coaxial inside and outside cylinder walls. In plan view, the capacitor hole 96 has a torus shape. The capacitor hole 96 penetrates the stack of the third and fourth inter-layer insulators 32 and 23. The capacitor hole 96 communicates with the titanium silicide films 50 in the first and second through holes.

A capacitor 54 is disposed in the capacitor hole 96. The capacitor 54 is electrically connected through the titanium silicide films 50, the polysilicon plugs 12 and 11 to the diffusion layers 5 of the memory cell transistors 5. When the capacitor hole 96 has the modified-cylinder-shape, the capacitor 54 also has the modified-cylinder-shape. The modified-cylinder-shape may typically be a three-dimensional shape that has coaxial inside and outside cylinder walls and a torus bottom that communicates between the coaxial inside and outside cylinder walls.

Figure 2:
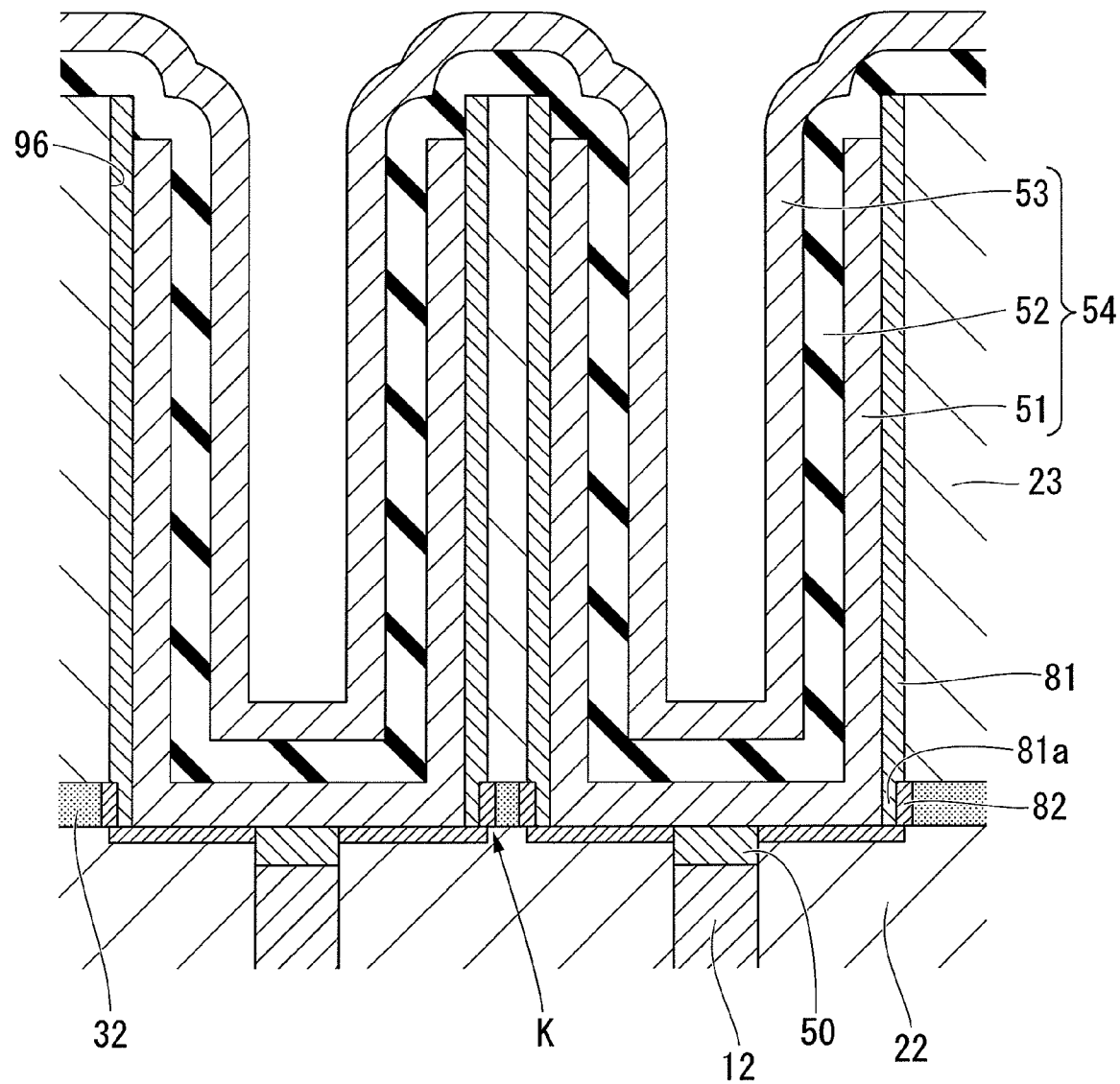
FIG. 2 is a fragmentary enlarged cross sectional view illustrating a capacitor structure included in a memory cell in the semiconductor device of FIG. 1.

FIG. 2 is a fragmentary enlarged cross sectional view illustrating a capacitor structure included in a memory cell in the semiconductor device of FIG. 1. The capacitor 54 may have a multi-layered structure that includes adhesive layers 81 and 81a, a bottom electrode 51, a capacitive insulating film 52, and a top electrode 53. The multi-layered structure extends along the side and bottom walls of the capacitor hole 96 of the modified-cylinder-shape as well as over an adjacent top surface portion of the fourth inter-layer insulator 32 and 23. The adjacent top surface portion of the fourth inter-layer insulator 32 and 23 is adjacent to the capacitor hole 96.

The multi-layered structure may includes the adhesive layers 81 and 81a, the bottom electrode 51, the capacitive insulating film 52, and the top electrode 53. The adhesive layers 81 extend on the side and bottom walls of the capacitor hole 96 of the modified-cylinder-shape. The adhesive layer 81a extends on the lower portion of the side walls of the capacitor hole 96 of the modified-cylinder-shape. The adhesive layer 81a of titanium oxide contacts with a silicon oxynitride film 82. Further, the silicon oxynitride film 82 contacts with the side edge of the third inter-layer insulator 32 of silicon nitride. The adhesive layer 81a and the silicon oxynitride film 82 have substantially the same level as the third inter-layer insulator 32. The bottom wall of the capacitor hole 96 has a torus shape. The adhesive layer 81 on the bottom wall of the capacitor hole 96 has openings through which the titanium silicide films 50 are shown. The adhesive layers 81 and 81a may be realized by a titanium oxide film. The adhesive layers 81 contact with the second and fourth inter-layer insulators 22 and 23 of silicon oxide.

The bottom electrode 51 extends on the adhesive layers 81 and 81a and the top surfaces of the titanium silicide films 50. Namely, the bottom electrode 51 contacts with the adhesive layers 81 and 81a and the top surfaces of the titanium silicide films 50. The bottom electrode 51 extends along the side and bottom walls of the capacitor hole 96 of the modified-cylinder-shape. The bottom electrode 51 may be realized by a first titanium nitride film.

The capacitive insulating film 52 extends on the bottom electrode 51. Namely, the capacitive insulating film 52 contacts the bottom electrode 51. The capacitive insulating film 52 extends along the side and bottom walls of the capacitor hole 96 of the modified-cylinder-shape. The capacitive insulating film 52 may be realized by an aluminum oxide film. The thickness of the capacitive insulating film 52 may typically be, but is not limited to, 6 nanometers.

The top electrode 53 extends on the capacitive insulating film 52. Namely, the top electrode 53 contacts with the capacitive insulating film 52. The top electrode 53 extends along the side and bottom walls of the capacitor hole 96 of the modified-cylinder-shape. The top electrode 53 may be realized by a second titanium nitride film. The thickness of the top electrode 53 may typically be, but is not limited to, 15 nanometers.

Thus, the silicon oxynitride film 82 is horizontally adjacent to the silicon nitride inter-layer insulator 32. The titanium oxide adhesive layer 81a is adjacent to the silicon oxynitride film 82. The silicon oxynitride film 82 is interposed between the silicon nitride inter-layer insulator 32 and the titanium oxide adhesive layer 81a. The bottom portion of the titanium nitride bottom electrode 51 is horizontally adjacent to the titanium oxide adhesive layer 81a. The titanium oxide adhesive layer 81a is interposed between the silicon oxynitride film 82 and the bottom portion of the titanium nitride bottom electrode 51.

The bottom electrode 51 performs as an electrode of the capacitor 54. The bottom electrode 51 has an outer surface that adheres to the adhesive layers 81 and 81a. The adhesive layer 81 adheres to the fourth inter-layer insulator 23 of silicon oxide. The adhesive layer 81a adheres to the silicon oxynitride film 82. The silicon oxynitride film 82 adheres to the third inter-layer insulator 32 of silicon nitride. The bottom electrode 51 has the bottom portion which partially contacts with the titanium silicide films 50.

With reference back to FIG. 1, the titanium silicide films 50 contact with the polysilicon plugs 12. The polysilicon plugs 12 contact with the polysilicon plugs 11. The polysilicon plugs 11 contact with the diffusion layers 5 of the memory cell transistors. Namely, the bottom electrode 51 of the capacitor 54 is electrically connected to the diffusion layers 5 of the memory cell transistors.

Over the memory cell area 100 and the peripheral circuit area 200, a fifth inter-layer insulator 24 is disposed on the top electrode 53 of the capacitor 54 and on the fourth inter-layer insulator 24. The fifth inter-layer insulator 24 can be realized by a silicon oxide film.

In the peripheral circuit area 200, third and fourth through holes are formed in the stack of the second, third, fourth and fifth inter-layers 22, 32, 23, and 24. The third through hole communicates with the top of the metal plug 41. The metal plug 41 contacts with the diffusion layer 7. The fourth through hole communicates with the top surface of the first-level interconnection 8a. The first-level interconnection 8a contacts with the top of the metal plug 41a. The metal plug 41a contacts with the diffusion layer 7a. The third and fourth through holes are filled with first and second contact plugs 42 and 43, respectively. The first and second contact plugs 42 and 43 contact with the metal plug 41 and the first-level interconnection 8a. The first contact plug 43 is electrically connected through the metal plug 41 to the diffusion layer 7 of the peripheral circuit transistor. The second contact plug 44 is electrically connected through the first-level interconnection 8a and the metal plug 41a to the diffusion layer 7a of the peripheral circuit transistor.

On the boundary between the memory cell area 100 and the peripheral circuit area 200, a fifth through hole is formed in the fifth inter-layer insulator 24. The fifth through hole communicates with the top electrode 53 of the capacitor 54. The fifth through hole is filled with a third contact plug 44. The third contact plug 44 contacts with the top electrode 53 of the capacitor 54. A second-level interconnection 61 is disposed on the fifth inter-layer insulator 24 so that the second-level interconnection 61 contacts with the second and third contact plugs 43 and 44. Namely, the second-level interconnection 61 electrically connects between the first and third contact plugs 43 and 44. An additional second-level interconnection 61a is disposed on the fifth inter-layer insulator 24 so that the additional second-level interconnection 61a contacts with the first contact plug 42.

The bit line 8 is electrically connected through the polysilicon plug 11a to the memory cell transistors. The memory cell transistors are electrically connected through the polysilicon plugs 11 and 12 to the capacitor 54. The capacitor 54 is electrically connected to the peripheral circuit transistor through the third contact plug 44, the second-level interconnection 61, the second contact plug 43, and the metal plug 41. The peripheral circuit transistor is electrically connected to a peripheral circuit through the metal plug 41a, the first level interconnection 8a, the first contact plug 42, and the additional second-level interconnection 61a. In other words, the peripheral circuit transistor performs as a switch between the top electrode 53 of the capacitor 54 of the memory cell and the peripheral circuit. The memory cell transistors perform as another switch between the bit line 8 and the bottom electrode 51 of the capacitor 54 of the memory cell.

(2) Method of Forming Semiconductor Memory Device and Capacitor:

A method of forming the semiconductor memory device of FIG. 1 including the memory cell capacitor of FIG. 2 will be described. FIGS. 3 through 13 are fragmentary cross sectional elevation views illustrating semiconductor memory devices in sequential steps involved in a method of forming the semiconductor memory device of FIGS. 1 and 2 in accordance with the first embodiment of the present invention.

Figure 3:
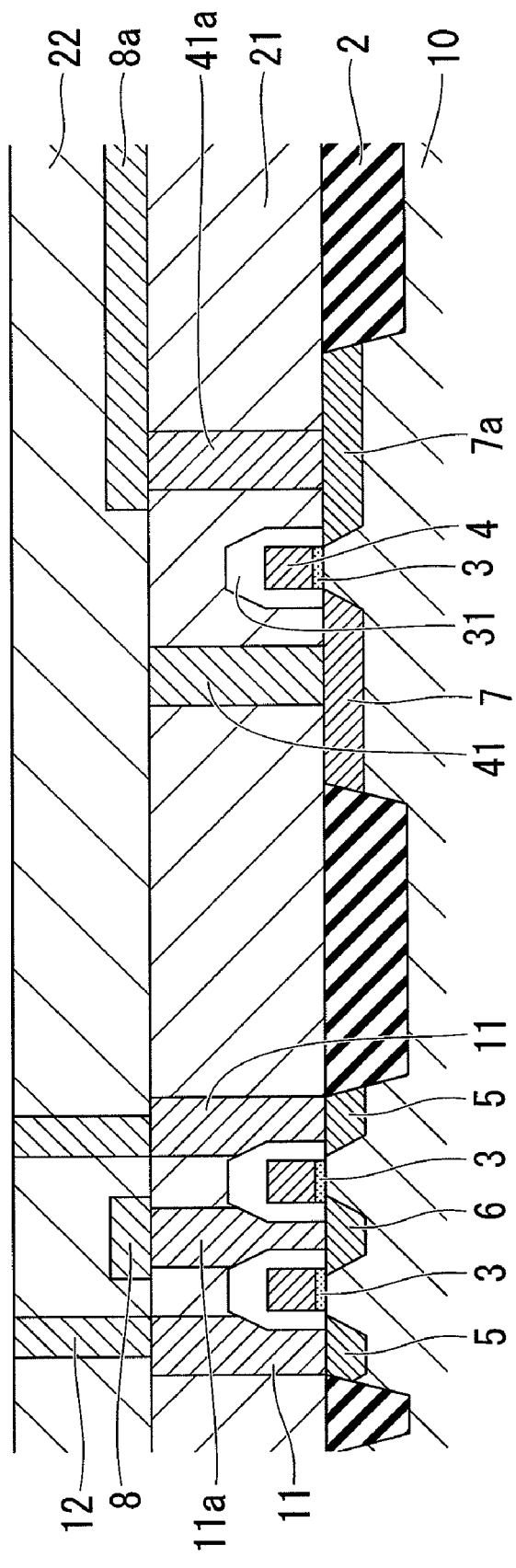
FIG. 3 is a fragmentary cross sectional elevation views illustrating a semiconductor memory device in a sequential step involved in a method of forming the semiconductor memory device of FIGS. 1 and 2 in accordance with the first embodiment of the present invention.

With reference to FIG. 3, a silicon substrate 10 with a main face is prepared. An isolating film 2 such as a local oxidation of silicon film is formed on the main face of the silicon substrate 10 so that the isolating film 2 defines first and second active regions of the silicon substrate 10 in the memory cell area 100 and the peripheral circuit area 200 shown in FIG. 1. The first and second active regions are surrounded by the isolating film 2. First and second gate structures are formed on the first active region, while a third gate structure is formed on the second active region. Each of the gate structure includes a gate insulating film 3, a gate electrode 4, and an insulating film 31. The processes for forming the first to third gate structures may be the known processes. Diffusion layers 5 and 6 that perform as source and drain regions are formed in the first active region, while diffusion layers 7 and 7a that perform as source and drain regions are formed in the second active region. The processes for forming the diffusion layers 5, 6, 7 and 7a may be the known processes. As a result, a pair of memory cell transistors is formed in the first active region, while a peripheral circuit transistor is formed in the second active region.

A first inter-layer insulator 21 is formed over the memory cell area 100 and the peripheral circuit area 200. Namely, the first inter-layer insulator 21 is formed over the first and second active regions and the isolation film 2. The first inter-layer insulator 21 embeds the memory cell transistors and the peripheral circuit transistor.

In the memory cell area 100, first to third contact holes are formed in the first inter-layer insulator 21, so that the first contact hole communicates with the diffusion layer 6, and the second and third contact holes communicate with the diffusion layers 5. In the peripheral circuit area 200, fourth and fifth contact holes are formed in the first inter-layer insulator 21, so that the fourth and fifth contact holes communicate with the diffusion layers 7 and 7a. Deposition of a polysilicon film and subsequent etch-back process is carried out. A polysilicon plug 11a is formed in the first contact hole, while polysilicon plugs 11 are formed in the second and third contact holes. The polysilicon plug 11a contacts with the diffusion layer 6. The polysilicon plugs 11 contact with the diffusion layers 5. Further, deposition of a metal film and subsequent etch-back process is carried out. Metal plugs 41 and 41a are formed in the fourth and fifth contact holes. The metal plugs 41 and 41a contact with the diffusion layers 7 and 7a.

A bit-line 8 and a first-level interconnection 8a are formed on the first inter-layer insulator 21 so that the bit-line 8 contacts with the top of the polysilicon plug 11a and the first-level interconnection 8a contacts with the metal plug 41a. The bit-line 8 is electrically connected through the polysilicon plug 11a to the diffusion layer 6. The first-level interconnection 8a is electrically connected through the metal plug 41a to the diffusion layer 7a. The bit-line 8 and the first-level interconnection 8a may be realized by a tungsten film.

Over the memory cell area 100 and the peripheral circuit area 200, a second inter-layer insulator 22 is formed over the first inter-layer insulator 21, the polysilicon plugs 11 and 11a, and the metal plugs 41 and 41a, as well as over the bit line 8 and the first-level interconnection 8a. The second inter-layer insulator 22 embeds the bit line 8 and the first-level interconnection 8a. The second inter-layer insulator 22 can be realized by a silicon oxide film.

In the memory cell area 100, first and second through holes are formed in the second inter-layer insulator 22 so that the first and second through holes communicate with the polysilicon plugs 11. Deposition of a polysilicon film and subsequent etch-back process is carried out so that polysilicon plugs 12 are formed in the first and second through holes of the second inter-layer insulator 22. The polysilicon plugs 12 contact with the polysilicon plugs 11 which further contact with the diffusion layers 5. Thus, the polysilicon plugs 12 are eclectically connected through the polysilicon plugs 11 to the diffusion layers 5 of the memory cell transistors.

Figure 4:
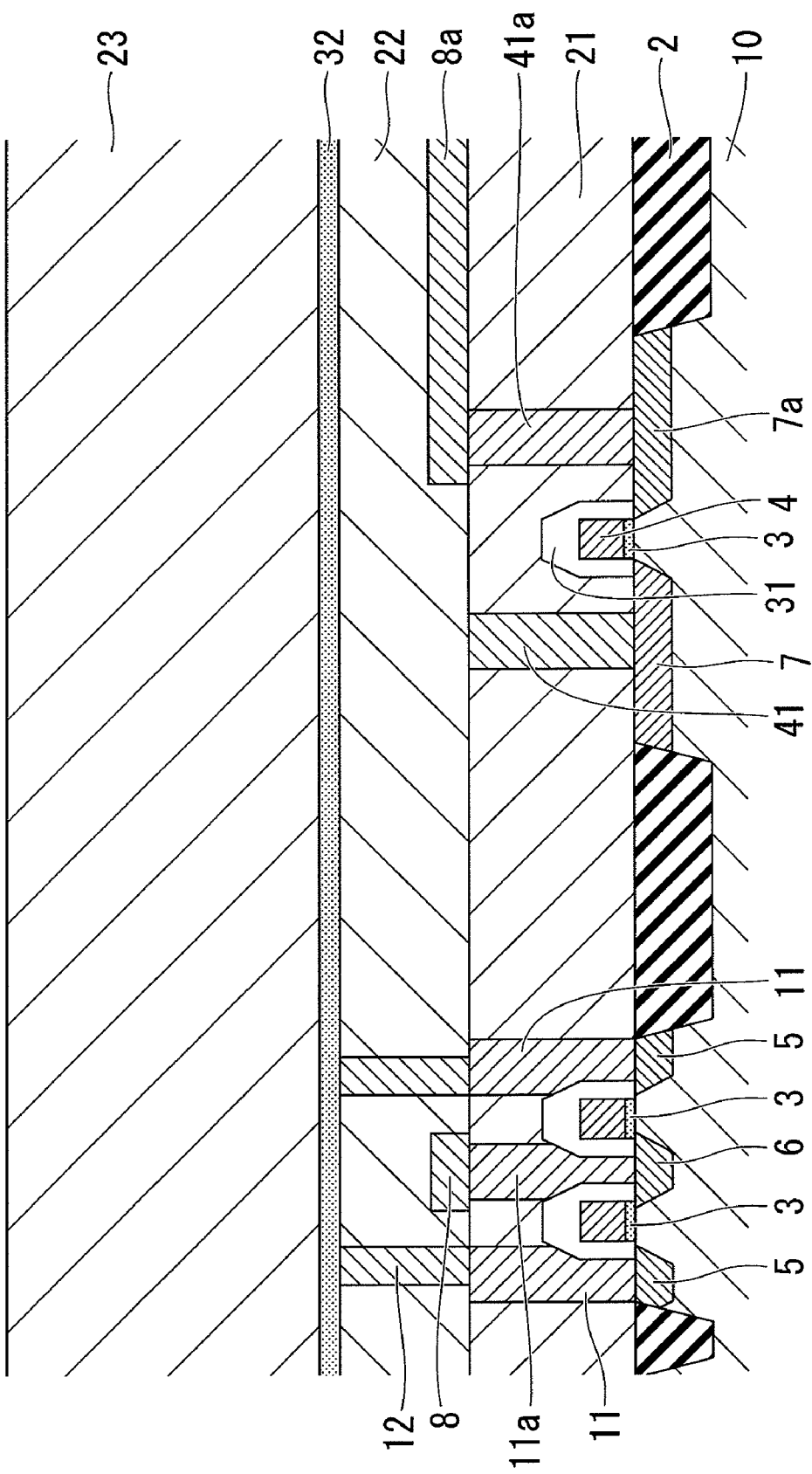
FIG. 4 is a fragmentary cross sectional elevation views illustrating a semiconductor memory device in a sequential step, after the step of FIG. 3, involved in a method of forming the semiconductor memory device of FIGS. 1 and 2 in accordance with the first embodiment of the present invention.

With reference to FIG. 4, over the memory cell area 100 and the peripheral circuit area 200, a third inter-layer insulator 32 is formed on the second inter-layer insulator 22 and on the titanium silicide films 50. The third inter-layer insulator 32 can be realized by a silicon nitride film. Further, a fourth inter-layer insulator 23 is formed on the third inter-layer insulator 32. The fourth inter-layer insulator 23 can be realized by a silicon oxide film. The thickness of the fourth inter-layer insulator 23 may typically be, but is not limited to, 3 micrometers.

Figure 5:
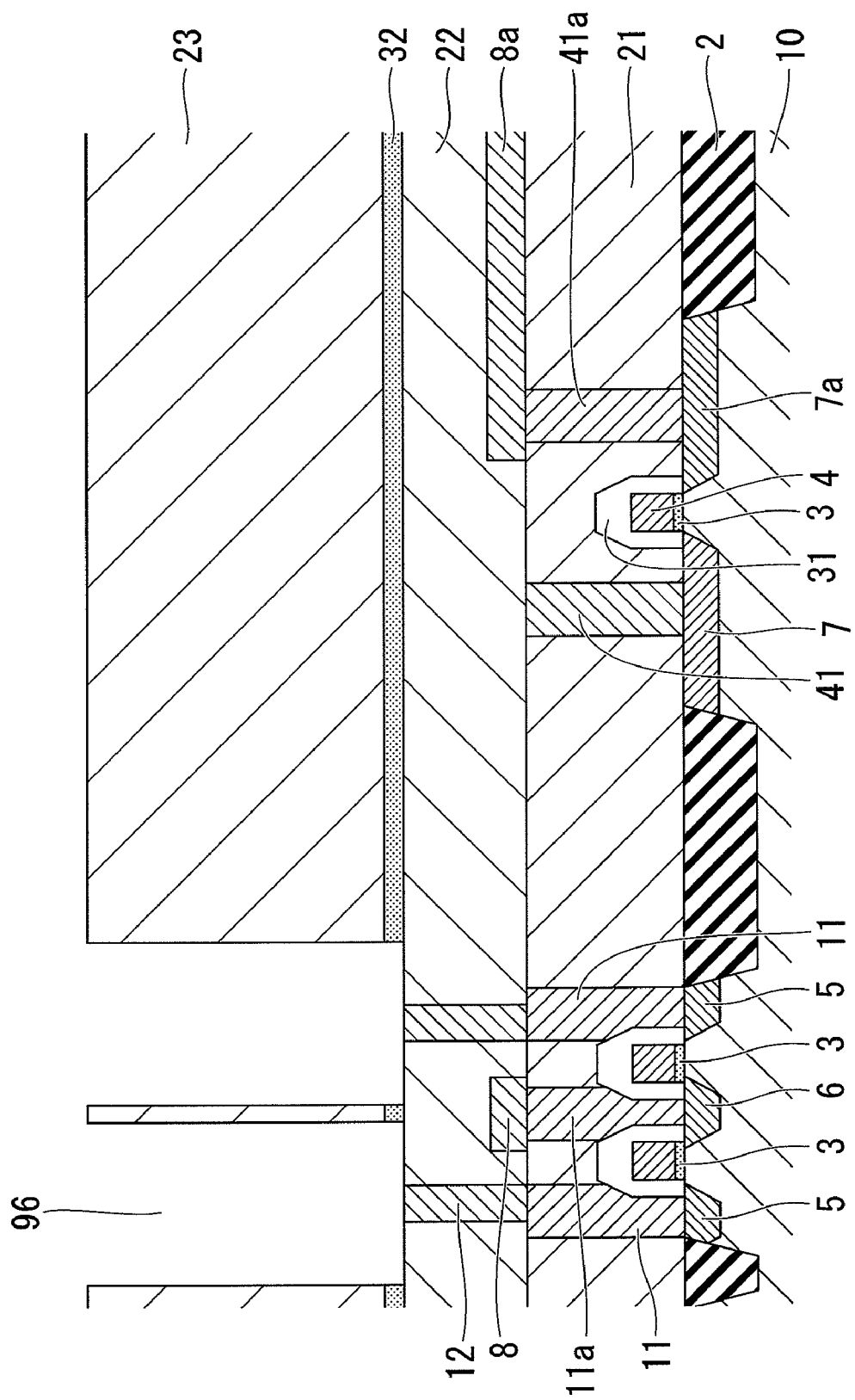
FIG. 5 is a fragmentary cross sectional elevation views illustrating a semiconductor memory device in a sequential step, after the step of FIG. 4, involved in a method of forming the semiconductor memory device of FIGS. 1 and 2 in accordance with the first embodiment of the present invention.

With reference to FIG. 5, in the memory cell area 100, a capacitor hole 96 is formed in the stack of the third and fourth inter-layer insulators 32 and 23. The capacitor hole 96 may be modified-cylinder-shaped. In plan view, the capacitor hole 96 has a torus shape. The capacitor hole 96 penetrates the stack of the third and fourth inter-layer insulators 32 and 23. The capacitor hole 96 communicates with the polysilicon plugs 12 in the first and second through holes. The tops of the polysilicon plugs 12 are shown through the modified-cylinder-shaped capacitor hole 96. The third inter-layer insulator 32 has side portions that are shown through the modified-cylinder-shaped capacitor hole 96.

The capacitor hole 96 is formed by a dry etching process using a photo-resist film. The third inter-layer insulator 32 of silicon nitride is different or lower in etching rate than the fourth inter-layer insulator 23 of silicon oxide. Whereas the capacitor hole 96 can be formed by a single known dry etching process, it is not easy to ensure the in-plane uniformity of the depth of the capacitor hole 96 if using the single etching process as well as ensure the depth uniformity over different wafers. It can be preferable, but is not essential, to carry out two dry etching processes in order to form the capacitor hole 96 in the stack of the third and fourth inter-layer insulators 32 and 23. For example, a first dry etching process is carried out to selectively etch the fourth inter-layer insulator 23, while the third inter-layer insulator 32 performing as an etching stopper. Then, a second dry etching process is carried out to selectively etch the third inter-layer insulator 32, while the second inter-layer insulator 22 performing as another etching stopper. The combination of the first and second dry etching processes can improve the in-plane uniformity of the depth of the capacitor hole 96 and the depth uniformity over different wafers.

Figure 6:
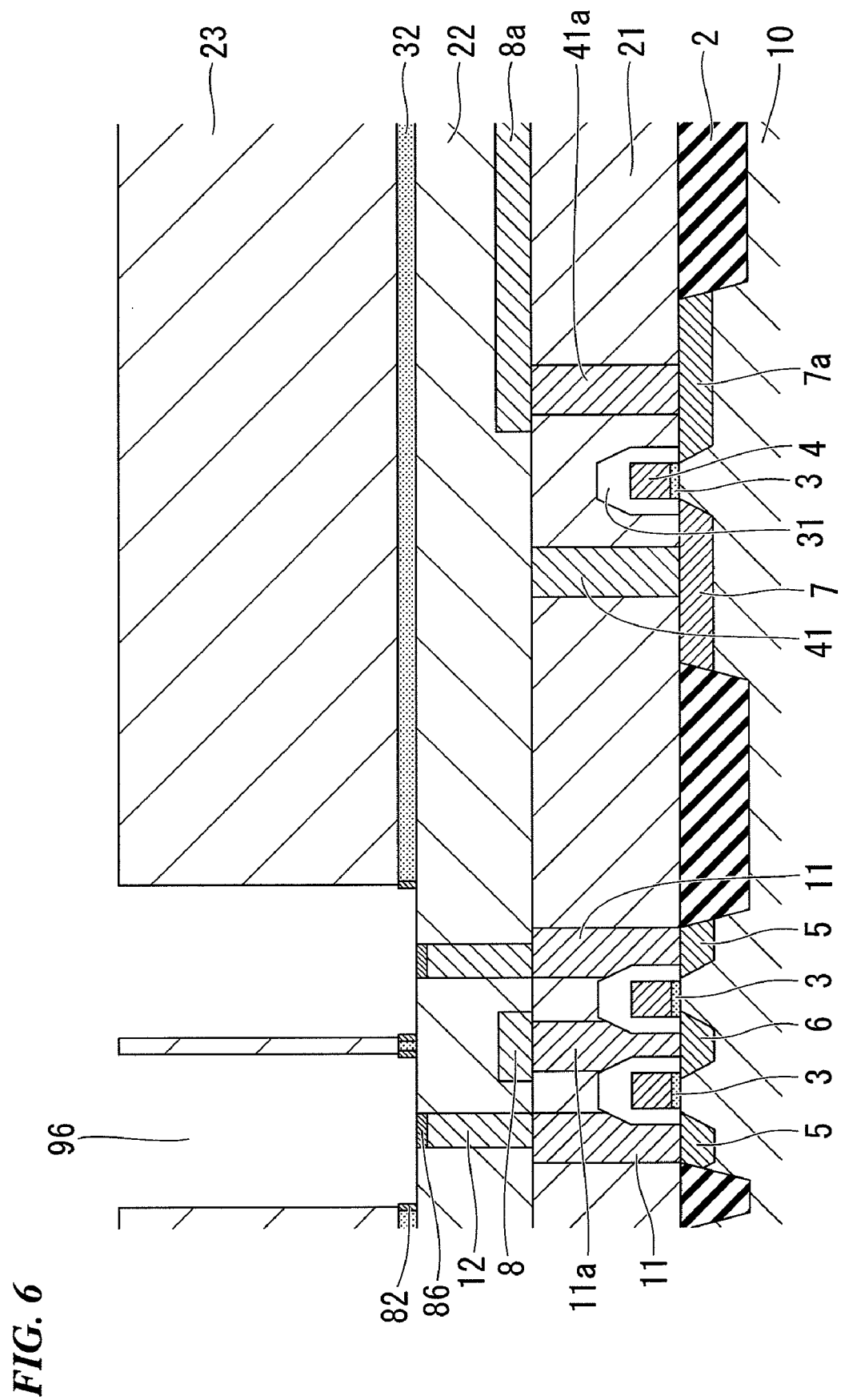
FIG. 6 is a fragmentary cross sectional elevation views illustrating a semiconductor memory device in a sequential step, after the step of FIG. 5, involved in a method of forming the semiconductor memory device of FIGS. 1 and 2 in accordance with the first embodiment of the present invention.

With reference to FIG. 6, the side portions of the third inter-layer insulator 32 and the top surfaces of the polysilicon plugs 12 are exposed to an atmosphere in the capacitor hole 96. The side portions of the third inter-layer insulator 32 of silicon nitride and the top surfaces of the polysilicon plugs 12 are then subjected to an oxidation process so that the side portions of silicon nitride are modified into silicon oxynitride films (SiON films) 82, while the polysilicon plugs 12 of polysilicon are modified into silicon oxide films 86. Namely, by the oxidation process, the silicon oxynitride films (SiON films) 82 are formed on the side edges of the third inter-layer insulator 32, while the silicon oxide films 86 are formed on the top surfaces of the polysilicon plugs 12.

In some cases, the oxidation process may be realized by a thermal oxidation process that is carried out at 700° C. for 10 minutes, thereby forming the silicon oxynitride film 82 having a thickness of approximately 1 nanometer. The thermal oxidation process can be carried out in either an oxygen atmosphere or a nitrogen atmosphere. When the thermal oxidation process is carried out in the oxygen atmosphere, the side portions of silicon nitride are oxidized by oxygen contained in the oxygen atmosphere. When the thermal oxidation process is carried out in the nitrogen atmosphere, the side portions of silicon nitride are oxidized by oxygen and/or water that have been eliminated from the second and fourth inter-layer insulators 22 and 23 of silicon oxide which are exposed to the nitrogen atmosphere in the capacitor hole 96.

In other cases, the oxidation process may also be realized by a plasma oxidation process, so that the side portions of silicon nitride are oxidized by oxygen that has been eliminated from the second and fourth inter-layer insulators 22 and 23 of silicon oxide which are exposed to the plasma atmosphere in the capacitor hole 96.

A wet cleaning process is carried out to remove the silicon oxide films 86 from the polysilicon plugs 12, while leaving the silicon oxynitride films (SiON films) 82 on the side edges of the third inter-layer insulator 32. The wet cleaning process can be realized by using a hydrogen fluoride solution that is diluted with ammonium water, namely BHF water, or a hydrogen fluoride solution that is diluted with water, namely DHF water. Use of BHF water or DHF water can remove the silicon oxide films 86 from the polysilicon plugs 12, while leaving the silicon oxynitride films (SiON films) 82 on the side edges of the third inter-layer insulator 32.

Figure 7:
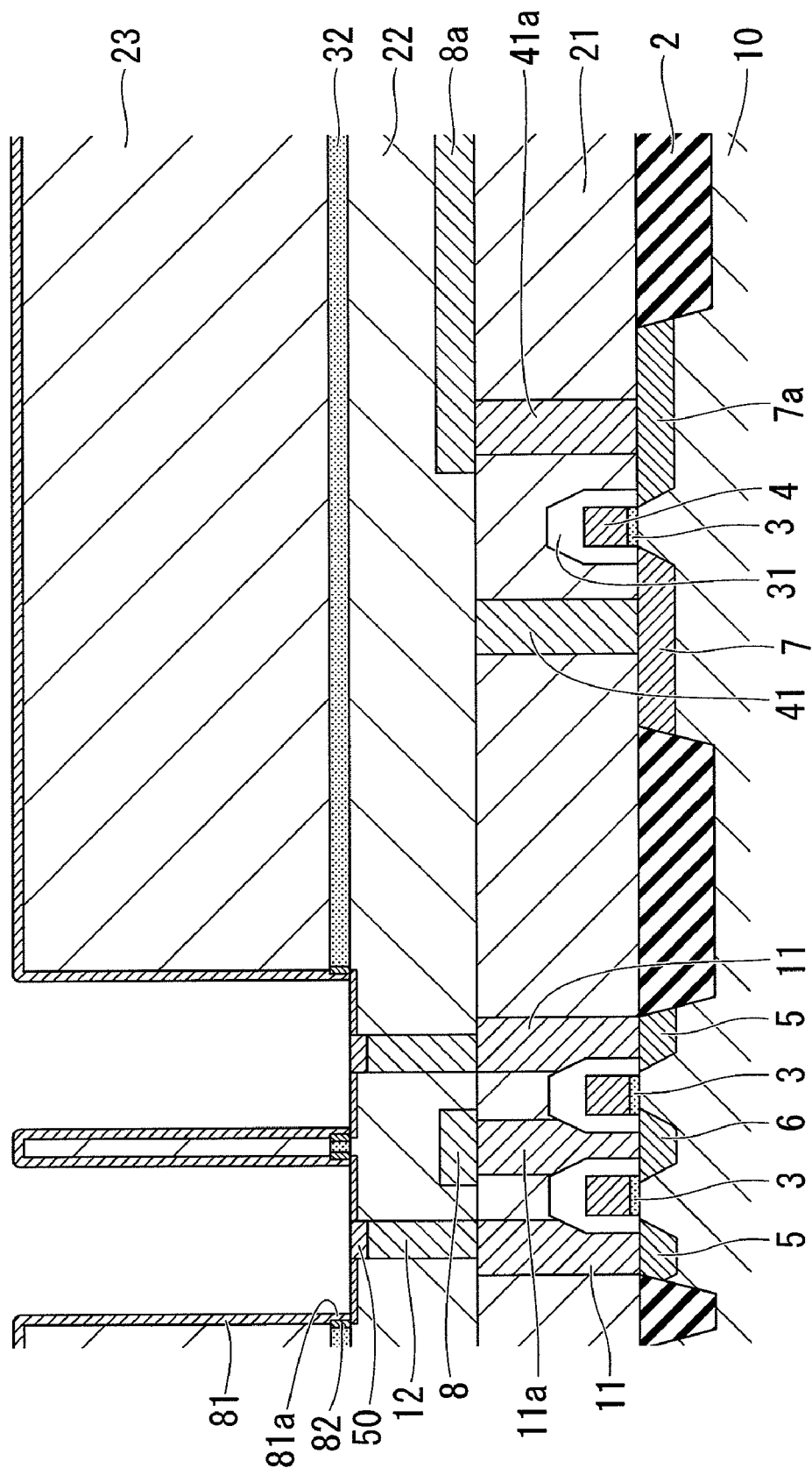
FIG. 7 is a fragmentary cross sectional elevation views illustrating a semiconductor memory device in a sequential step, after the step of FIG. 6, involved in a method of forming the semiconductor memory device of FIGS. 1 and 2 in accordance with the first embodiment of the present invention.

With reference to FIG. 7, a chemical vapor deposition process is carried out to form adhesive layers 81 and 81a of titanium oxide (TiO). The titanium oxide adhesive layer 81 is deposited on the surfaces of the second and fourth inter-layer insulators 22 and 23 of silicon oxide. The titanium oxide adhesive layer 81a is deposited on the silicon oxynitride films (SiON films) 82 which is adjacent to the side edges of the third inter-layer insulator 32. In some cases, the chemical vapor deposition process can be carried out at 650° C. in a titanium tetrachloride ($TiCl_4$) gas. The chemical vapor deposition process causes a reaction between titanium of titanium tetrachloride ($TiCl_4$) and silicon oxide of the second and fourth inter-layer insulators 22 and 23, thereby forming the titanium oxide adhesive layer 81 on the surfaces of the second and fourth inter-layer insulators 22 and 23. The chemical vapor deposition process also causes another reaction between titanium of titanium tetrachloride ($TiCl_4$) and silicon oxynitride of the silicon oxynitride films (SiON films) 82, thereby forming the titanium oxide adhesive layer 81a on the silicon oxynitride films (SiON films) 82.

The top surfaces of the polysilicon plugs 12 are also exposed to the titanium tetrachloride ($TiCl_4$) atmosphere in the capacitor hole 96 since the silicon oxide films 86 have been removed by the wet etching process. Thus, the chemical vapor deposition process also causes a silicidation reaction between titanium of titanium tetrachloride ($TiCl_4$) and polysilicon of the polysilicon plugs 12, thereby forming titanium silicide films 50 on the top surfaces of the polysilicon plugs 12. Namely, the side and bottom walls of the capacitor hole 96 are covered by the titanium oxide adhesive layers 81 and 81a and the titanium silicide films 50.

The silicon oxynitride films (SiON films) 82 is adjacent to the side edges of the third inter-layer insulator 32 of silicon nitride. The titanium oxide adhesive layer 81a is also adjacent to the silicon oxynitride films (SiON films) 82. The silicon oxynitride films (SiON films) 82 is interposed as an intermediate layer between the third inter-layer insulator 32 of silicon nitride (SiN) and the titanium oxide (TiO) adhesive layer 81a. Silicon oxynitride (SiON) has adhesiveness to both titanium oxide (TiO) and silicon nitride (SiN). Thus, the silicon oxynitride films (SiON films) 82 have adhesiveness to the silicon nitride (SiN) third inter-layer insulator 32 and also to the titanium oxide (TiO) adhesive layer 81a. In other words, the silicon oxynitride films (SiON films) 82 provide enhanced adhesiveness between the silicon nitride (SiN) third inter-layer insulator 32 and the titanium oxide (TiO) adhesive layer 81a.

Figure 8:
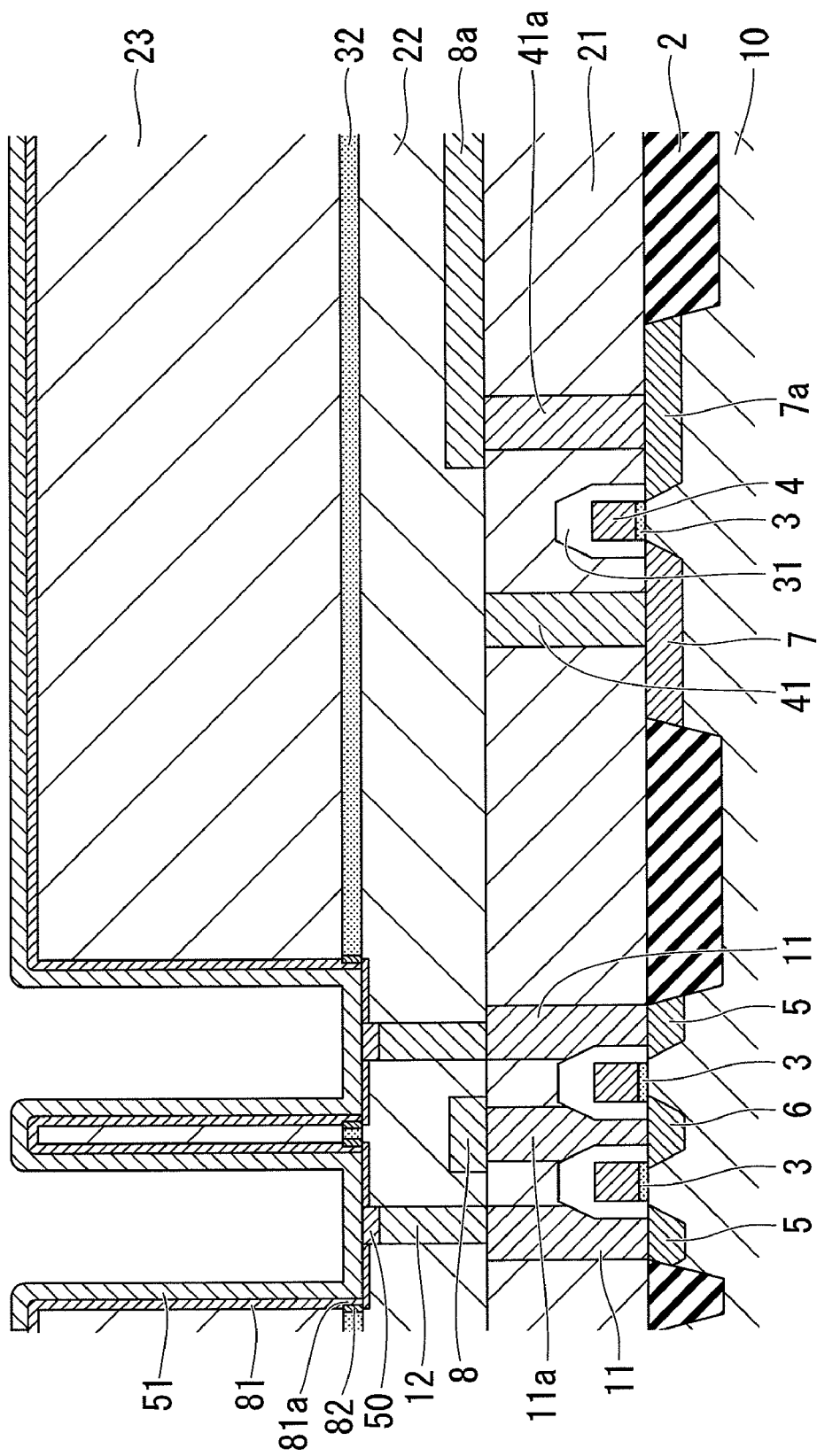
FIG. 8 is a fragmentary cross sectional elevation views illustrating a semiconductor memory device in a sequential step, after the step of FIG. 7, involved in a method of forming the semiconductor memory device of FIGS. 1 and 2 in accordance with the first embodiment of the present invention.

With reference to FIG. 8, a chemical vapor deposition process is carried out to form a titanium nitride bottom electrode film 51 on the titanium oxide (TiO) adhesive layers 81 and 81a and the titanium silicide films 50. The thickness of the titanium nitride bottom electrode film 51 may typically be, but is not limited to, 10 nanometers. The titanium nitride bottom electrode film 51 is adhered via the titanium oxide (TiO) adhesive layer 81 to the silicon oxide fourth inter-layer insulator 23. Further, the titanium nitride bottom electrode film 51 is adhered via the titanium oxide (TiO) adhesive layer 81a and the silicon oxynitride films (SiON films) 82 to the silicon nitride (SiN) third inter-layer insulator 32. In other words, the titanium oxide (TiO) adhesive layer 81 provides adhesiveness between the titanium nitride bottom electrode film 51 and the silicon oxide fourth inter-layer insulator 23.

The titanium oxide (TiO) adhesive layer 81*a* provides adhesiveness between the titanium nitride bottom electrode film 51 and the silicon oxynitride films (SiON films) 82. The silicon oxynitride films (SiON films) 82 also provide enhanced adhesiveness between the titanium oxide (TiO) adhesive layer 81*a* and the silicon nitride (SiN) third inter-layer insulator 32. Thus, the titanium oxide (TiO) adhesive layer 81*a* in combination with the silicon oxynitride films (SiON films) 82 provide enhanced adhesiveness between the titanium nitride bottom electrode film 51 and the silicon nitride (SiN) third inter-layer insulator 32. The silicon oxynitride films (SiON films) 82 may be regarded as an intermediate adhesive layer, or as an additional adhesive layer in addition to the titanium oxide (TiO) adhesive layer 81*a*.

Figure 9:
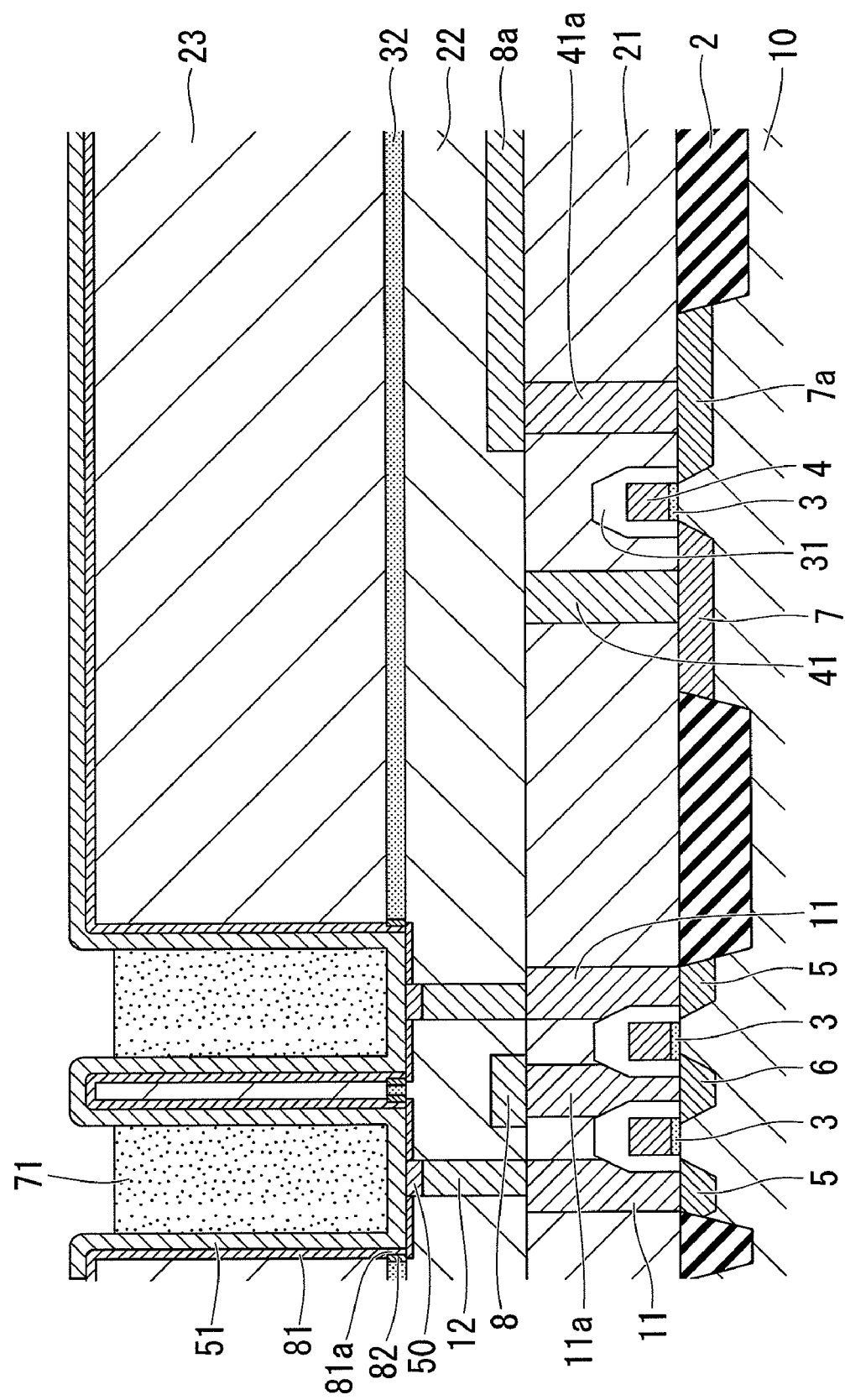
FIG. 9 is a fragmentary cross sectional elevation views illustrating a semiconductor memory device in a sequential step, after the step of FIG. 8, involved in a method of forming the semiconductor memory device of FIGS. 1 and 2 in accordance with the first embodiment of the present invention.

With reference to FIG. 9, a photo-resist film 71 is selectively formed in the capacitor hole 96. The stack of the titanium nitride bottom electrode film 51 and the titanium oxide (TiO) adhesive layer 81 has a first portion which is present in the capacitor hole 96, and a second portion which is present over the fourth inter-layer insulator 23 of silicon oxide. The first portion of the stack of the titanium nitride bottom electrode film 51 and the titanium oxide (TiO) adhesive layer 81 is covered by the photo-resist film 71, while the second portion of the stack is not covered by the photo-resist film 71.

Figure 10:
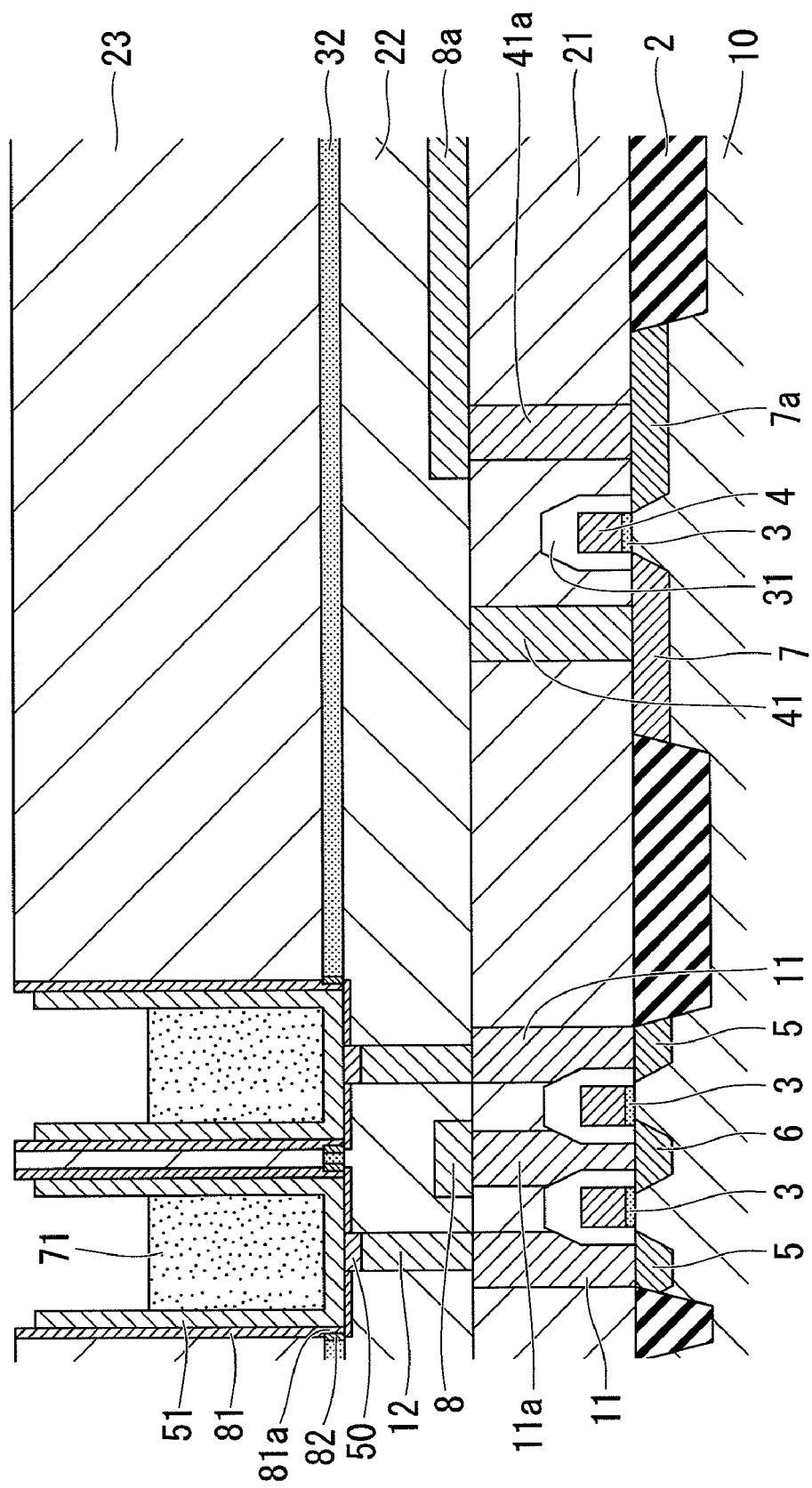
FIG. 10 is a fragmentary cross sectional elevation views illustrating a semiconductor memory device in a sequential step, after the step of FIG. 9, involved in a method of forming the semiconductor memory device of FIGS. 1 and 2 in accordance with the first embodiment of the present invention.

With reference to FIG. 10, an etch-back process is carried out to remove the first portion of the stack of the titanium nitride bottom electrode film 51 and the titanium oxide (TiO) adhesive layer 81 as well as remove an upper portion of the photo-resist film 71 in the capacitor hole 96. Namely, the etch-back process is carried out to leave the second portion of the stack of the titanium nitride bottom electrode film 51 and the titanium oxide (TiO) adhesive layers 81 and 81*a* as well as a lower portion of the photo-resist film 71 in the capacitor hole 96. As a result of the etch-back process, the upper surface of the fourth inter-layer insulator 23 is shown, while the side and bottom walls of the capacitor hole 96 remain covered by the remaining portion of the stack of the titanium nitride bottom electrode film 51 and the titanium oxide (TiO) adhesive layers 81 and 81*a*.

Figure 11:
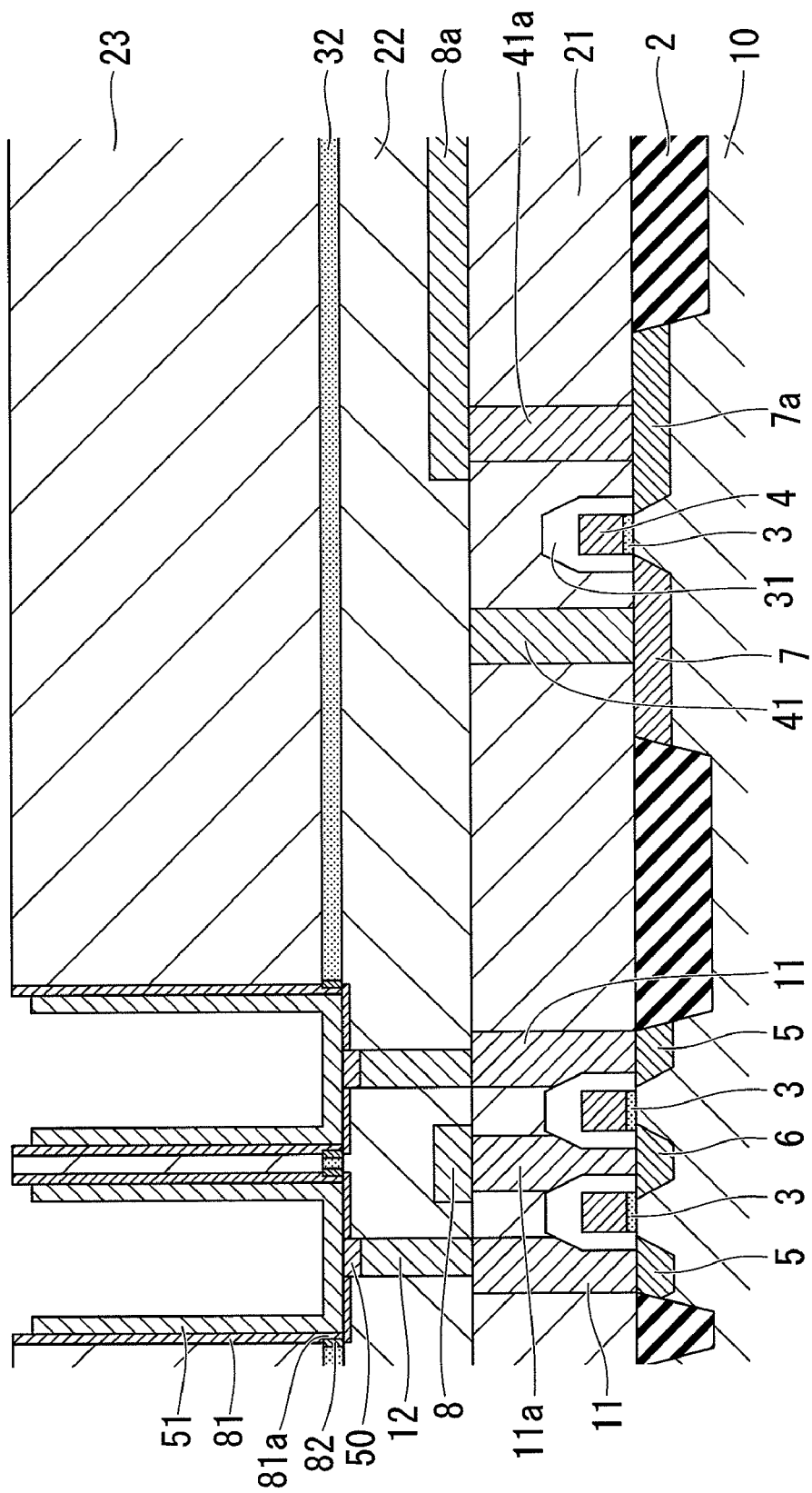
FIG. 11 is a fragmentary cross sectional elevation views illustrating a semiconductor memory device in a sequential step, after the step of FIG. 10, involved in a method of forming the semiconductor memory device of FIGS. 1 and 2 in accordance with the first embodiment of the present invention.

With reference to FIG. 11, the remaining photo-resist film 71 is removed from the capacitor hole 96. In some cases, the removal of the remaining photo-resist film 71 can be made by using an organic release agent, thereby completing the titanium nitride bottom electrode 51 of the modified-cylinder-shape.

Figure 12:
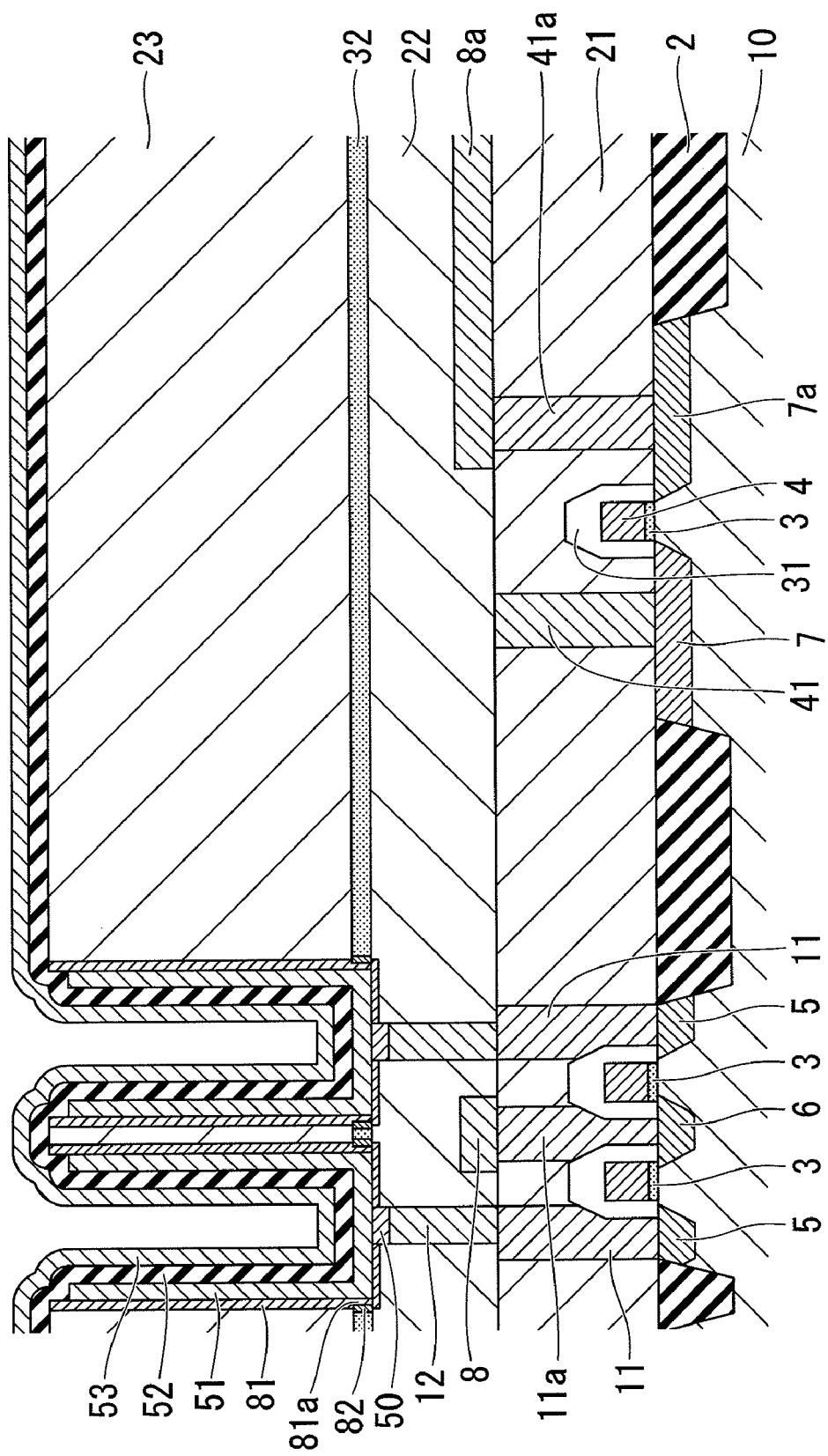
FIG. 12 is a fragmentary cross sectional elevation views illustrating a semiconductor memory device in a sequential step, after the step of FIG. 1, involved in a method of forming the semiconductor memory device of FIGS. 1 and 2 in accordance with the first embodiment of the present invention.

With reference to FIG. 12, an aluminum oxide capacitive insulating film 52 is formed on the titanium nitride bottom electrode 51 and on the upper surface of the fourth inter-layer insulator 23 of silicon oxide. The aluminum oxide capacitive insulating film 52 can be formed by using an atomic layer deposition process. The thickness of the aluminum oxide capacitive insulating film 52 can typically be, but is not limited to, 6 nanometers. A titanium nitride top electrode 53 is formed on the aluminum oxide capacitive insulating film 52. The titanium nitride top electrode 53 can be formed by using a chemical vapor deposition process. The thickness of the titanium nitride top electrode 53 can typically be, but is not limited to, 15 nanometers.

Figure 13:
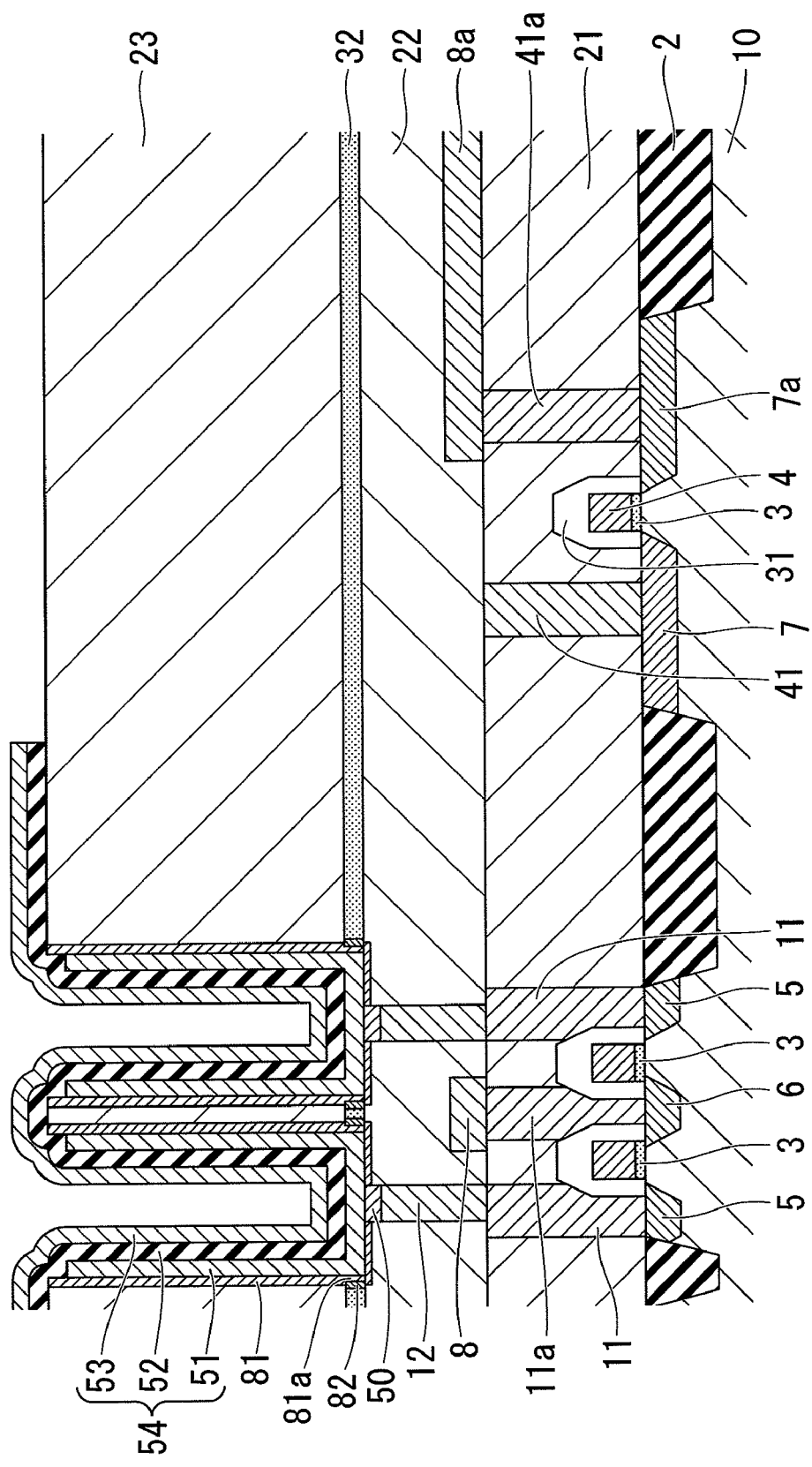
FIG. 13 is a fragmentary cross sectional elevation views illustrating a semiconductor memory device in a sequential step, after the step of FIG. 12, involved in a method of forming the semiconductor memory device of FIGS. 1 and 2 in accordance with the first embodiment of the present invention.

With reference to FIG. 13, the stack of the aluminum oxide capacitive insulating film 52 and the titanium nitride top electrode 53 is selectively removed so as to leave the stack in the capacitor hole 96 and over the adjacent portion of the upper surface of the fourth inter-layer insulator 23 of silicon oxide. The adjacent portion of the upper surface is adjacent to the capacitor hole 96. The stack of the aluminum oxide capacitive insulating film 52 and the titanium nitride top electrode 53 can be selectively removed by a photo-lithography technique and a dry etching technique. As a result, the capacitor 54 of modified-cylinder-shape is thus formed in the capacitor hole 96 of modified-cylinder-shape. The height of the capacitor 54 may typically be, but is not limited to, 3 micrometers.

With reference back to FIG. 1, over the memory cell area 100 and the peripheral circuit area 200, a silicon oxide fifth inter-layer insulator 24 is formed on the top electrode 53 of the capacitor 54 and on the fourth inter-layer insulator 24. In the peripheral circuit area 200, third and fourth through holes are formed in the stack of the second, third, fourth and fifth inter-layers 22, 32, 23, and 24. The third through hole communicates with the top of the metal plug 41. The fourth through hole communicates with the top surface of the first-level interconnection 8*a*. On the boundary between the memory cell area 100 and the peripheral circuit area 200, a fifth through hole is formed in the fifth inter-layer insulator 24. The fifth through hole communicates with the top electrode 53 of the capacitor 54.

A titanium nitride film is formed in the third, fourth and fifth through holes and on the upper surface of the silicon oxide fifth inter-layer insulator 24. Further, a tungsten film is formed on the titanium nitride film so as to fill the third, fourth and fifth through holes. A chemical mechanical polishing method is carried out to selectively remove the stack of the titanium nitride film and the tungsten film which extend over the upper surface of the silicon oxide fifth inter-layer insulator 24, while leaving the stack which fill the third, fourth and fifth through holes. As a result, first, second, and third metal plugs 42, 43, and 44 are formed in the third, fourth and fifth through holes. The first and second contact plugs 42 and 43 contact with the metal plug 41 and the first-level interconnection 8*a*. The first contact plug 43 is electrically connected through the metal plug 41 to the diffusion layer 7 of the peripheral circuit transistor. The second contact plug 44 is electrically connected through the first-level interconnection 8*a* and the metal plug 41*a* to the diffusion layer 7*a* of the peripheral circuit transistor. The third contact plug 44 contacts with the top electrode 53 of the capacitor 54.

A titanium film is deposited by a sputtering process on the upper surface of the silicon oxide fifth inter-layer insulator 24 and on the top surfaces of the first, second, and third metal plugs 42, 43, and 44. An aluminum film is deposited by a sputtering process on the titanium film. A titanium nitride film is deposited by a sputtering process on the aluminum film, thereby forming a stack of the titanium film, the aluminum film, and the titanium nitride film over the silicon oxide fifth inter-layer insulator 24. The stack of the titanium film, the aluminum film, and the titanium nitride film is then patterned by a lithography technique and a dry etching technique, thereby forming second-level interconnections 61 and 61*a*. The second-level interconnection 61 contacts with the second and third contact plugs 43 and 44. Namely, the second-level interconnection 61 electrically connects between the first and third contact plugs 43 and 44. The additional second-level interconnection 61*a* contacts with the first contact plug 42. As a result, the semiconductor memory device of FIG. 1 is completed.

Figure 14:
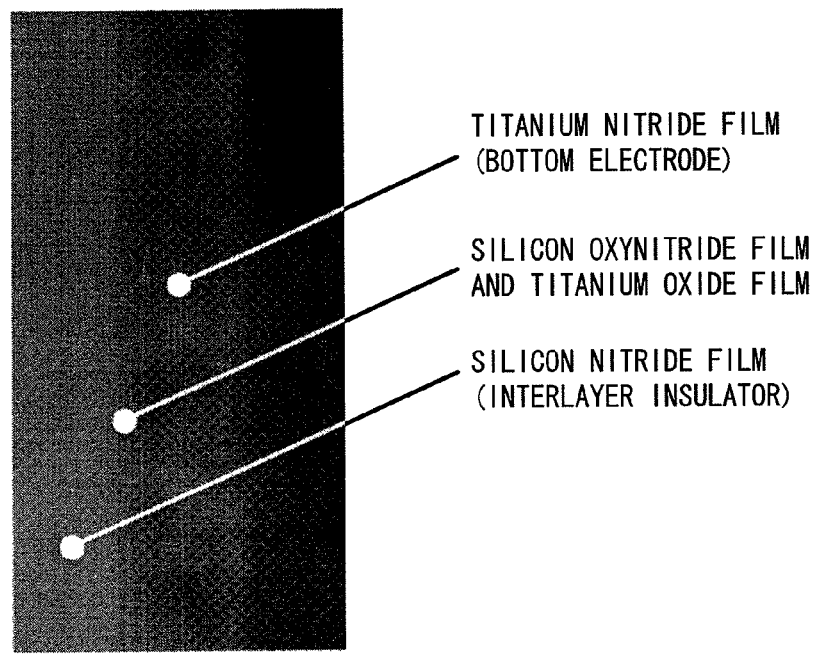
FIG. 14 is a photograph showing a fragmentary cross section of a portion, marked by "k" in FIG. 2, of the capacitor included in the semiconductor memory device by the above-described series of processes of FIGS. 2-13 in accordance with the first embodiment of the present invention.

(3) Analysis of the Capacitor:

FIG. 14 is a photograph showing a fragmentary cross section of a portion, marked by "k" in FIG. 2, of the capacitor included in the semiconductor memory device by the above-described series of processes of FIGS. 2-13 in accordance with the first embodiment of the present invention. FIG. 14 shows that a silicon oxynitride (SiON) layer is adhered to a silicon nitride (SiN) layer. This demonstrates that the silicon oxynitride film (SiON film) 82 is adhered to the silicon nitride (SiN) third inter-layer insulator 32. Namely, the silicon oxynitride film (SiON film) 82 has an interface to the silicon nitride (SiN) third inter-layer insulator 32, wherein the interface is free of any void or peeling. It is also shown that a titanium oxide (TiO) layer is adhered to the silicon oxynitride (SiON) layer. This demonstrates that the titanium oxide (TiO) adhesive layer 81*a* is adhered to the silicon oxynitride films (SiON films) 82. Namely, the titanium oxide (TiO) adhesive layer 81*a* has an interface to the silicon oxynitride film (SiON film) 82, wherein the interface is free of any void or peeling. It is also shown that a titanium nitride (TiN) layer is adhered to the titanium oxide (TiO) layer. Thus, the titanium nitride bottom electrode film 51 is adhered to the titanium oxide (TiO) adhesive layer 81. Namely, the titanium nitride bottom electrode film 51 has an interface to the titanium oxide (TiO) adhesive layer 81, wherein the interface is free of any void or peeling.

The silicon oxynitride film (SiON film) 82 has adhesiveness to the silicon nitride (SiN) third inter-layer insulator 32 and also to the titanium oxide (TiO) adhesive layer 81*a*. In other words, the silicon oxynitride films (SiON films) 82 provide enhanced adhesiveness between the silicon nitride (SiN) third inter-layer insulator 32 and the titanium oxide (TiO) adhesive layer 81*a*. The titanium oxide (TiO) adhesive layer 81*a* has adhesiveness to the silicon oxynitride films (SiON films) 82 and also to the titanium nitride bottom electrode film 51. In other words, the titanium oxide (TiO) adhesive layer 81*a* provide enhanced adhesiveness between the silicon oxynitride films (SiON films) 82 and the titanium nitride bottom electrode film 51. Thus, the titanium oxide (TiO) adhesive layer 81*a* in combination with the silicon oxynitride films (SiON films) 82 provide enhanced adhesiveness between the titanium nitride bottom electrode film 51 and the silicon nitride (SiN) third inter-layer insulator 32. The silicon oxynitride films (SiON films) 82 may be regarded as an intermediate adhesive layer, or as an additional adhesive layer in addition to the titanium oxide (TiO) adhesive layer 81*a*.

Figure 15:
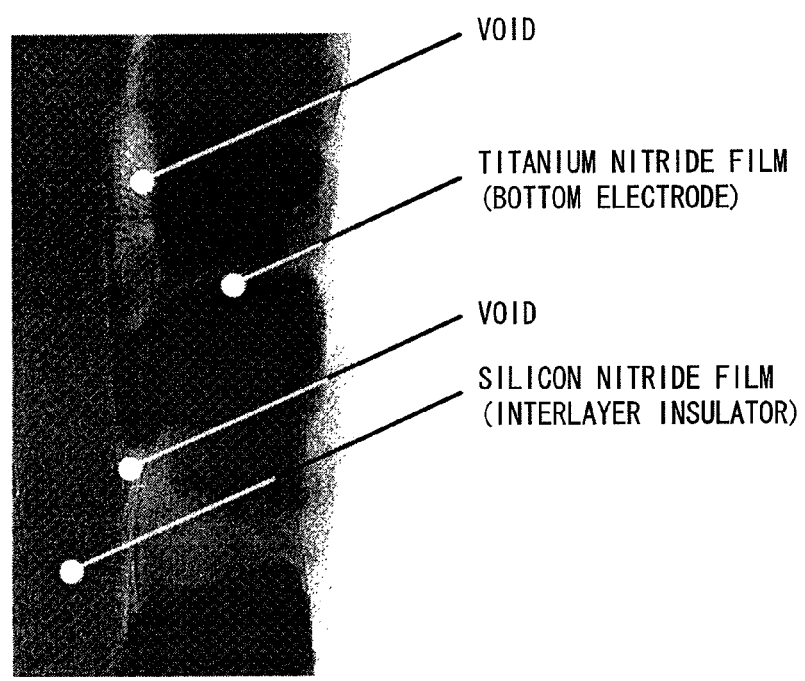
FIG. 15 is a photograph showing a fragmentary cross section of a portion of the capacitor in the absence of any adhesive layers between them in accordance with a comparative example to the first embodiment of the present invention.

FIG. 15 is a photograph showing a fragmentary cross section of a portion of the capacitor in the absence of any adhesive layers between them in accordance with a comparative example to the first embodiment of the present invention. FIG. 15 shows that a titanium nitride (TiN) layer is adjacent to a silicon nitride (SiN) layer in the absence of any adhesive layers between them. The titanium nitride (TiN) layer has an interface to a silicon nitride (SiN) layer, wherein the interface includes voids. This demonstrates that the titanium nitride bottom electrode film 51 is incompletely adhered to the silicon nitride (SiN) third inter-layer insulator 32. The titanium nitride bottom electrode film 51 has an interface to the silicon nitride (SiN) third inter-layer insulator 32, wherein the interface has voids. This demonstrates that the adhesiveness between the titanium nitride bottom electrode film 51 and the silicon nitride (SiN) third inter-layer insulator 32 is so weak as to provide poor thermal stress stability to the interface between the titanium nitride bottom electrode film 51 and the silicon nitride (SiN) third inter-layer insulator 32. In other words, voids may be formed at the interface between the titanium nitride bottom electrode film 51 and the silicon nitride (SiN) third inter-layer insulator 32 during the thermal process for forming the capacitor.

Figure 16B:
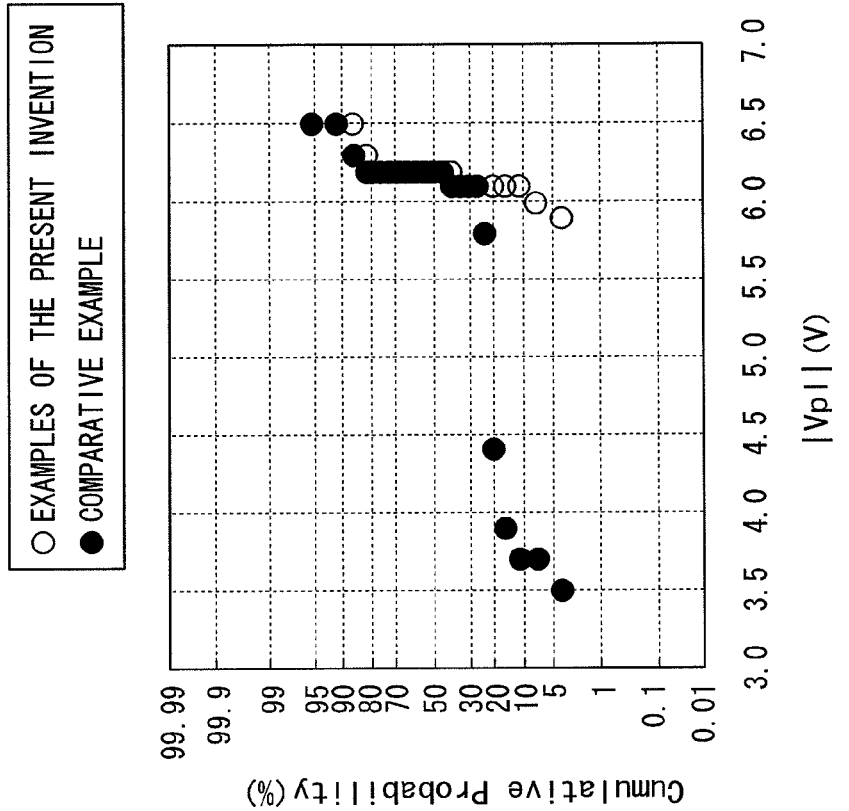
FIG. 16B is a diagram showing measured time zero dielectric breakdown characteristics of the capacitors of the first embodiment of the present invention and the comparative example.
Figure 16A:
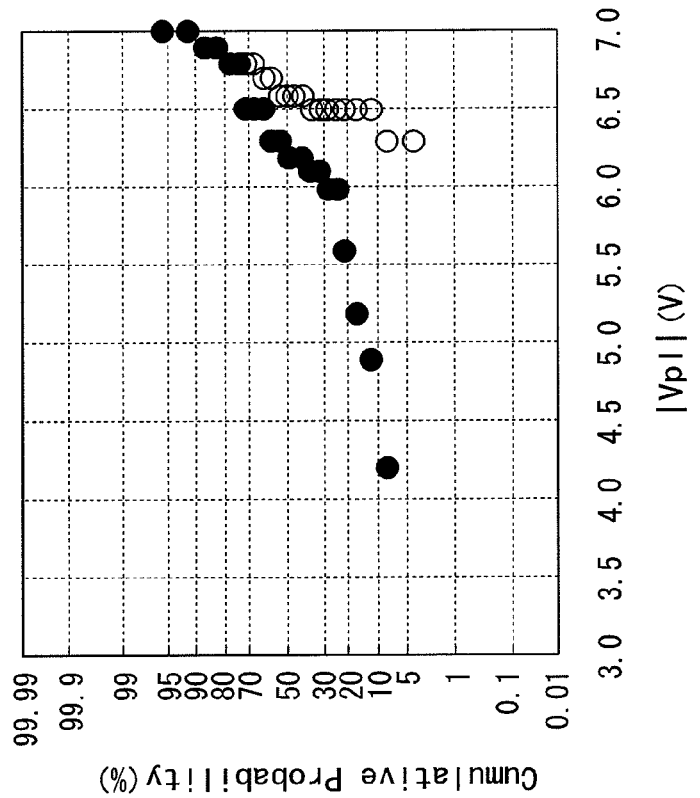
FIG. 16A is a diagram showing measured time zero dielectric breakdown characteristics of the capacitors of the first embodiment of the present invention and the comparative example.

FIG. 16A is a diagram showing measured time zero dielectric breakdown characteristics of the capacitors of the first embodiment of the present invention and the comparative example. 10 k-bits array test element groups of the capacitors were used to measure time zero dielectric breakdown characteristic of the capacitor. The bottom electrode is fixed at 0V, while the top electrode is applied with a variable voltage that is swept from 0V to −10V. In FIG. 16A, the vertical axis represents the cumulative probability (%), while the horizontal axis represents the absolute value of the breakdown voltage. ○ represents distributions of measured breakdown voltages of the capacitors of the first embodiment of the present invention. ● represents distributions of measured breakdown voltages of the capacitors of the comparative example. The breakdown voltages of the capacitors are measured at 90° C.

Some of the capacitors of the comparative example have smaller absolute values of the breakdown voltages than 6V. Such capacitors with smaller absolute values of the breakdown voltages than 6V may be regarded as defective capacitors. In contrast, all of the capacitors of the first embodiment of the present invention have larger absolute values of the breakdown voltages than 6V. All of the capacitors of the first embodiment of the present invention may be regarded as non-defective capacitors.

With reference back to FIG. 15, the capacitor of the comparative example has the void-containing interface between the titanium nitride bottom electrode 51 and the silicon nitride inter-layer insulator 32. With reference further back to FIG. 14, the capacitor of the first embodiment of the present invention has a void-free interface between the titanium nitride bottom electrode 51 and the silicon nitride inter-layer insulator 32. The capacitor of the comparative example having the void-containing interface between the titanium nitride bottom electrode 51 and the silicon nitride inter-layer insulator 32 have poor time zero dielectric breakdown characteristics. The capacitor of the first embodiment of the present invention having the void-free interface between the titanium nitride bottom electrode 51 and the silicon nitride inter-layer insulator 32 have desired time zero dielectric breakdown characteristics.

FIG. 16B is a diagram showing measured time zero dielectric breakdown characteristics of the capacitors of the first embodiment of the present invention and the comparative example. 10 k-bits array test element groups of the capacitors were used to measure time zero dielectric breakdown characteristic of the capacitor. The bottom electrode is fixed at 0V, while the top electrode is applied with a variable voltage that is swept from 0V to 10V. In FIG. 16B, the vertical axis represents the cumulative probability (%), while the horizontal axis represents the absolute value of the breakdown voltage. ○ represents distributions of measured breakdown voltages of the capacitors of the first embodiment of the present invention. ● represents distributions of measured breakdown voltages of the capacitors of the comparative example. The breakdown voltages of the capacitors are measured at 90° C.

Some of the capacitors of the comparative example have smaller absolute values of the breakdown voltages than 4.5V. Such capacitors with smaller absolute values of the breakdown voltages than 4.5V may be regarded as defective capacitors. In contrast, all of the capacitors of the first embodiment of the present invention have larger absolute values of the breakdown voltages than 5.5V. All of the capacitors of the first embodiment of the present invention may be regarded as non-defective capacitors.

With reference back to FIG. 15, the capacitor of the comparative example has the void-containing interface between the titanium nitride bottom electrode 51 and the silicon nitride inter-layer insulator 32. With reference further back to FIG. 14, the capacitor of the first embodiment of the present invention has a void-free interface between the titanium nitride bottom electrode 51 and the silicon nitride inter-layer insulator 32. The capacitor of the comparative example having the void-containing interface between the titanium nitride bottom electrode 51 and the silicon nitride inter-layer insulator 32 have poor time zero dielectric breakdown characteristics. The capacitor of the first embodiment of the present invention having the void-free interface between the titanium nitride bottom electrode 51 and the silicon nitride inter-layer insulator 32 have desired time zero dielectric breakdown characteristics.

Capacitors of advanced DRAMs are likely to have high aspect ratio of the height to the horizontal dimension due to high density integration and scaling down of the capacitors. This means that the capacitor hole 96 has to have high aspect ratio of the depth to the horizontal dimension.

The silicon nitride third inter-layer insulator 32 performs not only as the inter-layer insulator but also as the etching stopper in the etching process for etching the silicon oxide fourth inter-layer insulator 23. The depth of the capacitor hole 96 is defined by the thickness of the silicon oxide fourth inter-layer insulator 23. If the depth of the capacitor hole 96 is deep, this means that the thickness of the silicon oxide fourth inter-layer insulator 23 is thick. If the thickness of the silicon oxide fourth inter-layer insulator 23 is increased, then the thickness of the silicon nitride third inter-layer insulator 32 needs to be also increased. Namely, if the depth of the capacitor hole 96 is increased, then this needs that the thickness of the silicon nitride third inter-layer insulator 32 is increased. As demonstrated above, the titanium nitride bottom electrode film 51 has weak adhesiveness to the silicon nitride third inter-layer insulator 32. The increase in the thickness of the silicon nitride third inter-layer insulator 32 weakens adhesiveness between the titanium nitride bottom electrode film 51 and the silicon nitride third inter-layer insulator 32. The titanium oxide (TiO) adhesive layer 81a in combination with the silicon oxynitride films (SiON films) 82 provide enhanced adhesiveness between the titanium nitride bottom electrode film 51 and the silicon nitride (SiN) third inter-layer insulator 32.

(4) Modifications:

In accordance with the first embodiment of the present invention, the capacitive insulating film 52 of the capacitor 54 is realized by the aluminum oxide film. It is possible as modifications that the capacitive insulating film 52 of the capacitor 54 can be realized by a hafnium oxide film, a tantalum oxide film, or a zirconium oxide film, or a stack of those films.

In accordance with the first embodiment of the present invention, the polysilicon plugs 12 provide electrical connections between the bottom electrode 51 of the capacitor 54 and the polysilicon plugs 11 which are connected to the diffusion layers 5 of the memory cell switching transistors. The plugs 12 providing electrical connections between the bottom electrode 51 and the polysilicon plugs 11 can also be realized by other metal plugs, for example, a titanium nitride film or a stack of a titanium nitride film and a tungsten film.

In accordance with the first embodiment of the present invention, the bottom electrode 51 is realized by a titanium nitride film. The bottom electrode 51 can also be realized by other conductive materials.

In accordance with the first embodiment of the present invention, the adhesive layers 81 and 81a are realized by a titanium oxide (TiO) film, and the intermediate adhesive layer 82 is realized by a silicon oxynitride (SiON) film. The side portions of the third inter-layer insulator 32 of silicon nitride are subjected to an oxidation process so that the side portions of silicon nitride are modified into silicon oxynitride films (SiON films) 82. The adhesive layers 81 and 81a and the intermediate adhesive layer 82 can also be realized by other materials which provide adhesiveness between the bottom electrode 51 and the third inter-layer insulator 32.

Second Embodiment

The second embodiment provides a semiconductor memory device including a metal-insulator-metal capacitor and a method of forming the same. The descriptions of the second embodiment will be made with reference to FIGS. 17-22.

Figure 17:
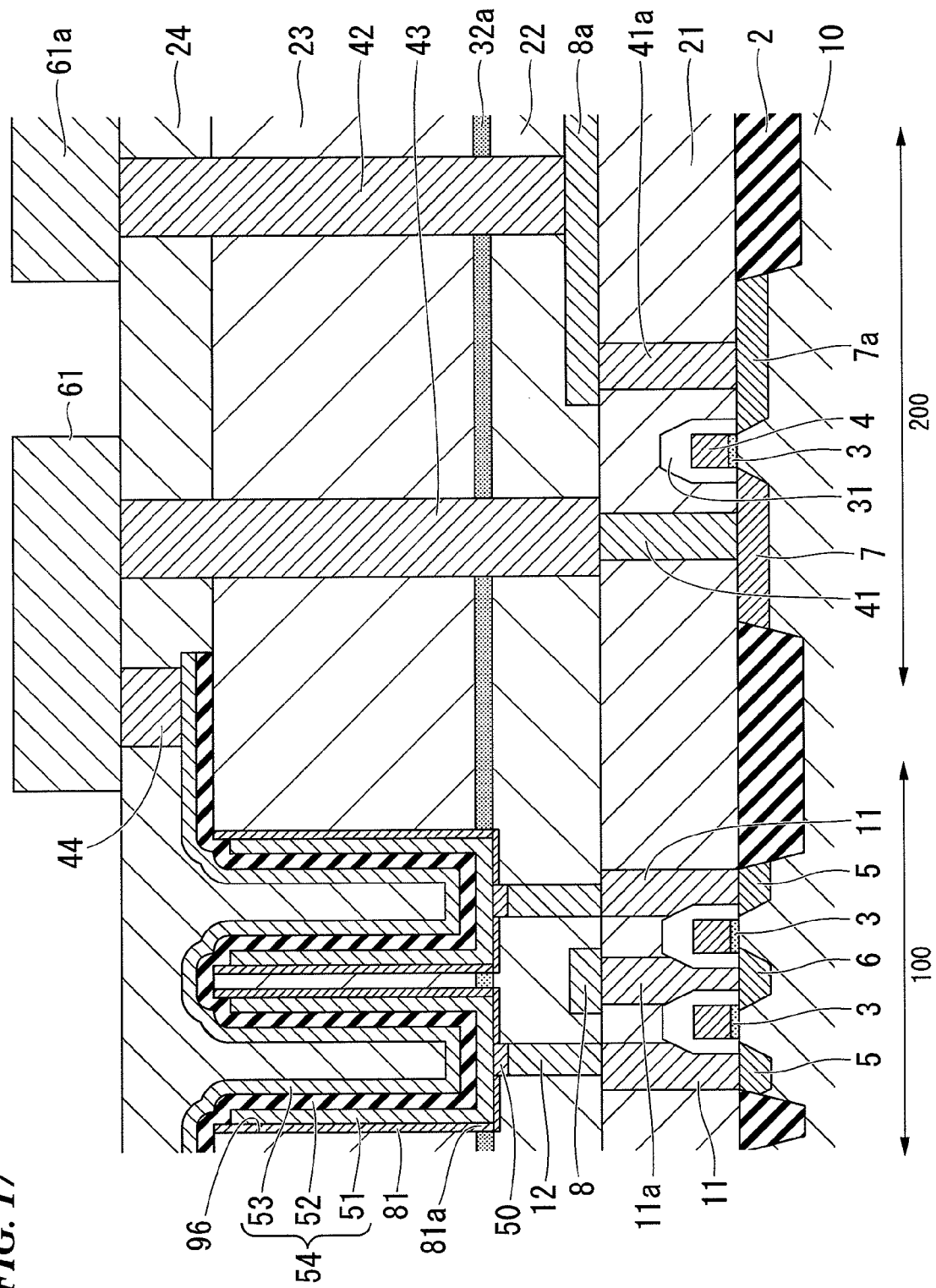
FIG. 17 is a fragmentary cross sectional elevation view illustrating a semiconductor memory device in accordance with a second preferred embodiment of the present invention.
Figure 18:
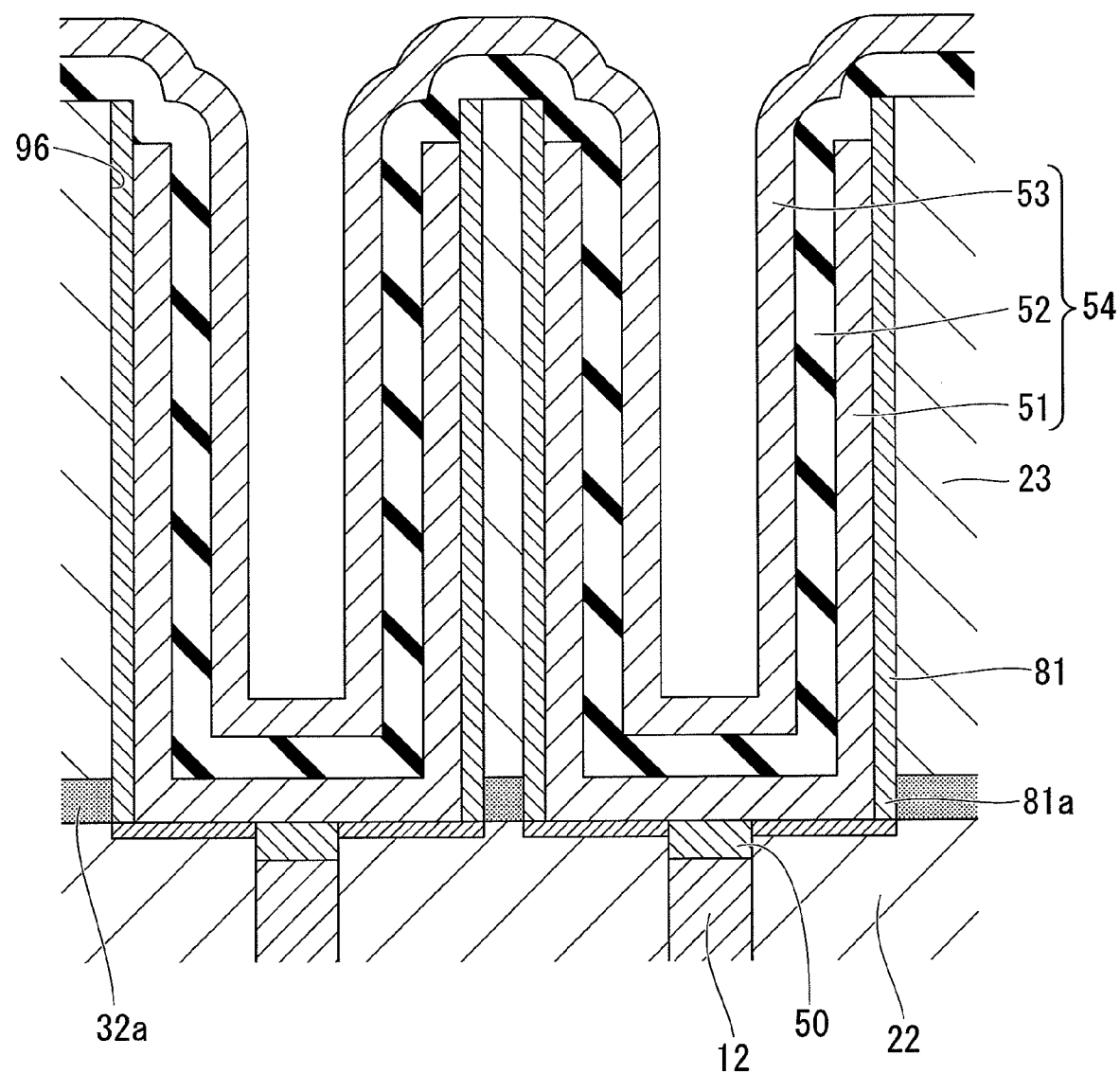
FIG. 18 is a fragmentary enlarged cross sectional view illustrating a capacitor structure included in a memory cell in the semiconductor device of FIG. 17.

(1) Semiconductor Memory Device and Capacitor Structure:

FIG. 17 is a fragmentary cross sectional elevation view illustrating a semiconductor memory device in accordance with a second preferred embodiment of the present invention. FIG. 18 is a fragmentary enlarged cross sectional view illustrating a capacitor structure included in a memory cell in the semiconductor device of FIG. 17.

Similarly to the first embodiment, the semiconductor memory device of the second embodiment includes the memory cell area 100 and the peripheral circuit area 200, which are adjacent to each other. The memory cell area 100 has the memory cell which includes the memory cell transistors and the capacitor 54. The peripheral circuit area 200 has the peripheral circuit.

The following descriptions will focus on the differences of the second embodiment from the first embodiment.

In accordance with the first embodiment of the present invention, the third inter-layer insulator 32 of silicon nitride is provided over the second inter-layer insulator 22 of silicon oxide and the fourth inter-layer insulator 23 of silicon oxide. The capacitor hole 96 is formed in the stack of the fourth inter-layer insulator 23 of silicon oxide and the silicon nitride third inter-layer insulator 32. The silicon nitride third inter-layer insulator 32 performs as the etching stopper in the etching process for forming the capacitor hole 96. The silicon oxynitride film 82 and the titanium oxide adhesive layer 81a are interposed between the titanium nitride bottom electrode film 51 and the silicon nitride third inter-layer insulator 32. The silicon oxynitride film 82 in combination with the titanium oxide adhesive layer 81a provide enhanced adhesiveness between the titanium nitride bottom electrode film 51 and the silicon nitride third inter-layer insulator 32.

In accordance with the second embodiment of the present invention, a third inter-layer insulator 32a of silicon oxynitride film is provided over the second inter-layer insulator 22 of silicon oxide and the fourth inter-layer insulator 23 of silicon oxide. The capacitor hole 96 is formed in the stack of the fourth inter-layer insulator 23 of silicon oxide and the silicon oxynitride third inter-layer insulator 32a. The silicon oxynitride third inter-layer insulator 32a performs as an etching stopper in the etching process for forming the capacitor hole 96. The titanium oxide adhesive layer 81a is interposed between the titanium nitride bottom electrode film 51 and the silicon nitride third inter-layer insulator 32. The silicon oxynitride film 82 of the first embodiment is absent in the second embodiment. Titanium oxide (TiO) has adhesiveness to silicon oxynitride (SiON) and also to titanium nitride (TiN). In other words, the titanium oxide adhesive layer 81a has adhesiveness to the titanium nitride bottom electrode film 51 and also to the silicon nitride third inter-layer insulator 32. Thus, the titanium oxide adhesive layer 81a provide enhanced adhesiveness between the titanium nitride bottom electrode film 51 and the silicon nitride third inter-layer insulator 32. There is no process for forming the silicon oxynitride film 82.

(2) Method of Forming Semiconductor Memory Device and Capacitor:

A method of forming the semiconductor memory device of FIG. 17 including the memory cell capacitor of FIG. 18 will be described. FIGS. 19 through 22 are fragmentary cross sectional elevation views illustrating semiconductor memory devices in sequential steps involved in a method of forming the semiconductor memory device of FIGS. 17 and 18 in accordance with the second embodiment of the present invention.

With reference back to FIG. 3, a silicon substrate 10 with a main face is prepared. An isolating film 2 such as a local oxidation of silicon film is formed on the main face of the silicon substrate 10 so that the isolating film 2 defines first and second active regions of the silicon substrate 10 in the memory cell area 100 and the peripheral circuit area 200 shown in FIG. 1. The first and second active regions are surrounded by the isolating film 2. First and second gate structures are formed on the first active region, while a third gate structure is formed on the second active region. Each of the gate structure includes a gate insulating film 3, a gate electrode 4, and an insulating film 31. The processes for forming the first to third gate structures may be the known processes. Diffusion layers 5 and 6 that perform as source and drain regions are formed in the first active region, while diffusion layers 7 and 7a that perform as source and drain regions are formed in the second active region. The processes for forming the diffusion layers 5, 6, 7 and 7a may be the known processes. As a result, a pair of memory cell transistors is formed in the first active region, while a peripheral circuit transistor is formed in the second active region.

A first inter-layer insulator 21 is formed over the memory cell area 100 and the peripheral circuit area 200. Namely, the first inter-layer insulator 21 is formed over the first and second active regions and the isolation film 2. The first inter-layer insulator 21 embeds the memory cell transistors and the peripheral circuit transistor.

In the memory cell area 100, first to third contact holes are formed in the first inter-layer insulator 21, so that the first contact hole communicates with the diffusion layer 6, and the second and third contact holes communicate with the diffusion layers 5. In the peripheral circuit area 200, fourth and fifth contact holes are formed in the first inter-layer insulator 21, so that the fourth and fifth contact holes communicate with the diffusion layers 7 and 7a. Deposition of a polysilicon film and subsequent etch-back process is carried out. A polysilicon plug 11a is formed in the first contact hole, while polysilicon plugs 11 are formed in the second and third contact holes. The polysilicon plug 11a contacts with the diffusion layer 6. The polysilicon plugs 11 contact with the diffusion layers 5. Further, deposition of a metal film and subsequent etch-back process is carried out. Metal plugs 41 and 41a are formed in the fourth and fifth contact holes. The metal plugs 41 and 41a contact with the diffusion layers 7 and 7a.

A bit-line 8 and a first-level interconnection 8a are formed on the first inter-layer insulator 21 so that the bit-line 8 contacts with the top of the polysilicon plug 11a and the first-level interconnection 8a contacts with the metal plug 41a. The bit-line 8 is electrically connected through the polysilicon plug 11a to the diffusion layer 6. The first-level interconnection 8a is electrically connected through the metal plug 41a to the diffusion layer 7a. The bit-line 8 and the first-level interconnection 8a may be realized by a tungsten film.

Over the memory cell area 100 and the peripheral circuit area 200, a second inter-layer insulator 22 is formed over the first inter-layer insulator 21, the polysilicon plugs 11 and 11a, and the metal plugs 41 and 41a, as well as over the bit line 8 and the first-level interconnection 8a. The second inter-layer insulator 22 embeds the bit line 8 and the first-level interconnection 8a. The second inter-layer insulator 22 can be realized by a silicon oxide film.

In the memory cell area 100, first and second through holes are formed in the second inter-layer insulator 22 so that the first and second through holes communicate with the polysilicon plugs 11. Deposition of a polysilicon film and subsequent etch-back process is carried out so that polysilicon plugs 12 are formed in the first and second through holes of the second inter-layer insulator 22. The polysilicon plugs 12 contact with the polysilicon plugs 11 which further contact with the diffusion layers 5. Thus, the polysilicon plugs 12 are eclectically connected through the polysilicon plugs 11 to the diffusion layers 5 of the memory cell transistors.

Figure 19:
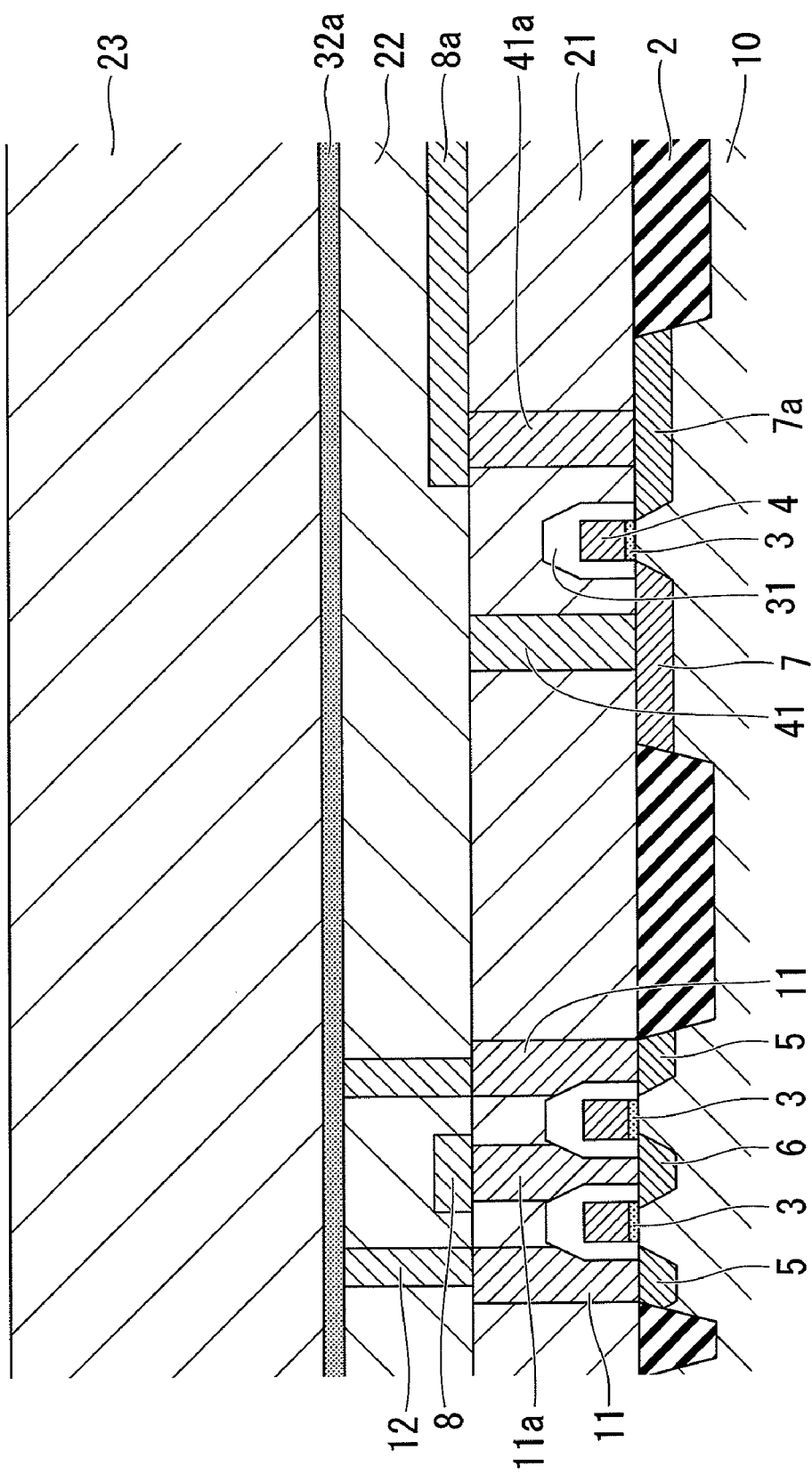
FIG. 19 is a fragmentary cross sectional elevation view illustrating a semiconductor memory device in a sequential step involved in a method of forming the semiconductor memory device of FIGS. 17 and 18 in accordance with the second embodiment of the present invention.

With reference to FIG. 19, over the memory cell area 100 and the peripheral circuit area 200, a third inter-layer insulator 32a is formed on the second inter-layer insulator 22 and on the titanium silicide films 50. The third inter-layer insulator 32a can be realized by a silicon oxynitride film. The silicon oxynitride third inter-layer insulator 32a can be formed at 400° C. under 400 Pa by using, as source gases, a monosilane gas ($SiH_4$), an ammonium gas ($NH_3$), a dinitrogen monoxide gas ($N_2O$), and a nitrogen gas ($N_2$). Further, a fourth inter-layer insulator 23 is formed on the third inter-layer insulator 32. The fourth inter-layer insulator 23 can be realized by a silicon oxide film. The thickness of the fourth inter-layer insulator 23 may typically be, but is not limited to, 3 micrometers.

Figure 20:
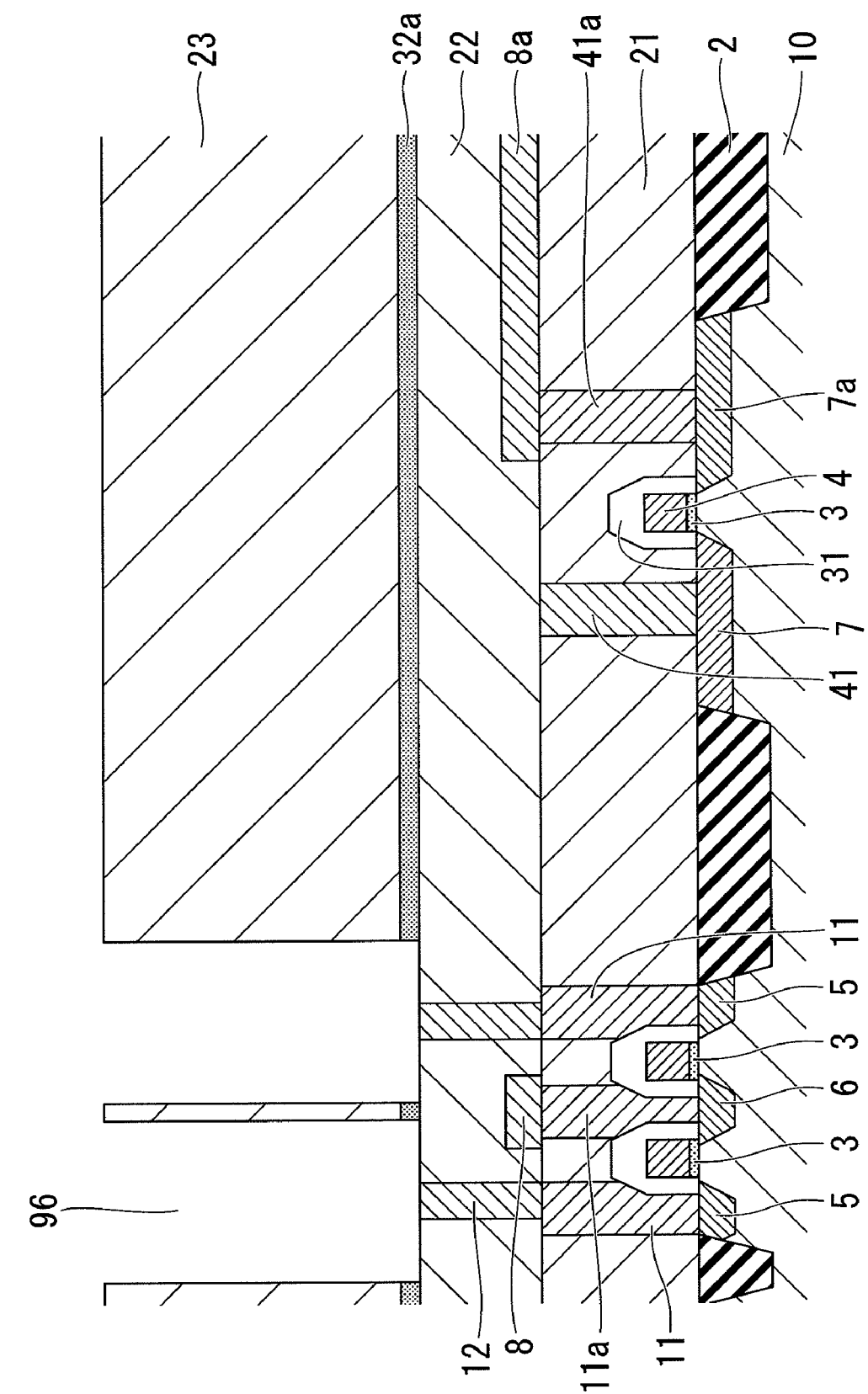
FIG. 20 is a fragmentary cross sectional elevation view illustrating a semiconductor memory device in a sequential step, after the step of FIG. 19, involved in a method of forming the semiconductor memory device of FIGS. 17 and 18 in accordance with the second embodiment of the present invention.

With reference to FIG. 20, in the memory cell area 100, a capacitor hole 96 is formed in the stack of the third and fourth inter-layer insulators 32a and 23. The capacitor hole 96 may be modified-cylinder-shaped. In plan view, the capacitor hole 96 has a torus shape. The capacitor hole 96 penetrates the stack of the third and fourth inter-layer insulators 32a and 23. The capacitor hole 96 communicates with the polysilicon plugs 12 in the first and second through holes. The tops of the polysilicon plugs 12 are shown through the modified-cylinder-shaped capacitor hole 96. The third inter-layer insulator 32a has side portions that are shown through the modified-cylinder-shaped capacitor hole 96.

The capacitor hole 96 is formed by a dry etching process using a photo-resist film. The third inter-layer insulator 32a of silicon oxynitride is different or lower in etching rate than the fourth inter-layer insulator 23 of silicon oxide. Whereas the capacitor hole 96 can be formed by a single known dry etching process, it is not easy to ensure the in-plane uniformity of the depth of the capacitor hole 96 if using the single etching process as well as ensure the depth uniformity over different wafers. It can be preferable, but is not essential, to carry out two dry etching processes in order to form the capacitor hole 96 in the stack of the third and fourth inter-layer insulators 32a and 23. For example, a first dry etching process is carried out to selectively etch the fourth inter-layer insulator 23, while the third inter-layer insulator 32a performing as an etching stopper. Then, a second dry etching process is carried out to selectively etch the third inter-layer insulator 32a, while the second inter-layer insulator 22 performing as another etching stopper. The combination of the first and second dry etching processes can improve the in-plane uniformity of the depth of the capacitor hole 96 and the depth uniformity over different wafers.

Figure 21:
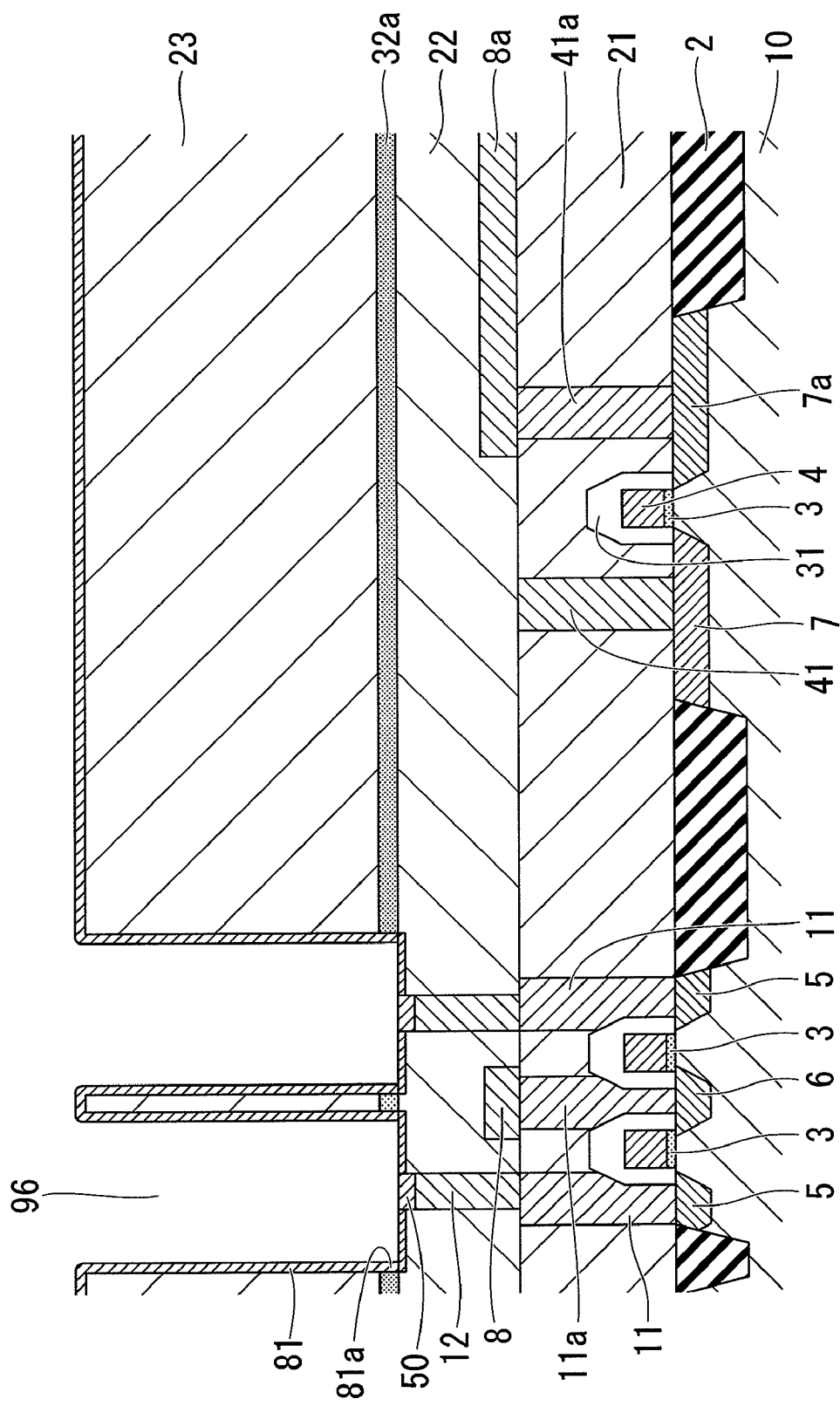
FIG. 21 is a fragmentary cross sectional elevation view illustrating a semiconductor memory device in a sequential step, after the step of FIG. 20, involved in a method of forming the semiconductor memory device of FIGS. 17 and 18 in accordance with the second embodiment of the present invention.

With reference to FIG. 21, the side portions of the third inter-layer insulator 32 and the top surfaces of the polysilicon plugs 12 are exposed to an atmosphere in the capacitor hole 96. A chemical vapor deposition process is carried out to form adhesive layers 81 and 81a of titanium oxide (TiO). The titanium oxide adhesive layer 81 is deposited on the surfaces of the second and fourth inter-layer insulators 22 and 23 of silicon oxide. The titanium oxide adhesive layer 81a is deposited on the silicon oxynitride third inter-layer insulator (SiON) 32. In some cases, the chemical vapor deposition process can be carried out at 650° C. in a titanium tetrachloride ($TiCl_4$) gas. The chemical vapor deposition process causes a reaction between titanium of titanium tetrachloride ($TiCl_4$) and silicon oxide of the second and fourth inter-layer insulators 22 and 23, thereby forming the titanium oxide adhesive layer 81 on the surfaces of the second and fourth inter-layer insulators 22 and 23. The chemical vapor deposition process also causes another reaction between titanium of titanium tetrachloride ($TiCl_4$) and silicon oxynitride of the silicon oxynitride third inter-layer insulator (SiON) 32, thereby forming the titanium oxide adhesive layer 81a on the silicon oxynitride third inter-layer insulator (SiON) 32.

The top surfaces of the polysilicon plugs 12 are also exposed to the titanium tetrachloride ($TiCl_4$) atmosphere in the capacitor hole 96. Thus, the chemical vapor deposition process also causes a silicidation reaction between titanium of titanium tetrachloride ($TiCl_4$) and polysilicon of the polysilicon plugs 12, thereby forming titanium silicide films 50 on the top surfaces of the polysilicon plugs 12. Namely, the side and bottom walls of the capacitor hole 96 are covered by the titanium oxide adhesive layers 81 and 81a and the titanium silicide films 50.

The titanium oxide adhesive layer 81a is adjacent to the silicon oxynitride third inter-layer insulator (SiON) 32a. Silicon oxynitride (SiON) has adhesiveness to titanium oxide (TiO). Thus, the titanium oxide (TiO) adhesive layer 81a has adhesiveness to the silicon oxynitride third inter-layer insulator (SiON) 32a.

Figure 22:
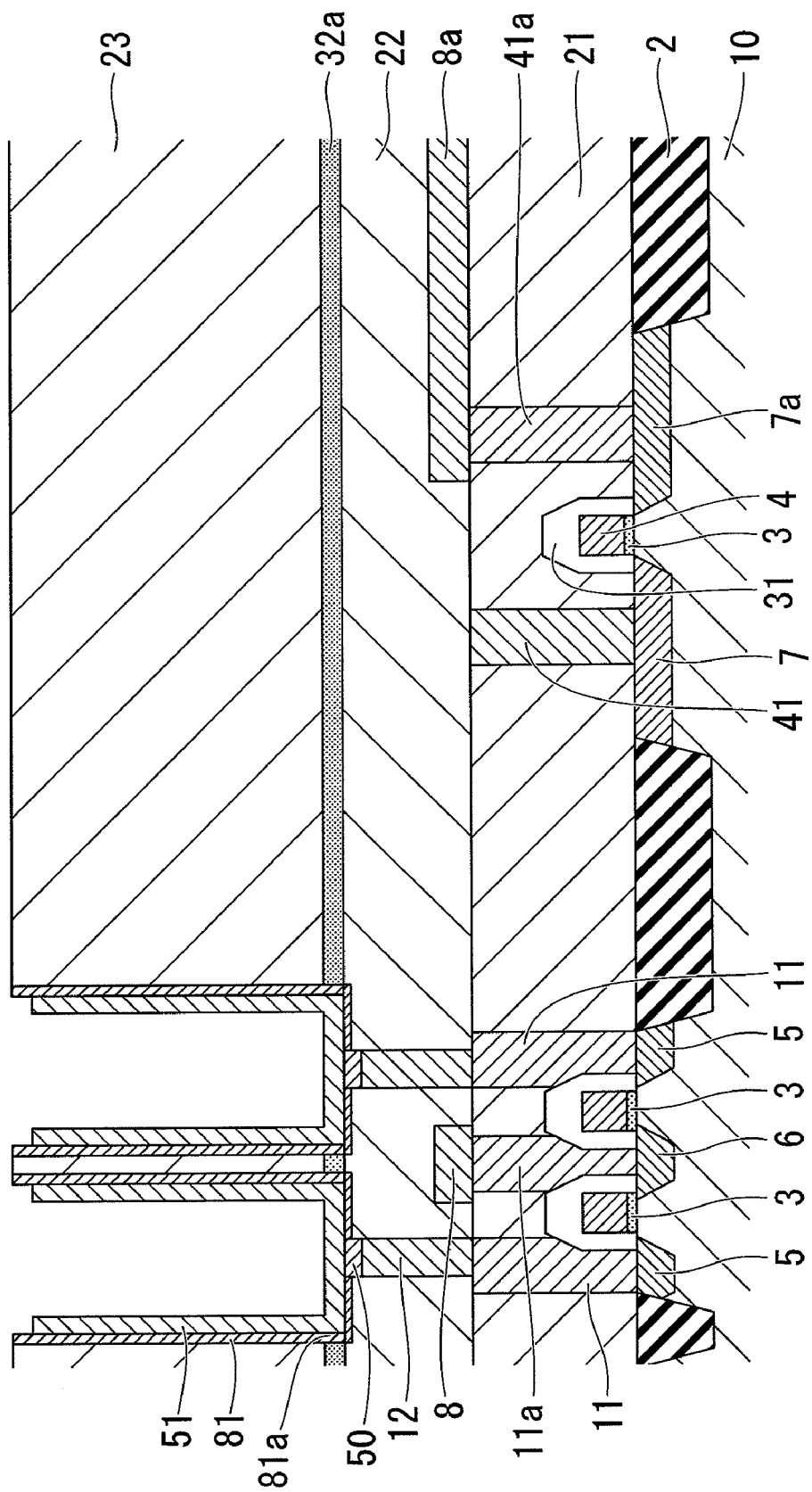
FIG. 22 is a fragmentary cross sectional elevation view illustrating a semiconductor memory device in a sequential step, after the step of FIG. 21, involved in a method of forming the semiconductor memory device of FIGS. 17 and 18 in accordance with the second embodiment of the present invention.

With reference to FIG. 22, a chemical vapor deposition process is carried out to form a titanium nitride bottom electrode film 51 on the titanium oxide (TiO) adhesive layers 81 and 81a and the titanium silicide films 50. The thickness of the titanium nitride bottom electrode film 51 may typically be, but is not limited to, 10 nanometers. The titanium nitride bottom electrode film 51 is adhered via the titanium oxide (TiO) adhesive layer 81 to the silicon oxide fourth inter-layer insulator 23. Further, the titanium nitride bottom electrode film 51 is adhered via the titanium oxide (TiO) adhesive layer 81a to the silicon oxynitride third inter-layer insulator (SiON) 32a. In other words, the titanium oxide (TiO) adhesive layer 81 provides adhesiveness between the titanium nitride bottom electrode film 51 and the silicon oxide fourth inter-layer insulator 23. The titanium oxide (TiO) adhesive layer 81a provides adhesiveness between the titanium nitride bottom electrode film 51 and the silicon oxynitride third inter-layer insulator (SiON) 32a. Thus, the titanium oxide (TiO) adhesive layer 81a provides enhanced adhesiveness between the titanium nitride bottom electrode film 51 and the silicon oxynitride third inter-layer insulator (SiON) 32a.

A photo-resist film is selectively formed in the capacitor hole 96. The stack of the titanium nitride bottom electrode film 51 and the titanium oxide (TiO) adhesive layer 81 has a first portion which is present in the capacitor hole 96, and a second portion which is present over the fourth inter-layer insulator 23 of silicon oxide. The first portion of the stack of the titanium nitride bottom electrode film 51 and the titanium oxide (TiO) adhesive layer 81 is covered by the photo-resist film, while the second portion of the stack is not covered by the photo-resist film.

An etch-back process is carried out to remove the first portion of the stack of the titanium nitride bottom electrode film 51 and the titanium oxide (TiO) adhesive layer 81 as well as remove an upper portion of the photo-resist film in the capacitor hole 96. Namely, the etch-back process is carried out to leave the second portion of the stack of the titanium nitride bottom electrode film 51 and the titanium oxide (TiO) adhesive layers 81 and 81a as well as a lower portion of the photo-resist film in the capacitor hole 96. As a result of the etch-back process, the upper surface of the fourth inter-layer insulator 23 is shown, while the side and bottom walls of the capacitor hole 96 remain covered by the remaining portion of the stack of the titanium nitride bottom electrode film 51 and the titanium oxide (TiO) adhesive layers 81 and 81a.

The remaining photo-resist film is removed from the capacitor hole 96. In some cases, the removal of the remaining photo-resist film can be made by using an organic release agent, thereby completing the titanium nitride bottom electrode 51 of the modified-cylinder-shape.

With reference back to FIG. 17, an aluminum oxide capacitive insulating film 52 is formed on the titanium nitride bottom electrode 51 and on the upper surface of the fourth inter-layer insulator 23 of silicon oxide. The aluminum oxide capacitive insulating film 52 can be formed by using an atomic layer deposition process. The thickness of the aluminum oxide capacitive insulating film 52 can typically be, but is not limited to, 6 nanometers. A titanium nitride top electrode 53 is formed on the aluminum oxide capacitive insulating film 52. The titanium nitride top electrode 53 can be formed by using a chemical vapor deposition process. The thickness of the titanium nitride top electrode 53 can typically be, but is not limited to, 15 nanometers.

The stack of the aluminum oxide capacitive insulating film 52 and the titanium nitride top electrode 53 is selectively removed so as to leave the stack in the capacitor hole 96 and over the adjacent portion of the upper surface of the fourth inter-layer insulator 23 of silicon oxide. The adjacent portion of the upper surface is adjacent to the capacitor hole 96. The stack of the aluminum oxide capacitive insulating film 52 and the titanium nitride top electrode 53 can be selectively removed by a photo-lithography technique and a dry etching technique. As a result, the capacitor 54 of modified-cylinder-shape is thus formed in the capacitor hole 96 of modified-cylinder-shape. The height of the capacitor 54 may typically be, but is not limited to, 3 micrometers.

Over the memory cell area 100 and the peripheral circuit area 200, a silicon oxide fifth inter-layer insulator 24 is formed on the top electrode 53 of the capacitor 54 and on the fourth inter-layer insulator 24. In the peripheral circuit area 200, third and fourth through holes are formed in the stack of the second, third, fourth and fifth inter-layers 22, 32, 23, and 24. The third through hole communicates with the top of the metal plug 41. The fourth through hole communicates with the top surface of the first-level interconnection 8a. On the boundary between the memory cell area 100 and the peripheral circuit area 200, a fifth through hole is formed in the fifth inter-layer insulator 24. The fifth through hole communicates with the top electrode 53 of the capacitor 54.

A titanium nitride film is formed in the third, fourth and fifth through holes and on the upper surface of the silicon oxide fifth inter-layer insulator 24. Further, a tungsten film is formed on the titanium nitride film so as to fill the third, fourth and fifth through holes. A chemical mechanical polishing method is carried out to selectively remove the stack of the titanium nitride film and the tungsten film which extend over the upper surface of the silicon oxide fifth inter-layer insulator 24, while leaving the stack which fill the third, fourth and fifth through holes. As a result, first, second, and third metal plugs 42, 43, and 44 are formed in the third, fourth and fifth through holes. The first and second contact plugs 42 and 43 contact with the metal plug 41 and the first-level interconnection 8*a*. The first contact plug 43 is electrically connected through the metal plug 41 to the diffusion layer 7 of the peripheral circuit transistor. The second contact plug 44 is electrically connected through the first-level interconnection 8*a* and the metal plug 41*a* to the diffusion layer 7*a* of the peripheral circuit transistor. The third contact plug 44 contacts with the top electrode 53 of the capacitor 54.

A titanium film is deposited by a sputtering process on the upper surface of the silicon oxide fifth inter-layer insulator 24 and on the top surfaces of the first, second, and third metal plugs 42, 43, and 44. An aluminum film is deposited by a sputtering process on the titanium film. A titanium nitride film is deposited by a sputtering process on the aluminum film, thereby forming a stack of the titanium film, the aluminum film, and the titanium nitride film over the silicon oxide fifth inter-layer insulator 24. The stack of the titanium film, the aluminum film, and the titanium nitride film is then patterned by a lithography technique and a dry etching technique, thereby forming second-level interconnections 61 and 61*a*. The second-level interconnection 61 contacts with the second and third contact plugs 43 and 44. Namely, the second-level interconnection 61 electrically connects between the first and third contact plugs 43 and 44. The additional second-level interconnection 61*a* contacts with the first contact plug 42. As a result, the semiconductor memory device of FIG. 17 is completed.

In accordance with the second embodiment, there is carried out no oxidation process for oxidizing the side edge of the third inter-layer insulator 32*a*. There is no need to form the silicon oxynitride film (SiON film) 82 which is formed in the first embodiment. In the first embodiment, the titanium oxide (TiO) adhesive layer 81*a* in combination with the silicon oxynitride films (SiON films) 82 provide adhesiveness between the bottom electrode layer 51 and the third inter-layer insulator 32. In the second embodiment, the titanium oxide (TiO) adhesive layer 81*a* provides adhesiveness between the bottom electrode layer 51 and the third inter-layer insulator 32.

Third Embodiment

The third embodiment provides a semiconductor memory device including a metal-insulator-metal capacitor including a pedestal bottom electrode and a method of forming the same. The descriptions of the third embodiment will be made with reference to FIGS. 23-29.

Figure 23:
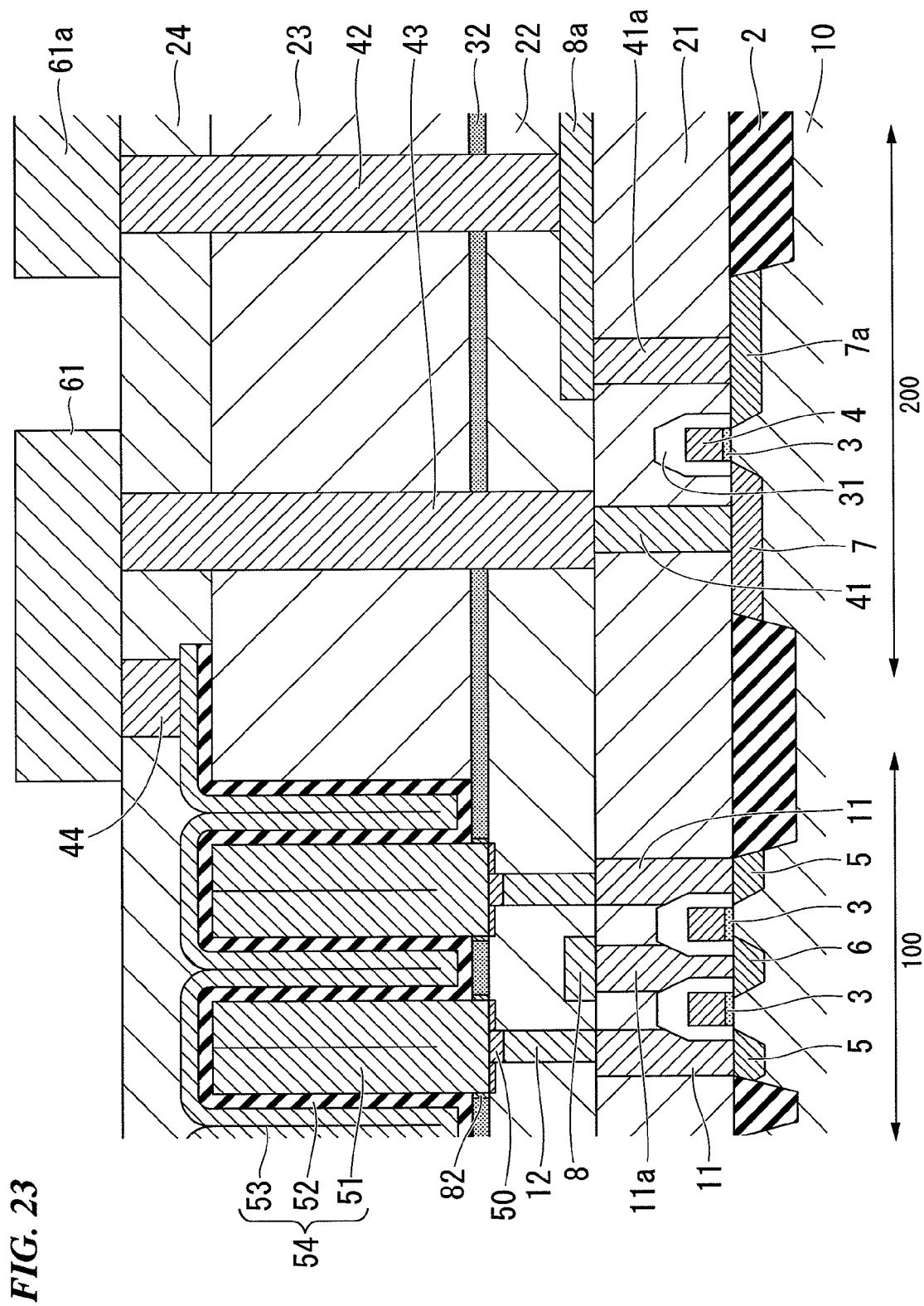
FIG. 23 is a fragmentary cross sectional elevation view illustrating a semiconductor memory device in accordance with a third preferred embodiment of the present invention.
Figure 24:
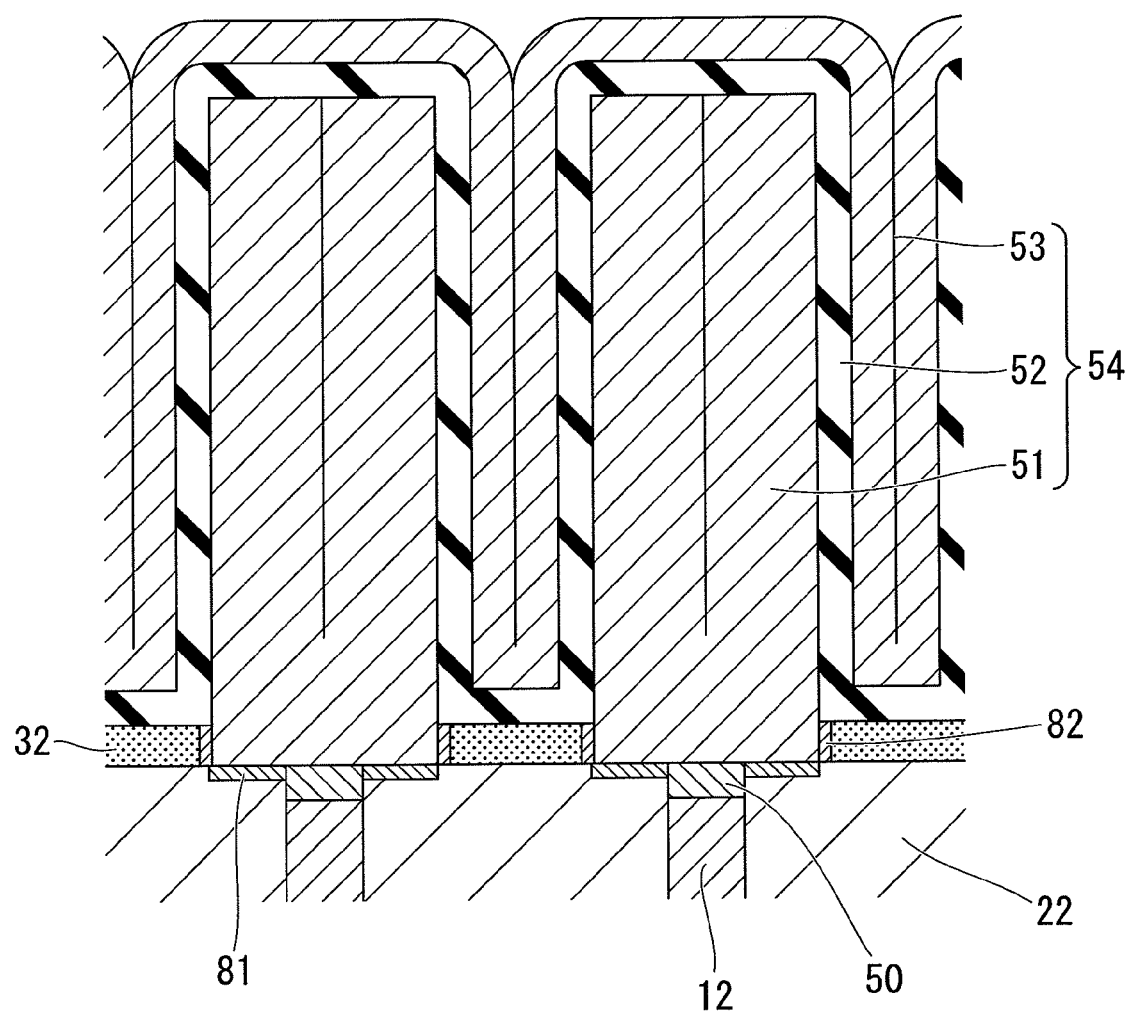
FIG. 24 is a fragmentary enlarged cross sectional view illustrating a capacitor structure with a pedestal bottom electrode which is included in a memory cell in the semiconductor device of FIG. 23.

(1) Semiconductor Memory Device and Capacitor Structure:

FIG. 23 is a fragmentary cross sectional elevation view illustrating a semiconductor memory device in accordance with a third preferred embodiment of the present invention. FIG. 24 is a fragmentary enlarged cross sectional view illustrating a capacitor structure with a pedestal bottom electrode which is included in a memory cell in the semiconductor device of FIG. 23.

Similarly to the first embodiment, the semiconductor memory device of the second embodiment includes the memory cell area 100 and the peripheral circuit area 200, which are adjacent to each other. The memory cell area 100 has the memory cell which includes the memory cell transistors and the capacitor 54. The peripheral circuit area 200 has the peripheral circuit.

The following descriptions will focus on the differences of the third embodiment from the first embodiment.

In accordance with the first embodiment of the present invention, the capacitor 54 has a three-layered structure which extends along the bottom and side walls of the capacitor hole 96, while the capacitor hole 96 is filled with the capacitor 54 and the fifth inter-layer insulator 24. The three layered structure includes the bottom electrode film 51, the capacitive insulating film 52, and the top layer 53.

In accordance with the third embodiment of the present invention, the capacitor 54 is disposed over the second inter-layer insulator 22. The capacitor 54 is disposed in a capacitor hole which is formed in the fourth inter-layer insulator 23. The capacitor hole has a cylindrical shape. The capacitor 54 includes a pedestal bottom electrode 51, a capacitive insulating film 52 and a top electrode film 53. The pedestal bottom electrode 51 may be modified-cylinder-shaped. In plan view, the pedestal bottom electrode 51 has a torus shape. The pedestal bottom electrode 51 is disposed over the titanium silicide films 50 and the adhesive layers 81. The titanium silicide films 50 are disposed on the tops of the polysilicon plugs 12. The adhesive layers 81 are disposed on adjacent portions of the top surface of the second inter-layer insulator 22, wherein the adjacent portions are adjacent to the top surface of the second inter-layer insulator 22. The pedestal bottom electrode 51 of modified-cylinder-shape is spatially separated by a cylinder-shaped gap from the side walls of the capacitor hole. The pedestal bottom electrode 51 of modified-cylinder-shape also has a cylinder-shaped center hollow.

Titanium oxide (TiO) adhesive layers 81 and 81*a* in combination with silicon oxynitride films 82 are interposed between the pedestal bottom electrode film 51 and the silicon nitride third inter-layer insulator 32. The titanium oxide (TiO) adhesive layers 81 and 81*a* in combination with the silicon oxynitride films 82 provide enhanced adhesiveness between the pedestal bottom electrode film 51 and the silicon nitride third inter-layer insulator 32.

The capacitive insulating film 52 is disposed on the surface of the pedestal bottom electrode 51 as well as on the bottom and side walls of the capacitor hole and over adjacent portions of the top surface of the fourth inter-layer insulator 23. The bottom wall of the capacitor hole is constituted by the silicon nitride third inter-layer insulator 32 and the silicon oxynitride films 82. The side wall of the capacitor hole is constituted by the side wall of the fourth inter-layer insulator 23. The capacitive insulating film 52 is thus present in the cylinder-shaped gap and also in the cylinder-shaped center hollow.

The top electrode film 53 is disposed on the capacitive insulating film 52 to form a stack of the capacitive insulating film 52 and the top electrode film 53. The stack of the capacitive insulating film 52 and the top electrode film 53 fill the cylinder-shaped gap and also in the cylinder-shaped center hollow.

(2) Method of Forming Semiconductor Memory Device and Capacitor:

A method of forming the semiconductor memory device of FIG. 23 including the memory cell capacitor of FIG. 24 will be described. FIGS. 25 through 29 are fragmentary cross sectional elevation views illustrating semiconductor memory devices in sequential steps involved in a method of forming the semiconductor memory device of FIGS. 23 and 24 in accordance with the third embodiment of the present invention.

Figure 25:
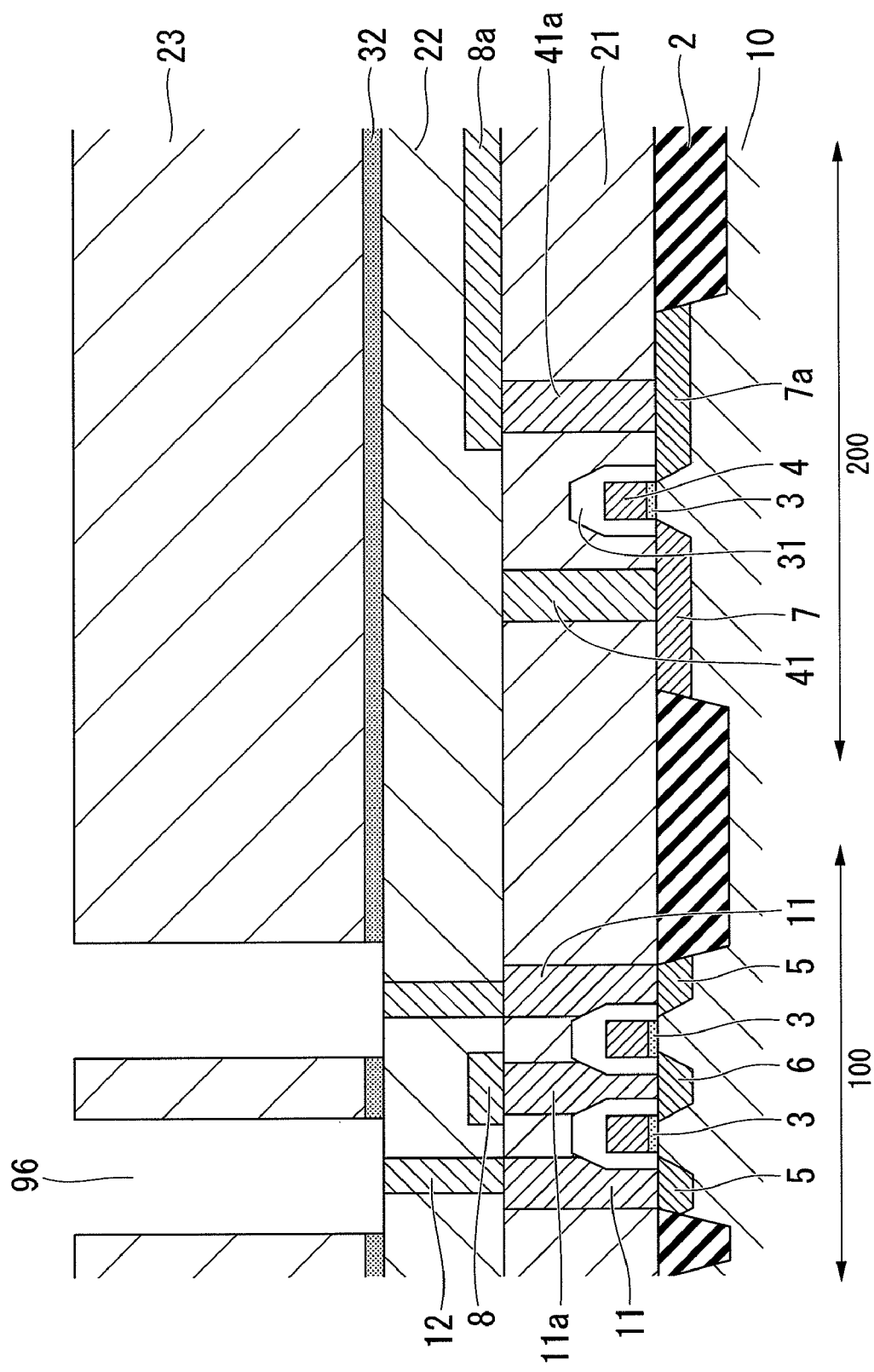
FIG. 25 is a fragmentary cross sectional elevation view illustrating a semiconductor memory device in a sequential step involved in a method of forming the semiconductor memory device of FIGS. 23 and 24 in accordance with the third embodiment of the present invention.

With reference to FIG. 25, a silicon substrate 10 with a main face is prepared. An isolating film 2 such as a local oxidation of silicon film is formed on the main face of the silicon substrate 10 so that the isolating film 2 defines first and second active regions of the silicon substrate 10 in the memory cell area 100 and the peripheral circuit area 200 shown in FIG. 23. The first and second active regions are surrounded by the isolating film 2. First and second gate structures are formed on the first active region, while a third gate structure is formed on the second active region. Each of the gate structure includes a gate insulating film 3, a gate electrode 4, and an insulating film 31. The processes for forming the first to third gate structures may be the known processes. Diffusion layers 5 and 6 that perform as source and drain regions are formed in the first active region, while diffusion layers 7 and 7a that perform as source and drain regions are formed in the second active region. The processes for forming the diffusion layers 5, 6, 7 and 7a may be the known processes. As a result, a pair of memory cell transistors is formed in the first active region, while a peripheral circuit transistor is formed in the second active region.

A first inter-layer insulator 21 is formed over the memory cell area 100 and the peripheral circuit area 200. Namely, the first inter-layer insulator 21 is formed over the first and second active regions and the isolation film 2. The first inter-layer insulator 21 embeds the memory cell transistors and the peripheral circuit transistor.

In the memory cell area 100, first to third contact holes are formed in the first inter-layer insulator 21, so that the first contact hole communicates with the diffusion layer 6, and the second and third contact holes communicate with the diffusion layers 5. In the peripheral circuit area 200, fourth and fifth contact holes are formed in the first inter-layer insulator 21, so that the fourth and fifth contact holes communicate with the diffusion layers 7 and 7a. Deposition of a polysilicon film and subsequent etch-back process is carried out. A polysilicon plug 11a is formed in the first contact hole, while polysilicon plugs 11 are formed in the second and third contact holes. The polysilicon plug 11a contacts with the diffusion layer 6. The polysilicon plugs 11 contact with the diffusion layers 5. Further, deposition of a metal film and subsequent etch-back process is carried out. Metal plugs 41 and 41a are formed in the fourth and fifth contact holes. The metal plugs 41 and 41a contact with the diffusion layers 7 and 7a.

A bit-line 8 and a first-level interconnection 8a are formed on the first inter-layer insulator 21 so that the bit-line 8 contacts with the top of the polysilicon plug 11a and the first-level interconnection 8a contacts with the metal plug 41a. The bit-line 8 is electrically connected through the polysilicon plug 11a to the diffusion layer 6. The first-level interconnection 8a is electrically connected through the metal plug 41a to the diffusion layer 7a. The bit-line 8 and the first-level interconnection 8a may be realized by a tungsten film.

Over the memory cell area 100 and the peripheral circuit area 200, a second inter-layer insulator 22 is formed over the first inter-layer insulator 21, the polysilicon plugs 11 and 11a, and the metal plugs 41 and 41a, as well as over the bit line 8 and the first-level interconnection 8a. The second inter-layer insulator 22 embeds the bit line 8 and the first-level interconnection 8a. The second inter-layer insulator 22 can be realized by a silicon oxide film.

In the memory cell area 100, first and second through holes are formed in the second inter-layer insulator 22 so that the first and second through holes communicate with the polysilicon plugs 11. Deposition of a polysilicon film and subsequent etch-back process is carried out so that polysilicon plugs 12 are formed in the first and second through holes of the second inter-layer insulator 22. The polysilicon plugs 12 contact with the polysilicon plugs 11 which further contact with the diffusion layers 5. Thus, the polysilicon plugs 12 are eclectically connected through the polysilicon plugs 11 to the diffusion layers 5 of the memory cell transistors.

Over the memory cell area 100 and the peripheral circuit area 200, a third inter-layer insulator 32 is formed on the second inter-layer insulator 22 and on the titanium silicide films 50. The third inter-layer insulator 32 can be realized by a silicon nitride film. Further, a fourth inter-layer insulator 23 is formed on the third inter-layer insulator 32. The fourth inter-layer insulator 23 can be realized by a silicon oxide film. The thickness of the fourth inter-layer insulator 23 may typically be, but is not limited to, 3 micrometers.

In the memory cell area 100, a capacitor hole 96 is formed in the stack of the third and fourth inter-layer insulators 32 and 23. The capacitor hole 96 may be modified-cylinder-shaped. In plan view, the capacitor hole 96 has a torus shape. The capacitor hole 96 penetrates the stack of the third and fourth inter-layer insulators 32 and 23. The capacitor hole 96 communicates with the polysilicon plugs 12 in the first and second through holes. The tops of the polysilicon plugs 12 are shown through the modified-cylinder-shaped capacitor hole 96. The third inter-layer insulator 32 has side portions that are shown through the modified-cylinder-shaped capacitor hole 96.

The capacitor hole 96 is formed by a dry etching process using a photo-resist film. The third inter-layer insulator 32 of silicon nitride is different or lower in etching rate than the fourth inter-layer insulator 23 of silicon oxide. Whereas the capacitor hole 96 can be formed by a single known dry etching process, it is not easy to ensure the in-plane uniformity of the depth of the capacitor hole 96 if using the single etching process as well as ensure the depth uniformity over different wafers. It can be preferable, but is not essential, to carry out two dry etching processes in order to form the capacitor hole 96 in the stack of the third and fourth inter-layer insulators 32 and 23. For example, a first dry etching process is carried out to selectively etch the fourth inter-layer insulator 23, while the third inter-layer insulator 32 performing as an etching stopper. Then, a second dry etching process is carried out to selectively etch the third inter-layer insulator 32, while the second inter-layer insulator 22 performing as another etching stopper. The combination of the first and second dry etching processes can improve the in-plane uniformity of the depth of the capacitor hole 96 and the depth uniformity over different wafers.

Figure 26:
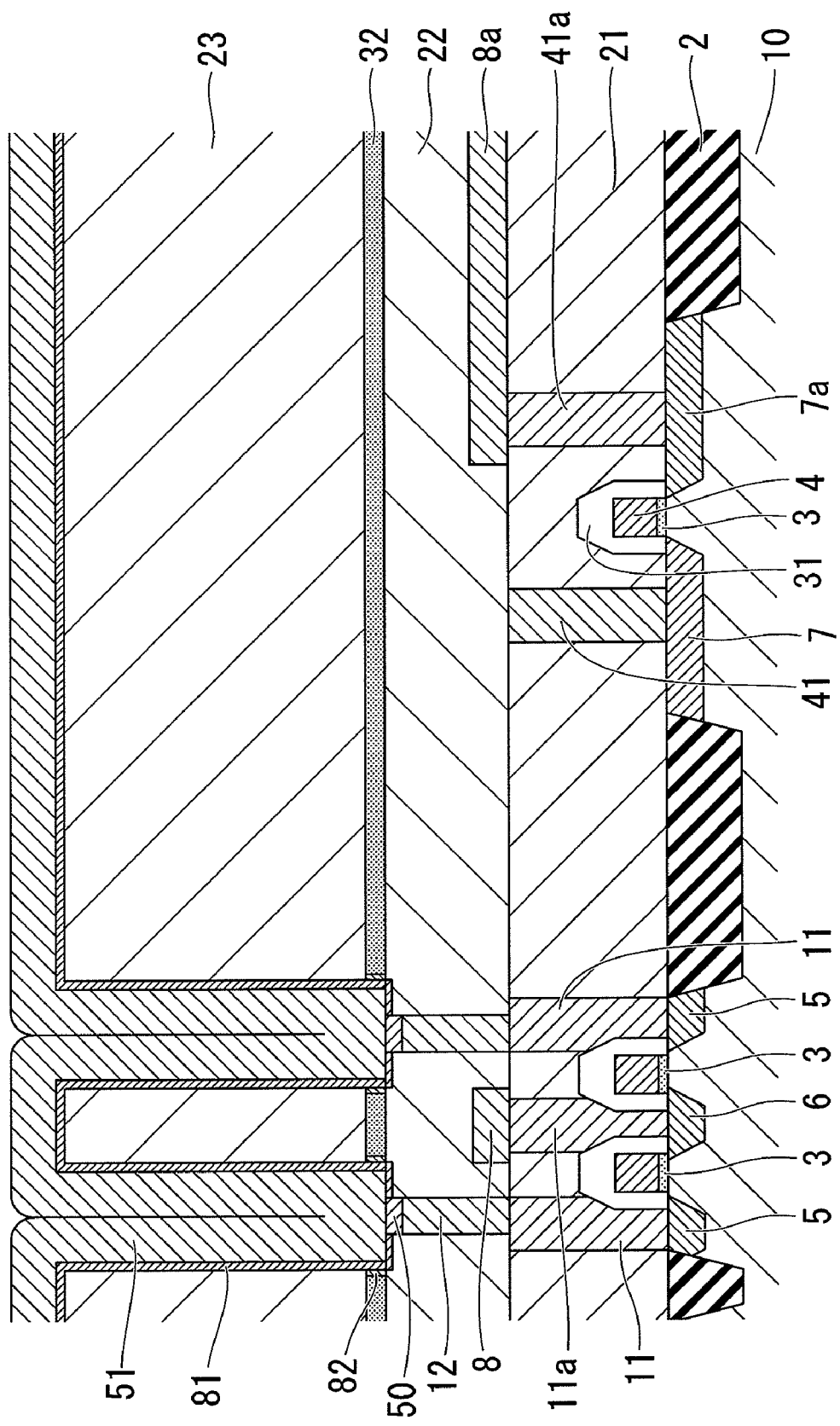
FIG. 26 is a fragmentary cross sectional elevation view illustrating a semiconductor memory device in a sequential step, after the step of FIG. 25, involved in a method of forming the semiconductor memory device of FIGS. 23 and 24 in accordance with the third embodiment of the present invention.

With reference to FIG. 26, the side portions of the third inter-layer insulator 32 and the top surfaces of the polysilicon plugs 12 are exposed to an atmosphere in the capacitor hole 96. The side portions of the third inter-layer insulator 32 of silicon nitride and the top surfaces of the polysilicon plugs 12 are then subjected to an oxidation process so that the side portions of silicon nitride are modified into silicon oxynitride films (SiON films) 82, while the polysilicon plugs 12 of polysilicon are modified into silicon oxide films 86. Namely, by the oxidation process, the silicon oxynitride films (SiON films) 82 are formed on the side edges of the third inter-layer insulator 32, while the silicon oxide films 86 are formed on the top surfaces of the polysilicon plugs 12.

In some cases, the oxidation process may be realized by a thermal oxidation process that is carried out at 700° C. for 10 minutes, thereby forming the silicon oxynitride film 82 having a thickness of approximately 1 nanometer. The thermal oxidation process can be carried out in either an oxygen atmosphere or a nitrogen atmosphere. When the thermal oxidation process is carried out in the oxygen atmosphere, the side portions of silicon nitride are oxidized by oxygen contained in the oxygen atmosphere. When the thermal oxidation process is carried out in the nitrogen atmosphere, the side portions of silicon nitride are oxidized by oxygen and/or water that have been eliminated from the second and fourth inter-layer insulators 22 and 23 of silicon oxide which are exposed to the nitrogen atmosphere in the capacitor hole 96.

In other cases, the oxidation process may also be realized by a plasma oxidation process, so that the side portions of silicon nitride are oxidized by oxygen that has been eliminated from the second and fourth inter-layer insulators 22 and 23 of silicon oxide which are exposed to the plasma atmosphere in the capacitor hole 96.

A wet cleaning process is carried out to remove the silicon oxide films 86 from the polysilicon plugs 12, while leaving the silicon oxynitride films (SiON films) 82 on the side edges of the third inter-layer insulator 32. The wet cleaning process can be realized by using a hydrogen fluoride solution that is diluted with ammonium water, namely BHF water, or a hydrogen fluoride solution that is diluted with water, namely DHF water. Use of BHF water or DHF water can remove the silicon oxide films 86 from the polysilicon plugs 12, while leaving the silicon oxynitride films (SiON films) 82 on the side edges of the third inter-layer insulator 32.

A chemical vapor deposition process is carried out to form adhesive layers 81 and 81a of titanium oxide (TiO). The titanium oxide adhesive layer 81 is deposited on the surfaces of the second and fourth inter-layer insulators 22 and 23 of silicon oxide. The titanium oxide adhesive layer 81a is deposited on the silicon oxynitride films (SiON films) 82 which is adjacent to the side edges of the third inter-layer insulator 32. In some cases, the chemical vapor deposition process can be carried out at 650° C. in a titanium tetrachloride (TiCl$_4$) gas. The chemical vapor deposition process causes a reaction between titanium of titanium tetrachloride (TiCl$_4$) and silicon oxide of the second and fourth inter-layer insulators 22 and 23, thereby forming the titanium oxide adhesive layer 81 on the surfaces of the second and fourth inter-layer insulators 22 and 23. The chemical vapor deposition process also causes another reaction between titanium of titanium tetrachloride (TiCl$_4$) and silicon oxynitride of the silicon oxynitride films (SiON films) 82, thereby forming the titanium oxide adhesive layer 81a on the silicon oxynitride films (SiON films) 82.

The top surfaces of the polysilicon plugs 12 are also exposed to the titanium tetrachloride (TiCl$_4$) atmosphere in the capacitor hole 96 since the silicon oxide films 86 have been removed by the wet etching process. Thus, the chemical vapor deposition process also causes a silicidation reaction between titanium of titanium tetrachloride (TiCl$_4$) and polysilicon of the polysilicon plugs 12, thereby forming titanium silicide films 50 on the top surfaces of the polysilicon plugs 12. Namely, the side and bottom walls of the capacitor hole 96 are covered by the titanium oxide adhesive layers 81 and 81a and the titanium silicide films 50.

The silicon oxynitride films (SiON films) 82 is adjacent to the side edges of the third inter-layer insulator 32 of silicon nitride. The titanium oxide adhesive layer 81a is also adjacent to the silicon oxynitride films (SiON films) 82. The silicon oxynitride films (SiON films) 82 is interposed as an intermediate layer between the third inter-layer insulator 32 of silicon nitride (SiN) and the titanium oxide (TiO) adhesive layer 81a. Silicon oxynitride (SiON) has adhesiveness to both titanium oxide (TiO) and silicon nitride (SiN). Thus, the silicon oxynitride films (SiON films) 82 have adhesiveness to the silicon nitride (SiN) third inter-layer insulator 32 and also to the titanium oxide (TiO) adhesive layer 81a. In other words, the silicon oxynitride films (SiON films) 82 provide enhanced adhesiveness between the silicon nitride (SiN) inter-layer insulator 32 and the titanium oxide (TiO) adhesive layer 81a.

A chemical vapor deposition process is carried out to form a titanium nitride pedestal bottom electrode film 51 on the titanium oxide (TiO) adhesive layers 81 and 81a and the titanium silicide films 50. The titanium nitride pedestal bottom electrode film 51 fills the capacitor hole 96 and also extends over the fourth inter-layer insulator 23.

The titanium nitride bottom electrode film 51 is adhered via the titanium oxide (TiO) adhesive layer 81 to the silicon oxide fourth inter-layer insulator 23. Further, the titanium nitride bottom electrode film 51 is adhered via the titanium oxide (TiO) adhesive layer 81a and the silicon oxynitride films (SiON films) 82 to the silicon nitride (SiN) third inter-layer insulator 32. In other words, the titanium oxide (TiO) adhesive layer 81 provides adhesiveness between the titanium nitride bottom electrode film 51 and the silicon oxide fourth inter-layer insulator 23. The titanium oxide (TiO) adhesive layer 81a provides adhesiveness between the titanium nitride bottom electrode film 51 and the silicon oxynitride films (SiON films) 82. The silicon oxynitride films (SiON films) 82 also provide enhanced adhesiveness between the titanium oxide (TiO) adhesive layer 81a and the silicon nitride (SiN) third inter-layer insulator 32. Thus, the titanium oxide (TiO) adhesive layer 81a in combination with the silicon oxynitride films (SiON films) 82 provide enhanced adhesiveness between the titanium nitride bottom electrode film 51 and the silicon nitride (SiN) third inter-layer insulator 32. The silicon oxynitride films (SiON films) 82 may be regarded as an intermediate adhesive layer, or as an additional adhesive layer in addition to the titanium oxide (TiO) adhesive layer 81a.

Figure 27:
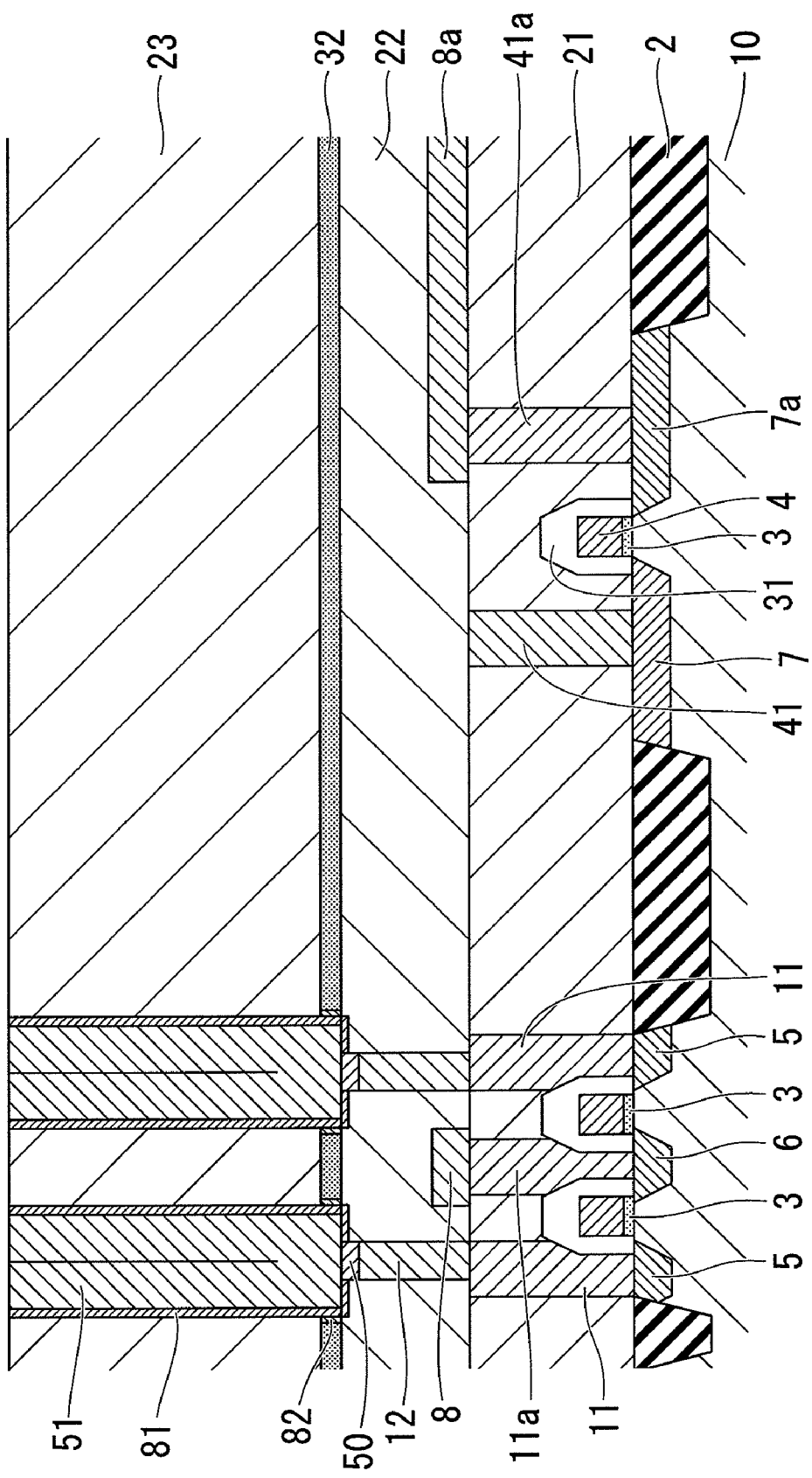
FIG. 27 is a fragmentary cross sectional elevation view illustrating a semiconductor memory device in a sequential step, after the step of FIG. 26, involved in a method of forming the semiconductor memory device of FIGS. 23 and 24 in accordance with the third embodiment of the present invention.

With reference to FIG. 27, the stack of the titanium nitride bottom electrode film 51 and the titanium oxide (TiO) adhesive layer 81 has a first portion which extends over the fourth inter-layer insulator 23 and a second portion which is present in the capacitor hole 96. A chemical mechanical polishing process is carried out to remove the first portion of the stack of the titanium nitride pedestal bottom electrode film 51 and the titanium oxide (TiO) adhesive layer 81. Namely, the chemical mechanical polishing process is carried out to leave the second portion of the stack of the titanium nitride pedestal bottom electrode film 51 and the titanium oxide (TiO) adhesive layers 81 and 81a in the capacitor hole 96. As a result of the chemical mechanical polishing process, the upper surface of the fourth inter-layer insulator 23 is shown, while the side and bottom walls of the capacitor hole 96 remain filled by the remaining portion of the stack of the titanium nitride bottom electrode film 51 and the titanium oxide (TiO) adhesive layers 81 and 81a.

Figure 28:
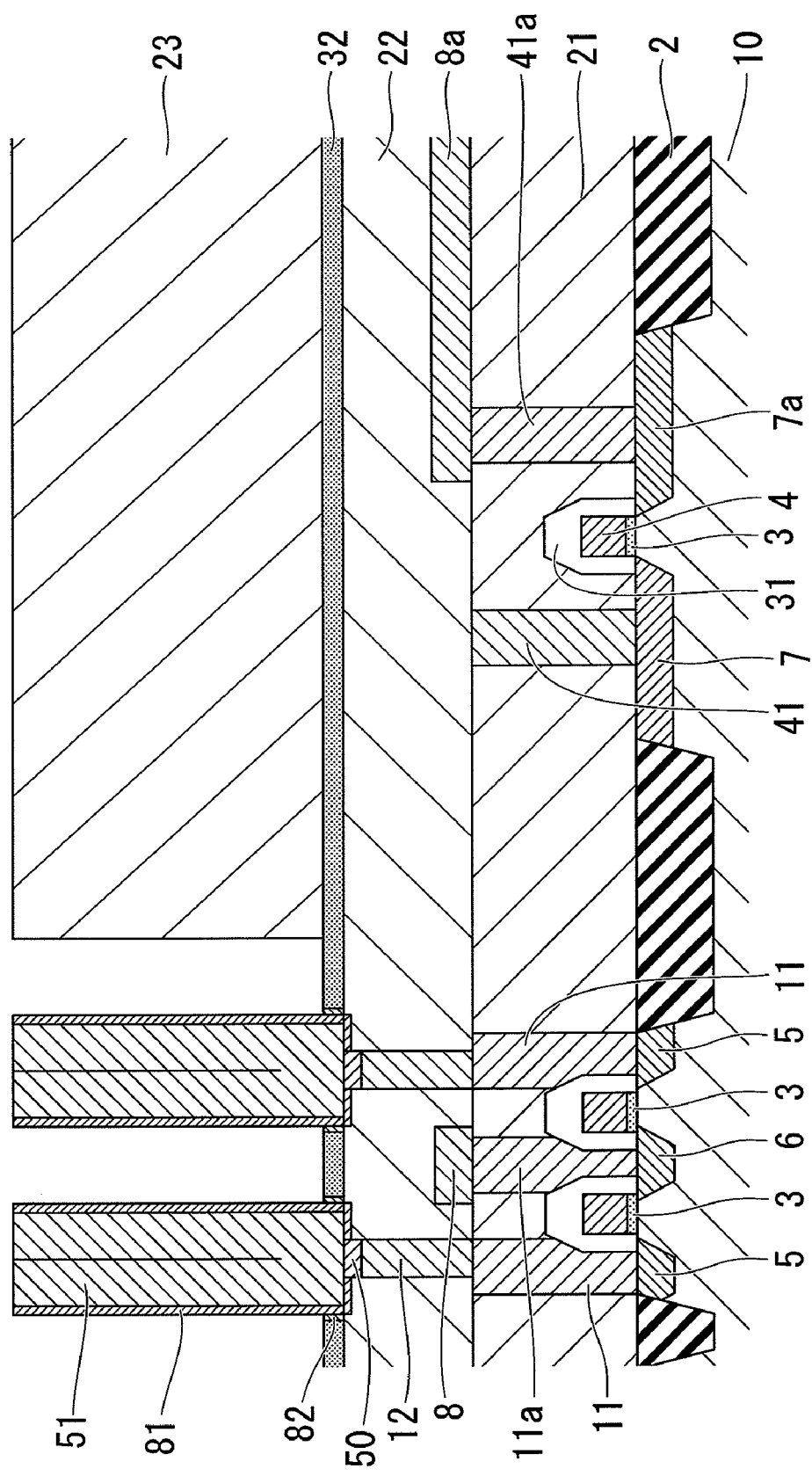
FIG. 28 is a fragmentary cross sectional elevation view illustrating a semiconductor memory device in a sequential step, after the step of FIG. 27, involved in a method of forming the semiconductor memory device of FIGS. 23 and 24 in accordance with the third embodiment of the present invention.

With reference to FIG. 28, the fourth inter-layer insulator 23 is selectively removed to form a capacitor hole which extends in the memory cell area 100. The titanium nitride pedestal bottom electrode film 51 and the titanium oxide (TiO) adhesive layers 81 and 81a remain in the memory cell area 100. The titanium nitride pedestal bottom electrode film 51 and the titanium oxide (TiO) adhesive layers 81 and 81a are spatially separated from the side wall of the capacitor hole which extends in the memory cell area 100. The fourth inter-layer insulator 23 can be selectively removed by a photo lithography technique and a dry etching technique. In the dry etching process, the silicon nitride (SiN) third inter-layer insulator 32 performs as an etching stopper.

Figure 29:
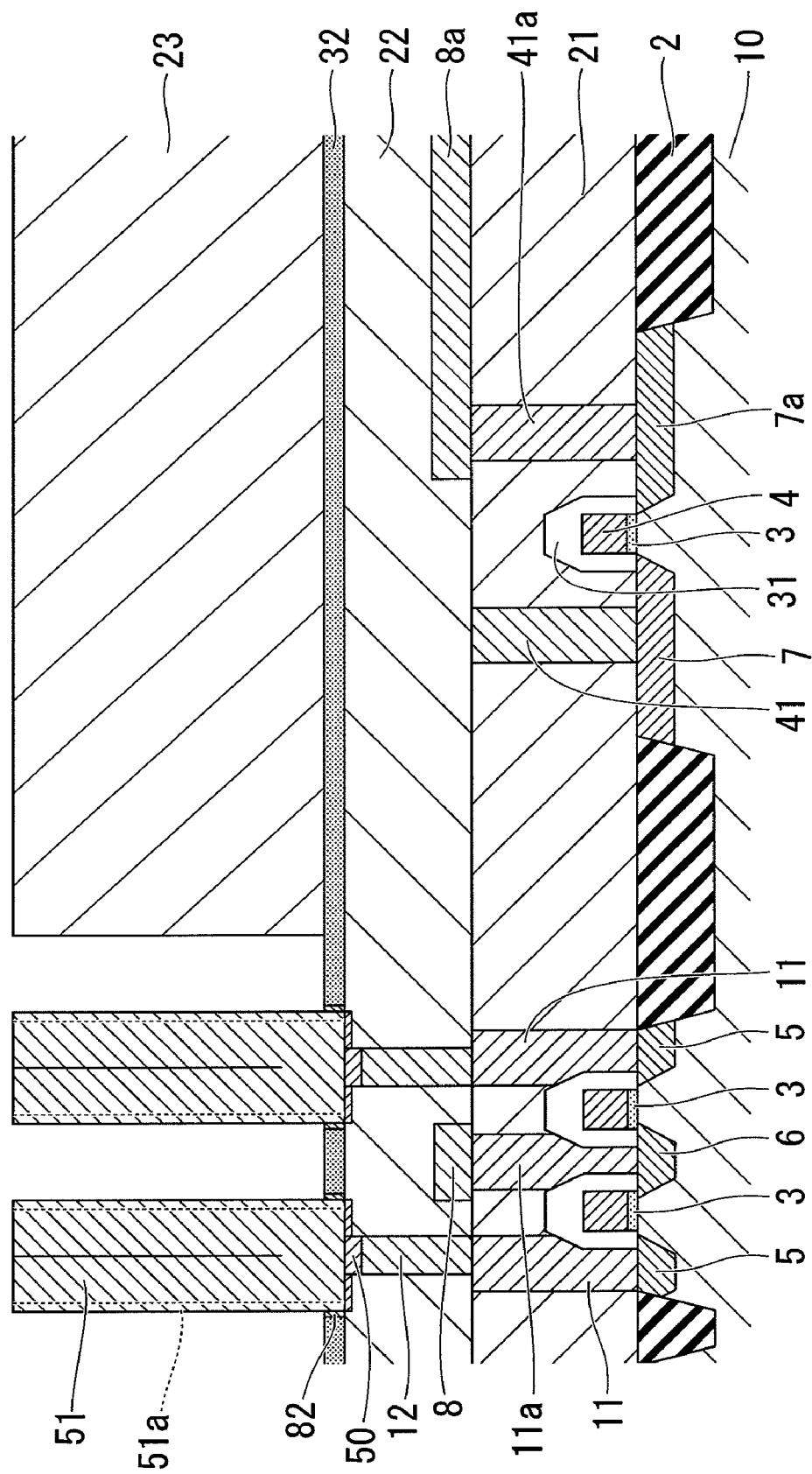
FIG. 29 is a fragmentary cross sectional elevation view illustrating a semiconductor memory device in a sequential step, after the step of FIG. 28, involved in a method of forming the semiconductor memory device of FIGS. 23 and 24 in accordance with the third embodiment of the present invention.

With reference to FIG. 29, a nitration process is carried out to nitrate the titanium oxide (TiO) adhesive layers 81 and 81a, thereby forming a titanium nitride film 51a. Namely, the titanium oxide (TiO) adhesive layers 81 and 81a are modified into the titanium nitride film 51a, so that the titanium nitride pedestal bottom electrode film 51 is covered by the titanium nitride film 51a. If the titanium oxide (TiO) adhesive layers 81 and 81a were present between the titanium nitride pedestal bottom electrode film 51 and the aluminum oxide capacitive insulating film 52, then the charge storing capacity of the capacitor is reduced, and the leakage of current is increased.

In the these points of view, the titanium oxide (TiO) adhesive layers 81 and 81a are modified into the titanium nitride film 51a, so that there is no titanium oxide film between the titanium nitride pedestal bottom electrode film 51 and the aluminum oxide capacitive insulating film 52. The nitration process can be carried out by a plasma process using an ammonium ($NH_3$) atmosphere or a nitrogen atmosphere ($N_2$).

An aluminum oxide capacitive insulating film 52 is formed on the titanium nitride film 51a which covers the titanium nitride pedestal bottom electrode 51 as well as on the bottom and side walls of the capacitor hole and over adjacent portions of the top surface of the fourth inter-layer insulator 23. Namely, the aluminum oxide capacitive insulating film 52 is formed on the titanium nitride film 51a, the silicon nitride third inter-layer insulator 32, the silicon oxynitride films 82, and the side wall and of the upper surface of the fourth inter-layer insulator 23. The aluminum oxide capacitive insulating film 52 can be formed by using an atomic layer deposition process. The thickness of the aluminum oxide capacitive insulating film 52 can typically be, but is not limited to, 6 nanometers. A titanium nitride top electrode 53 is formed on the aluminum oxide capacitive insulating film 52. The titanium nitride top electrode 53 can be formed by using a chemical vapor deposition process. The thickness of the titanium nitride top electrode 53 can typically be, but is not limited to, 15 nanometers. The stack of the aluminum oxide capacitive insulating film 52 and the titanium nitride top electrode 53 fills the cylinder-shaped gap and the cylinder-shaped center hollow.

The stack of the aluminum oxide capacitive insulating film 52 and the titanium nitride top electrode 53 is selectively removed so as to leave the stack in the capacitor hole 96 and over the adjacent portion of the upper surface of the fourth inter-layer insulator 23 of silicon oxide.

Over the memory cell area 100 and the peripheral circuit area 200, a silicon oxide fifth inter-layer insulator 24 is formed on the top electrode 53 of the capacitor 54 and on the fourth inter-layer insulator 24. In the same manners as described in the first embodiment, first, second, and third metal plugs 42, 43, and 44 are formed. The first and second contact plugs 42 and 43 contact with the metal plug 41 and the first-level interconnection 8a. The first contact plug 43 is electrically connected through the metal plug 41 to the diffusion layer 7 of the peripheral circuit transistor. The second contact plug 44 is electrically connected through the first-level interconnection 8a and the metal plug 41a to the diffusion layer 7a of the peripheral circuit transistor. The third contact plug 44 contacts with the top electrode 53 of the capacitor 54. Second-level interconnections 61 and 61a are also formed. The second-level interconnection 61 contacts with the second and third contact plugs 43 and 44. Namely, the second-level interconnection 61 electrically connects between the first and third contact plugs 43 and 44. The additional second-level interconnection 61a contacts with the first contact plug 42. As a result, the semiconductor memory device of FIG. 23 is completed.

In accordance with the third embodiment, the invention is applied to the capacitor with the pedestal bottom electrode. The above-described process can prevent the pedestal bottom electrode from falling down during the process for selectively removing the fourth inter-layer insulator 23 in the memory cell area 100.

It is also possible as a modification that the capacitor 54 may be a crown capacitor with a crown bottom electrode which has a cylinder shape, wherein the crown bottom electrode have inner and outer side walls, both of which are adjacent to the capacitive insulating film 52. The above-described process can prevent the crown bottom electrode from falling down during the process for selectively removing the fourth inter-layer insulator 23 in the memory cell area 100.

As described above, after the pedestal bottom electrode 51 is formed in the capacitor hole 96, the fourth inter-layer insulator 23 is selectively removed in the memory cell area 100. The fourth inter-layer insulator 23 can be selectively removed by the photo-lithography technique and the dry etching process. It is also possible as a modification to use a wet etching process, instead of the dry etching process, for selectively removing the fourth inter-layer insulator 23 in the memory cell area 100. The wet etching process can be carried out using the third inter-layer insulator 32 as an etching stopper. As described above, silicon oxynitride films 82 are interposed between the pedestal bottom electrode film 51 and the silicon nitride third inter-layer insulator 32. The silicon oxynitride films 82 provide enhanced adhesiveness between the pedestal bottom electrode film 51 and the silicon nitride third inter-layer insulator 32. The silicon oxynitride films 82 can prevent the pedestal bottom electrode film 51 from falling down during the wet etching process using an etchant. Namely, the silicon oxynitride films 82 can prevent the etchant from penetrating between the titanium nitride pedestal bottom electrode 51 and the third inter-layer insulator 32.

As described above, the titanium oxide (TiO) adhesive layers 81a in combination with silicon oxynitride films 82 are interposed between the pedestal bottom electrode film 51 and the silicon nitride third inter-layer insulator 32. The titanium oxide (TiO) adhesive layers 81a in combination with the silicon oxynitride films 82 provide enhanced adhesiveness between the pedestal bottom electrode film 51 and the silicon nitride third inter-layer insulator 32.

In accordance with the third embodiment, the third inter-layer insulator 32 is made of silicon nitride. It is also possible as a modification that the third inter-layer insulator 32 is made of silicon oxynitride as described in the second embodiment. In this modified case, the titanium oxide (TiO) adhesive layers 81a are interposed between the pedestal bottom electrode film 51 and the silicon oxynitride third inter-layer insulator 32. The titanium oxide (TiO) adhesive layers 81a provide enhanced adhesiveness between the pedestal bottom electrode film 51 and the silicon oxynitride third inter-layer insulator 32.

Typical examples of the semiconductor memory device described above may include, but are not limited to, DRAM and hybrid LSI with DRAM.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A method of forming a semiconductor device with a capacitor, the method comprising:
forming a first hole in a first insulating layer that includes a first insulating film, the first insulating film having a first portion that is exposed to the first hole;
modifying the first portion to form an intermediate layer that adjacent to the first insulating film, the intermediate layer being exposed to the first hole, the intermediate layer having adhesiveness to the first insulating film;

forming an adhesive layer that contacts with the intermediate layer and with bottom and side walls of the first hole, the adhesive layer having adhesiveness to the intermediate layer;

forming a bottom electrode that contacts with the adhesive layer, the adhesive layer having adhesiveness to the bottom electrode;

forming a capacitive insulating film that contacts with the bottom electrode; and forming a top electrode that contacts with the contacts with the capacitive insulating film.

2. The method according to claim 1, wherein
the bottom electrode comprises nitride containing a first metal,
the adhesive layer comprises one of the first metal and oxide containing the first metal,
the intermediate layer comprises oxynitride containing a first semiconductor, and
the first insulating film comprises nitride containing the first semiconductor.

3. The method according to claim 2, wherein the first semiconductor is silicon, the first insulating film comprises silicon nitride, and
modifying the first portion comprises modifying silicon nitride of the first portion into silicon oxynitride.

4. The method according to claim 3, wherein forming the first hole comprises forming the first hole that penetrate a stack of a silicon oxide film and the first insulating film of silicon nitride, the silicon oxide film extends over the first insulating film.

5. The method according to claim 4, wherein forming the first hole comprises:
carrying out a first etching process for selectively etching the silicon oxide film under a first condition that a first etching rate of the first insulating film of silicon nitride is higher than a second etching rate of the silicon oxide film; and
carrying out a second etching process for selectively etching the first insulating film of silicon nitride under a second condition that a third etching rate of the silicon oxide film is higher than a fourth etching rate of the first insulating film of silicon nitride.

6. The method according to claim 3, further comprising:
forming at least one polysilicon plug in a second insulating layer that underlies the first insulating layer, and
wherein forming the first hole comprises forming the first hole so that a second portion of the at least one polysilicon plug is exposed to the first hole, and
modifying the first portion comprises modifying the first and second portion to respectively form the intermediate layer and a silicon oxide portion of the at least one polysilicon plug, the silicon oxide portion being adjacent to the first hole and also adjacent to the at least one polysilicon plug, and
the method further comprises:
removing the silicon oxide portion before forming an adhesive layer.

7. The method according to claim 6, wherein forming the adhesive layer comprises carrying out a chemical vapor deposition using a titanium tetrachloride gas to form the adhesive layer and a titanium silicide layer on the at least one polysilicon plug.

8. The method according to claim 7, further comprising:
removing a peripheral portion of the first insulating layer after forming the bottom electrode, thereby forming a gap between the first insulating layer and the adhesive layer that covers a surface of the bottom electrode, the peripheral portion surrounding the adhesive layer and the bottom electrode, the peripheral portion being adjacent to the adhesive layer and the bottom electrode; and
carrying out a nitration process for nitrating the adhesive layer to form a titanium nitride film that covers the surface of the bottom electrode.

9. The method according to claim 8, wherein removing the peripheral portion is carried out using the first insulating film of silicon nitride as an etching stopper.

10. A method of forming a semiconductor device with a capacitor, the method comprising:
forming a first hole in a first insulating layer that includes a first insulating film, the first insulating film having a first portion that is exposed to the first hole;
forming an adhesive layer that contacts with the portion and with bottom and side walls of the first hole, the adhesive layer having adhesiveness to the first portion;
forming a bottom electrode that contacts with the adhesive layer, the adhesive layer having adhesiveness to the bottom electrode;
forming a capacitive insulating film that contacts with the bottom electrode; and
forming a top electrode that contacts with the contacts with the capacitive insulating film; wherein:
the bottom electrode comprises nitride containing a first metal,
the adhesive layer comprises one of the first metal and oxide containing the first metal, and
the first insulating film comprises oxynitride containing a first semiconductor; further comprising:
forming at least one polysilicon plug in a second insulating layer that underlies the first insulating layer, and
wherein forming the first hole comprises forming the first hole so that a second portion of the at least one polysilicon plug is exposed to the first hole, and
forming the adhesive layer comprises carrying out a chemical vapor deposition using a titanium tetrachloride gas to form the adhesive layer and a titanium silicide layer on the at least one polysilicon plug.

11. The method according to claim 10, further comprising:
removing a peripheral portion of the first insulating layer after forming the bottom electrode, thereby forming a gap between the first insulating layer and the adhesive layer that covers a surface of the bottom electrode, the peripheral portion surrounding and being adjacent to the adhesive layer and the bottom electrode; and
carrying out a nitration process for nitrating the adhesive layer to form a titanium nitride film that covers the surface of the bottom electrode.

12. The method according to claim 11, wherein removing the peripheral portion is carried out using the first insulating film of silicon nitride as an etching stopper.

* * * * *

UNITED STATES PATENT AND TRADEMARK OFFICE
CERTIFICATE OF CORRECTION

| | | |
|---|---|---|
| PATENT NO. | : 7,919,385 B2 | |
| APPLICATION NO. | : 12/400410 | |
| DATED | : April 5, 2011 | |
| INVENTOR(S) | : Yoshitaka Nakamura | |

It is certified that error appears in the above-identified patent and that said Letters Patent is hereby corrected as shown below:

In the Specification

Column 4, Line 51: delete "FIG. 1," and insert -- FIG. 11, --.

In the Claims

Column 38, Line 22: In Claim 10, after "with the" insert -- first --.

Signed and Sealed this
Thirtieth Day of July, 2013

Teresa Stanek Rea
*Acting Director of the United States Patent and Trademark Office*